(12) United States Patent
Nishimura et al.

(10) Patent No.: US 8,076,769 B2
(45) Date of Patent: Dec. 13, 2011

(54) SEMICONDUCTOR DEVICE AND MANUFACTURING METHOD OF SEMICONDUCTOR DEVICE

(75) Inventors: Takao Nishimura, Kawasaki (JP); Yoshikazu Kumagaya, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 448 days.

(21) Appl. No.: 12/275,848

(22) Filed: Nov. 21, 2008

(65) Prior Publication Data
US 2009/0243092 A1 Oct. 1, 2009

(30) Foreign Application Priority Data

Mar. 26, 2008 (JP) .................................. 2008-080733

(51) Int. Cl.
*H01L 23/48* (2006.01)
(52) U.S. Cl. ................................ 257/688; 257/E23.078
(58) Field of Classification Search .................. 257/737, 257/779–786, E23.078, 688, 689
See application file for complete search history.

(56) References Cited

U.S. PATENT DOCUMENTS

| 5,983,493 A | * | 11/1999 | Eldridge et al. | ................. | 29/855 |
| 6,669,489 B1 | * | 12/2003 | Dozier et al. | .................. | 439/71 |
| 7,458,816 B1 | * | 12/2008 | Mathieu et al. | ................. | 439/66 |

FOREIGN PATENT DOCUMENTS

| JP | 11-31208 A | 2/1999 |
| JP | 11-204566 A | 7/1999 |
| JP | 2000-11129 A | 1/2000 |
| JP | 2004-62572 A | 2/2004 |

* cited by examiner

*Primary Examiner* — Hoa B Trinh
(74) *Attorney, Agent, or Firm* — Westerman, Hattori, Daniels & Adrian, LLP

(57) ABSTRACT

A semiconductor device includes a semiconductor element; a plate member disposed opposite to an electronic-circuit forming portion of the semiconductor element; and an elastic body arranged in a compressed state between the semiconductor element and the plate member, wherein the elastic body includes at least one first protruding portion at one end in an extension direction of the elastic body, the first protruding portion being formed opposite to the electronic-circuit forming portion of the semiconductor element, and the semiconductor element and the plate member are fastened by an adhesive agent.

15 Claims, 70 Drawing Sheets

25

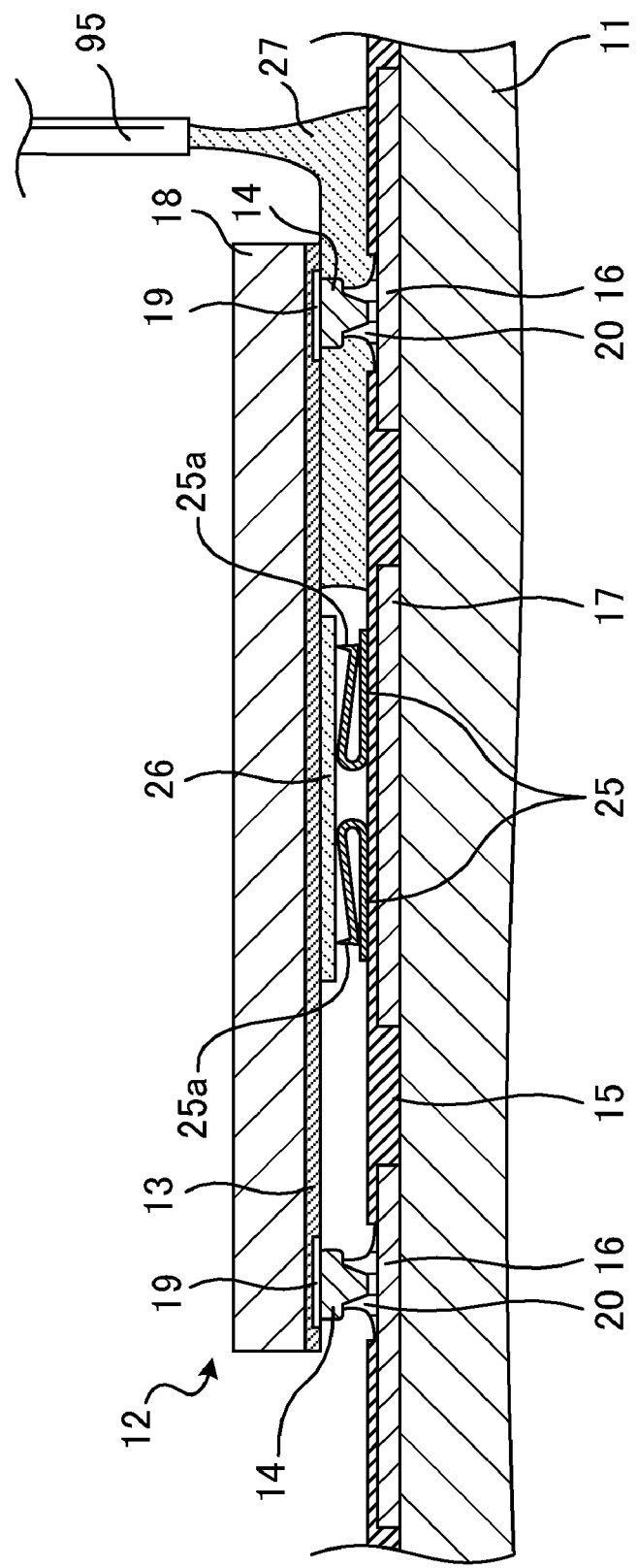

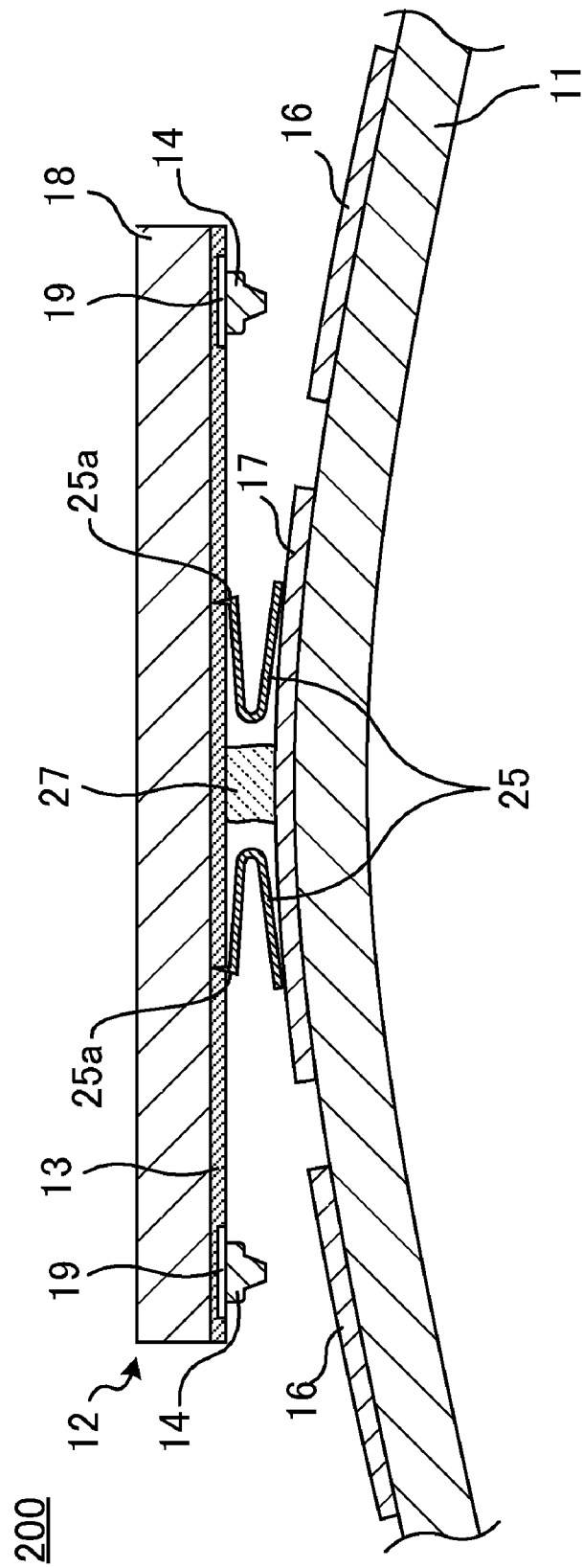

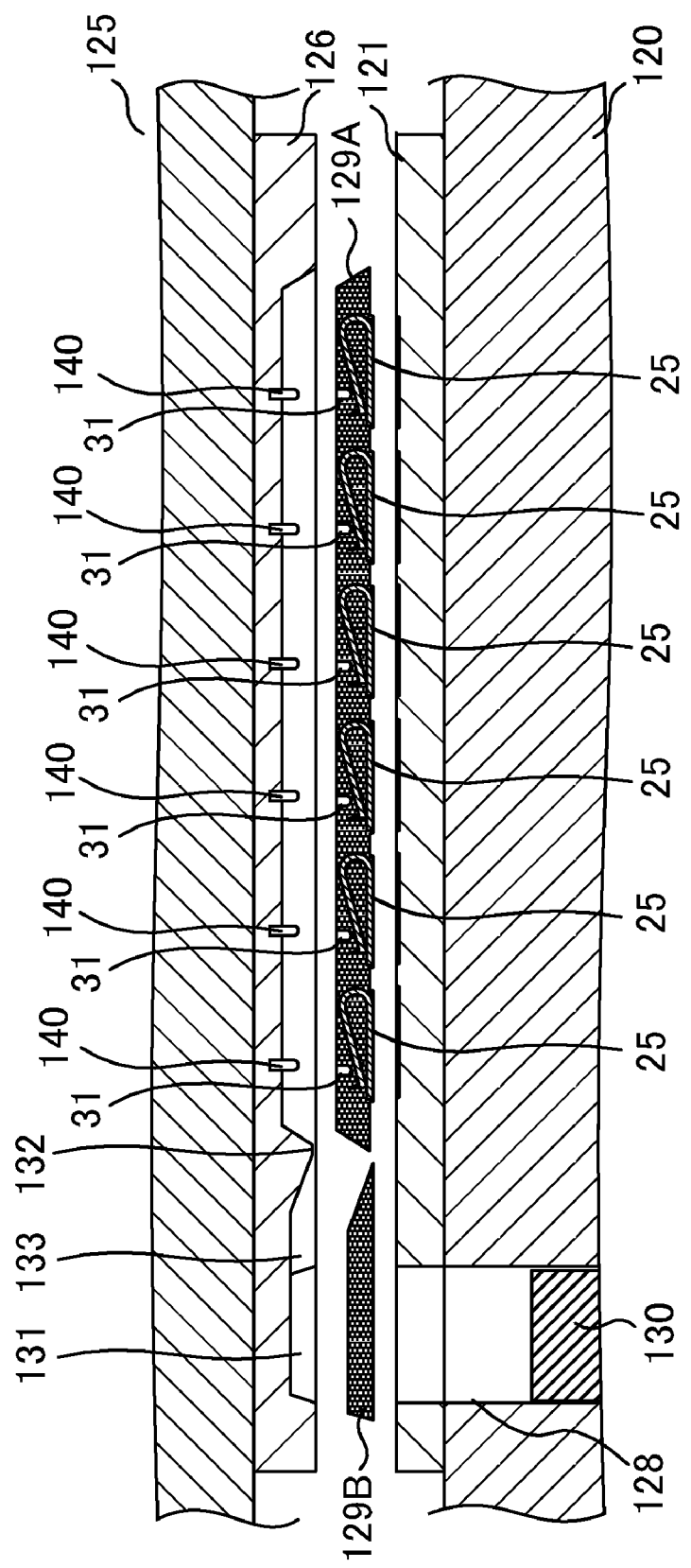

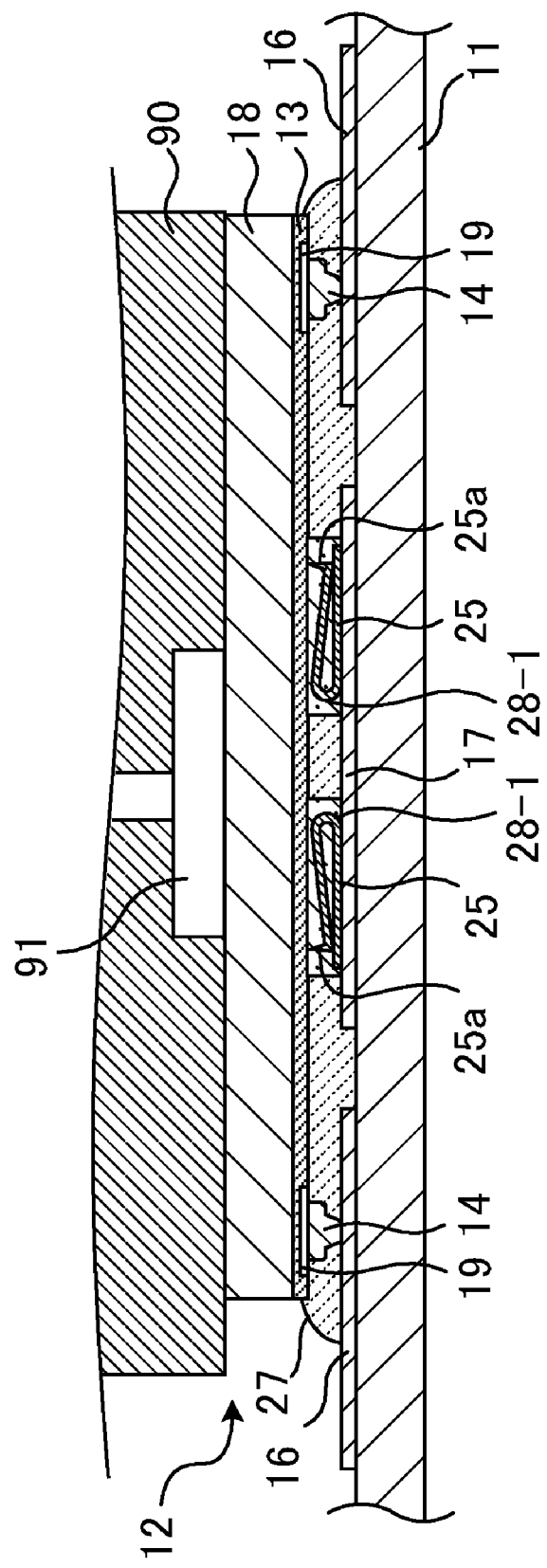

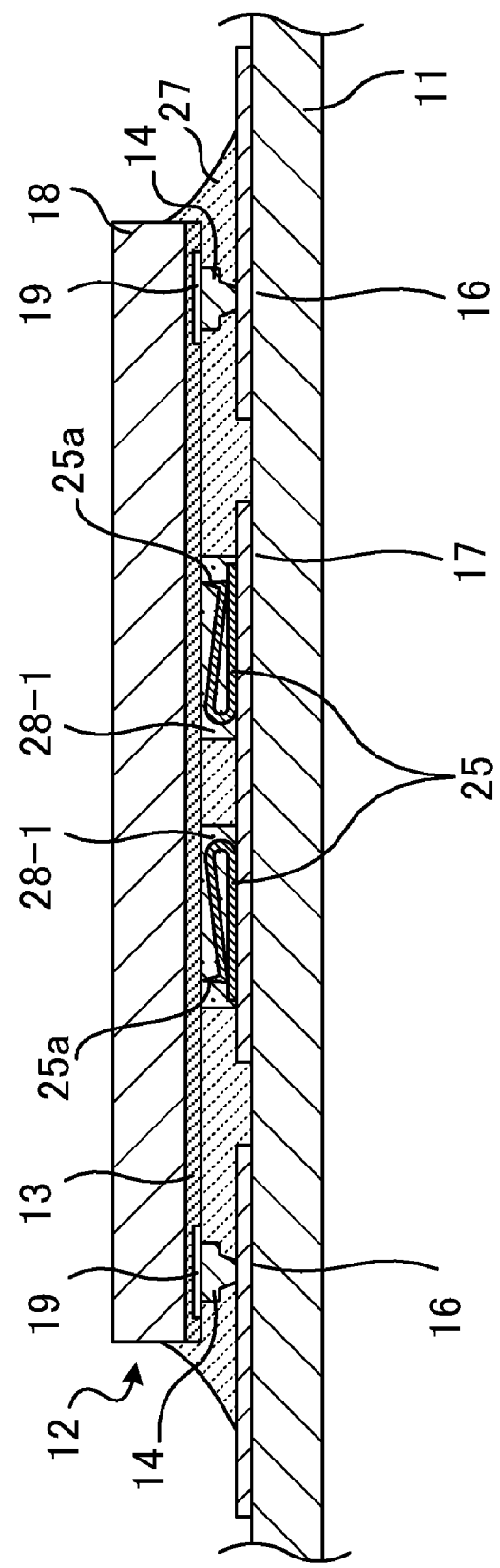

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority of Japanese Patent Application No. 2008-80733, filed on Mar. 26, 2008, the entire contents of which are incorporated herein by reference.

FIELD

The embodiment described herein is directed to a semiconductor device which has a function of preventing unauthorized decryption etc. of the information contained therein, and a manufacturing method of the semiconductor device.

BACKGROUND

As the development of sophisticated information society progresses, there are growing needs for the protection of copy right of music and/or visual information etc. handled by digital equipment, or the protection of digital cash and private information handled by IC cards and the like.

For this reason, it is required for semiconductor devices which process or store such confidential information to take protective measures to improve tamper resistance in order to prevent a third party from analyzing the interior of the concerned semiconductor device by using fraudulent means.

Tamper resistance refers to a characteristic feature of software or hardware meaning the level of difficulty of the analysis (reverse engineering), unauthorized revision, or tampering of the internal structure such as a circuit etc., or stored data or programs etc.

Japanese Patent Laid-Open No. 2000-11129 discloses for example, a structure in which the thickness of an IC chip, which is flip-chip mounted onto a card-like substrate, is configured to be 0.1 μm to 20 μm. According to such structure, if it is attempted to take out the concerned IC chip from the card substrate, the semiconductor substrate will be destroyed and thereby disabled.

However, since it is difficult to handle an IC chip which is processed to be extra-thin, special manufacturing facilities are needed for the manufacture of such a semiconductor devices. Further, since the production yields or productivity will decline, there is a risk of significant increase in the production cost. Further, there is possibility that the IC chip is easily taken out from an IC card by means of chemical solution exposure or heating etc.

Japanese Patent Laid-Open No. 2004-62572 discloses a structure in which a leaf spring is stuck to the back surface of a semiconductor chip which is flip-chip mounted onto a substrate, with a reinforcing plate being stuck to the concerned leaf spring, and thereafter all the parts are sealed with sealing resin. According to such structure, if it is attempted to take out a semiconductor chip from the module, the elastic force of the leaf spring will act on the semiconductor chip thereby destroying the concerned semiconductor chip.

However, in such a structure, it is difficult to reduce the thickness of the semiconductor device. Especially, when a leaf spring which has an enough elastic force to destroy the semiconductor chip is fixed to a reinforcing plate made of resin, the concerned reinforcing plate needs to have a sufficiently large thickness, thereby making it difficult to reduce the thickness of the semiconductor device. Further, when a chemical solution is used to dissolve and remove the sealing resin and the reinforcing plate, a portion which supports one end of the leaf spring will be removed and, therefore, the spring force of the leaf spring cannot be sufficiently transferred to the semiconductor chip even if the leaf spring recovers its elasticity, making it difficult to destroy the concerned semiconductor chip.

Japanese Patent Laid-Open No. H11-31208 discloses, for example, a structure in which a concave part is formed on the back surface of a semiconductor substrate. According to such structure, when stress is applied in an attempt to fraudulently detach the semiconductor substrate, the concerned semiconductor substrate will be readily destroyed. Further, according to such a structure, it is also possible to prevent the observation by an optical methodology using laser measurement etc.

However, in such structure, since a concave part is formed in the back surface of the semiconductor substrate, the reliability of the semiconductor device will be degraded.

Japanese Patent Laid-Open No. H11-204566 discloses a structure in which an integrated circuit chip, on the back surface of which a protection film for blocking observation, or bumps and dips for producing irregular reflection are formed, is mounted in a curved state on a wiring board. According to such structure, if the protection film for blocking observation or the bumps and dips for producing irregular reflection are machined to be removed by a mechanical method such as grinding or polishing, a part of the curved integrated chip will also be removed. Further, according to such structure, even if it is attempted to observe the circuit pattern on the surface of the substrate from the back surface of the semiconductor chip by using infrared ray etc., the observation will be hindered by the unremoved protection film or bumps and dips for producing irregular reflection.

However, in such structure, since an integrated circuit chip is mounted in a curved state on a wiring board, it is difficult to reduce the thickness of the semiconductor device. Further, since internal residual stress becomes larger, the reliability of the semiconductor device will decline. Furthermore, since special manufacturing facilities are needed when manufacturing the concerned semiconductor device, the manufacturing cost will increase.

SUMMARY

According to an aspect of an embodiment, a semiconductor device includes: a semiconductor element; a plate member disposed opposite to an electronic-circuit forming portion of the semiconductor element; and an elastic body arranged in a compressed state between the semiconductor element and the plate member, wherein said elastic body includes at least one first protruding portion at one end in an extension direction of the elastic body, the first protruding portion being formed opposite to said electronic-circuit forming portion of the semiconductor element, and the semiconductor element and the plate member are fastened by an adhesive agent.

BRIEF DESCRIPTION OF DRAWINGS

FIGS. 12A and 12B illustrate the manufacturing method of the semiconductor device shown in FIG. 1;

FIGS. 15A and 15B are partial sectional views to show the destruction of a circuit forming surface of the semiconductor element by the spring member in the semiconductor device shown in FIG. 13;

FIGS. 25A and 25B illustrate the second manufacturing method of a spring-fixing resin part for resin-sealing spring members;

FIGS. 27A and 27B illustrate the manufacturing method of the semiconductor device shown in FIG. 13;

DESCRIPTION OF EMBODIMENTS

First Embodiment

Figure 1:
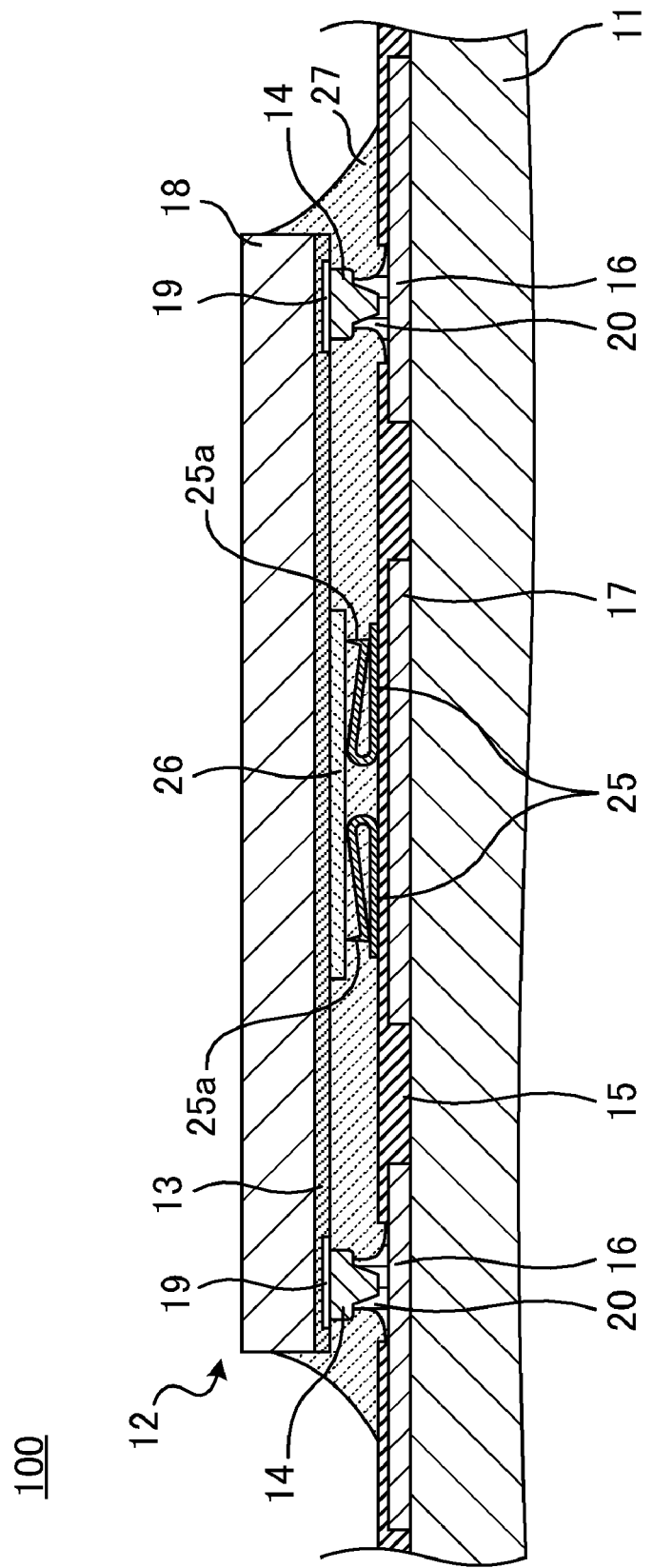
FIG. 1 is a partial sectional view of a semiconductor device relating to a first embodiment.

A semiconductor device 100 relating to a first embodiment is shown in FIG. 1.

In the semiconductor device 100, a semiconductor integrated circuit element (hereinafter referred to as a semiconductor element) 12 is mounted and fastened onto one principal surface (top surface) of a wiring board 11 by a so-called flip-chip (face down) process.

The wiring board 11 is a plate member which is also referred as an interposer or a supporting substrate, and an electronic-circuit forming portion 13 of the semiconductor element 12 is disposed opposite to the wiring board 11.

As the wiring board 11, substrates based on inorganic materials such as for example silicon (Si) or ceramics, or substrates based on organic materials such as a polyimide substrate or an organic substrate including glass cloth, etc. can be used.

A wiring layer made of for example copper (Cu) is selectively arranged on the surface/in the interior of the wiring board 11, and a conductive layer connected to the wiring board is selectively arranged on a surface which is one principal surface of the wiring board 11, and on which the semiconductor element 12 is mounted.

Further, a solder resist layer (insulating resin film) 15 is selectively coated in such a way to selectively cover the conductive layer, that is, excluding the area to which an external connection terminal 14 of the semiconductor element 12 is connected, and the periphery thereof. The solder resist layer 15 is made of a resin of epoxy-based, acryl-based, or polyimide-based etc., or a mixed resin thereof etc. A part of the conductive layer is exposed as a bonding terminal 16 in an opening part provided in the solder resist layer 15.

The bonding terminal 16 is made of for example aluminum (Al) or an alloy thereof etc. Further, the surface of the bonding terminal 16 may be applied with a 2-layer plating of e.g. nickel/gold (Ni/Au) or a 3-layer plating of copper/nickel/gold (Cu/Ni/Au) from the bottom layer, or a solder coating. The solder coating is formed by a solder deposition method, a solder powder adhesion method, a printing method, or an electrolytic plating method etc.

Further, a backup pattern 17 made of the same material as that of the bonding terminal 16 is selectively arranged on the surface of the wiring board 11, and the solder resist layer 15 is also formed on the backup pattern 17. The backup pattern 17 is arranged corresponding to (opposite to) an electronic-circuit forming portion 13 of the semiconductor element 12.

When a substrate based on an organic material is used as the wiring board 11, the organic material is selected so as to have a lower dissolution rate into chemical solution than those of the under-fill material 27 and spacer resin 26 described below. On the other hand, when a substrate based on silicon (Si) is used as the wiring board 11, the configuration of the bonding terminal 16 of the wiring board 11 may be the same as that of the external connection electrode pad 19 of the semiconductor element 12.

It is noted that a conductive layer is also selectively provided on the other principal surface (back surface) of the wiring board 11, and a plurality of external connection terminals (not shown) such as a spherical electrode terminal etc. predominantly made of solder are arranged in the conductive layer.

On the other hand, the semiconductor element 12 is subjected to a known semiconductor manufacturing process so that an electronic-circuit forming portion 13 made up of a multi-layer wiring structure is formed on one principal surface of the semiconductor substrate 18 made of a semiconductor material such as silicon (Si) etc. In the electronic-circuit forming portion 13, an electronic circuit is formed of active elements such as transistors etc., passive elements such as capacitive elements or resistive elements, and wiring layers made of copper (Cu), aluminum (Al), etc. for interconnecting the functional elements.

Further, in the peripheral portion of the electronic-circuit forming portion 13 and in the upper most layer of the multi-layer wiring, a plurality of external connection electrode pads 19 connected to the wiring are formed. The external connection electrode pad 19 is made of an alloy such as for example aluminum (Al), copper (Cu), and alloys including those. It is noted that a 2-layer plating coat of for example nickel/gold (Ni/Au) from the bottom layer may be formed on the surface of the external connection electrode pad 19.

A convex external connection terminal (bump) 14 is arranged on the external connection terminal pad 19. The convex external connection terminal 14 is formed of e.g. gold (Au), copper (Cu), or an alloy of these metals. That is, the convex external connection terminal 14 is formed in such a way that a ball made of gold (Au) or copper (Cu) is fastened onto the external connection terminal pad 19 by a so-called ball bonding method thereby forming a seating portion, and further a convex part is integrally formed on the seating portion protruding therefrom. It is noted that the top part of the convex external connection terminal 14 is subjected to a flattening process as needed.

Further, the convex external connection terminal 14 may be formed by an electrolytic plating process etc. In this case, an under bump metal (UBM) layer such as titanium/tungsten (Ti/W), titanium/palladium (Ti/Pd), titanium/nickel/palladium (Ti/Ni/Pd) etc. may be arranged on the external connection electrode pad 19.

Then, a convex external connection terminal 14 made of nickel (Ni) is arranged on the under bump metal layer. In this case, a gold (Au) plating may be applied on the surface of the external connection terminal pad 19.

At least the convex part of the convex external connection terminal 14 of the semiconductor element 12 and the bonding terminal 16 on the wiring board 11 corresponding thereto are commonly coated with a remeltable conductive member 20 thereby being mechanically and electrically connected. As the remeltable conductive member 20, remeltable conductive materials such as solder or conductive resin including silver (Ag) particles etc. are used.

Via the convex external connection terminal 14 having such a structure, the external connection electrode pad 19 of the semiconductor element 12 and the bonding terminal 16 of the wiring board 11 are mechanically and electrically connected.

It is noted that although the convex external connection terminal 14 is arranged on the external connection terminal pad 19 of the semiconductor element 12, the convex external connection terminal 14 may be formed on the bonding terminal 16 of the wiring board, or formed on both the external connection terminal pad 19 of the semiconductor element 12 and the bonding terminal 16 of the wiring board 11.

Further, in the semiconductor device 100, a spring member 25 is mounted onto the solder resist layer 15 which is coated on the backup pattern 17 selectively formed on the surface of the wiring board 11.

In the structure shown in FIG. 1, although two of the spring members 25 are arranged corresponding to an approximately middle part of the semiconductor elements 12, the number and the arrangement position are not limited.

Figure 2:
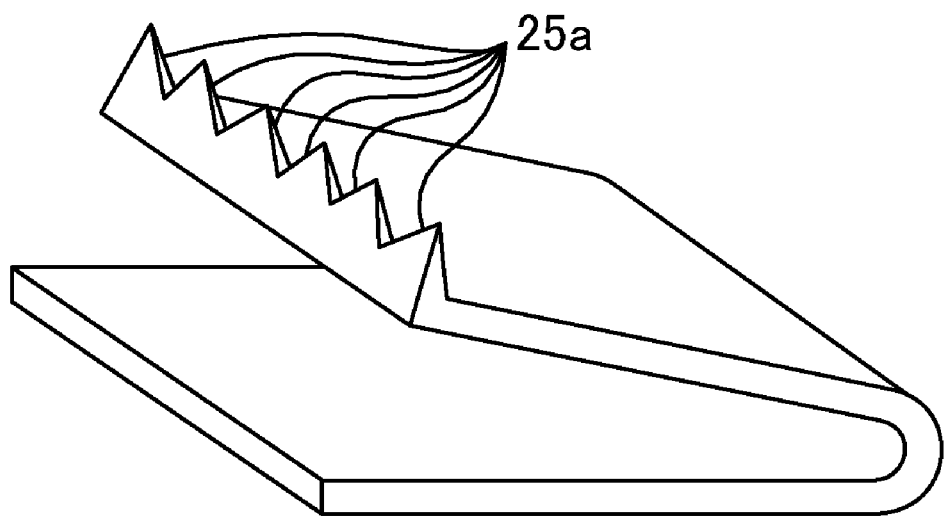
FIG. 2 is a perspective view of the spring member shown in FIG. 1, which has been released from a compressed state.

The spring member 25 is a compression spring which has a section of approximately "V" shape (a V shape of which bent point is of a circular arc shape) as shown in FIG. 2 and is a leaf spring at one opening end of which a plurality of protruding portions 25a having an acute angle shape are formed in a saw-tooth shape. Such spring member 25 is mounted and disposed in a compressed state (a state in which the V-shape opening is closed) such that the protruding portion 25a is opposed to the surface of the electronic-circuit forming portion 13 of the semiconductor element 12.

The material of the spring member 25 is appropriately selected depending on the shape and the manufacturing method of the spring and is formed of, for example, metal such as copper (Cu), nickel (Ni), titanium (Ti), tungsten (W), iron (Fe), molybdenum (Mo), and aluminum (Al) etc., or an alloy containing any of those metals.

That is, the spring member 25 is formed by a mechanical or chemical processing etc. using for example a metal plate of a thickness of not less than 20 μm, or a wire of a diameter of about 10 μm. It is noted that when the spring member 25 is formed by a mechanical processing, phosphor bronze may be selected as the material thereof from the viewpoint of spring characteristics and machinability. Further, the spring member 25 may be formed by an electroforming method. Using an electroforming method enables the formation of a more minute and more precise spring member.

Further, the protruding portions 25a are integrally formed when the spring member 25 is produced. For example, when the spring member 25 is formed by mechanical processing, it is possible to form the protruding portion 25a by intentionally producing a bur when cutting the end of the spring.

As described above, the spring member 25 is mounted in a compressed state such that the protruding portion 25a is opposed to the surface of the electronic-circuit forming portion 13 of the semiconductor element 12. The length by which the spring member 25 extends in a compressed state to an elastically released state is set to be larger than the gap distance between the semiconductor element 12 and the wiring board 11.

Further, the pressure applied to the electronic-circuit forming portion 13 of the semiconductor element 12 by the protruding portion 25a of the spring member 25 when it is freed into an elastically released state from a compressed state, is set to be not less than a pressure large enough to be able to destroy at least part of the electronic-circuit forming portion 13, such as for example about 20 GPa.

Between the spring member 25 having the above structure and the semiconductor element 12, a spacer resin 26 is arranged. The thickness of the spacer resin 26 is determined pursuant to the configuration of the spring member 25 and is set to be smaller than the spring stroke of the spring member 25, that is, the difference in the length of the spring member 25 in its extension direction between a compressed state and an elastically recovered state. The thickness of the spacer resin 26 is set to be for example 1 µm to 300 µm. As shown in FIG. 1, when the spring member 25 is in a compressed state, the protruding portion 25a of the spring member 25 is almost in contact with the surface of the spacer resin 26.

Further, as described above, an under-fill material 27 such as a thermosetting resin adhesive agent etc. is charged between the semiconductor element 12, which is mounted onto one principal surface of the wiring board 11 by a flip-chip (face down) process, and the one principal surface of the wiring board 11, reinforcing the connection of both.

The spacer resin 26 and the under-fill material 27 may be made of an epoxy-based or acryl-based resin material which are dissolved for example by a chemical solution such as fuming nitric acid, sulfuric acid, or mixed acid obtained by mixing for example fuming nitric acid and sulfuric acid in about a proportion of 10 to 1. Although the spacer resin 26 and the under-fill material 27 may be made of the same material, the spacer resin 26 is configured to be made of a resin material of which a dissolution rate in a chemical solution is equal to or greater than that of the under-fill material 27.

Figure 3:
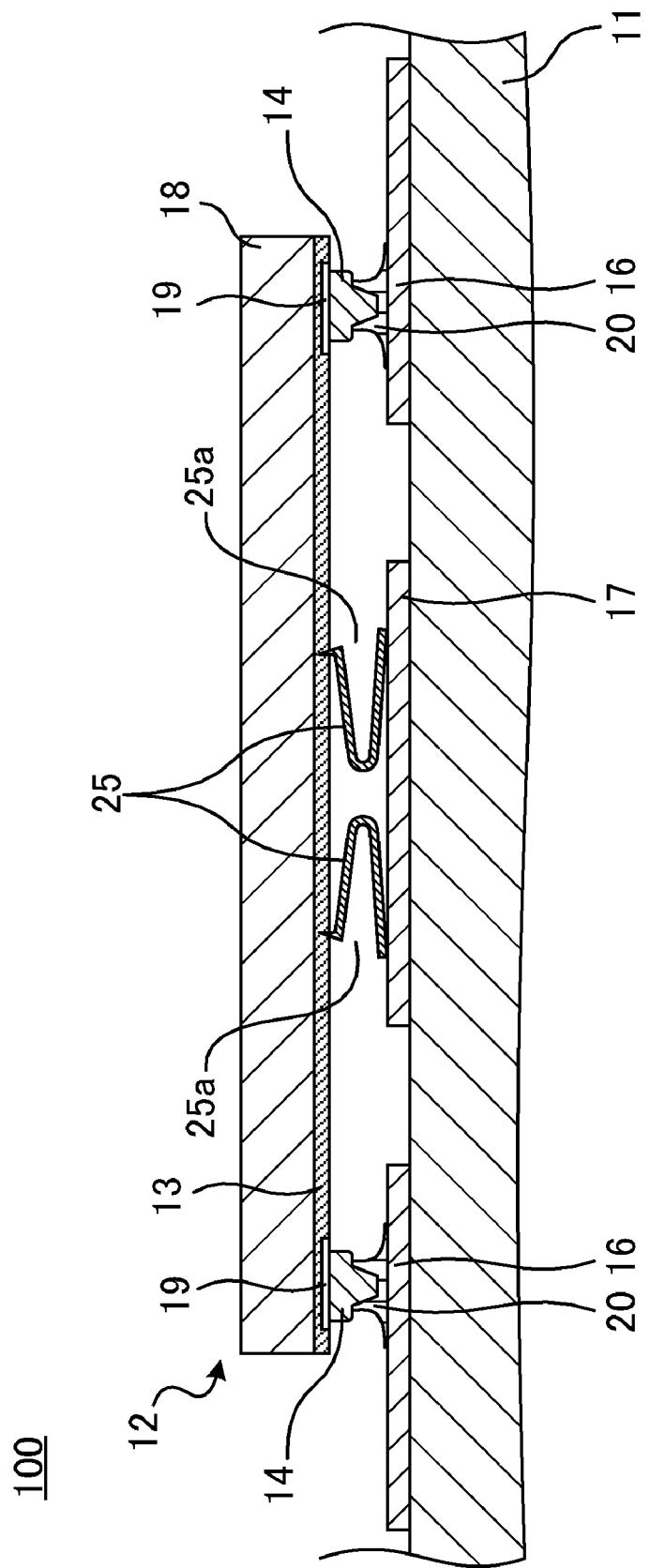
FIG. 3 is a partial sectional view to show the destruction of a circuit forming surface of the semiconductor element by the spring member in the semiconductor device shown in FIG. 1.

When the under-fill material 27 etc. is dissolved and removed by a chemical solution in an attempt to take out the semiconductor element 12 from the semiconductor device 100 having the above described structure, the spring member 25 which has been compressed is released to recover its elasticity, and the electronic-circuit forming portion 13 of the semiconductor element 12 is destroyed by the protruding portion 25a in the spring member 25. This will be described with reference to FIG. 3.

When taking out the semiconductor element 12 from the semiconductor device 100, a chemical solution such as fuming nitric acid, sulfuric acid, or mixed acid obtained by mixing for example fuming nitric acid and sulfuric acid in a proportion of about 10 to 1 is used. Then, the semiconductor device 100 is immersed into the heated chemical solution or the chemical solution is dropped to the outer peripheral part of the under-fill material 27 in the semiconductor device 100.

The under-fill material 27, the spacer resin 26, and the solder resist layer 15 are dissolved by such chemical solution. It is noted that when a substrate based on an organic material is used as the wiring board 11, as the material therefor, an organic material having a lower dissolution rate in chemical solution than those of the under-fill material 27 and the spacer resin 26 is selected. Therefore, even if the under-fill material 27 and the spacer resin 26 are dissolved, the wiring board 11 will not be dissolved.

Further, the distance (spacing) between the semiconductor element 12 and the wiring board 11 is set by the convex external connection terminal 14, the bonding terminal 16 and the conductive member 20.

Since the spacer resin 26 is set to be made of a resin of which dissolution rate into chemical solution is equal to or greater than that of the under-fill material 27, the spacer resin 26 will be dissolved and removed before the under-fill material 27 is fully dissolved and the spring member 25 which has been compressed will recover its elasticity to extend so that the protruding portion 25a of the spring member 25 will intrude into the electronic-circuit forming portion 13 of the semiconductor element 12. This will cause the electronic-circuit forming portion 13 of the semiconductor element 12 to be physically (mechanically) destroyed.

Thus, when a third party attempts to take out the semiconductor element 12 from the semiconductor device 100 by using a chemical solution to dissolve and remove the under-fill material 27, the spacer resin 26, and the solder resist layer 15 for the purpose of fraudulently analyzing the interior of the semiconductor element 12, the spring member 25 which has been compressed will recover its elasticity and extend causing the electronic-circuit forming portion 13 of the semiconductor element 12 to be physically destroyed by the protruding portion 25a in the spring member 25.

Therefore, it is possible to securely prevent the read out of the information within the electronic-circuit forming portion 13 of the semiconductor element 12 and the observation of the physical structure of the electronic-circuit forming portion 13, and also to disable the circuit of the electronic-circuit forming portion 13. In this way, the semiconductor device 100 has a high tamper resistance, that is, a high level of difficulty in performing fraudulent analysis.

As described above, for the wiring board 11, an organic material is selected which has a higher dissolution rate in a chemical solution than those of the under-fill material 27 and the spacer resin 26, so that even if the under-fill material 27 and the spacer resin 26 etc. are dissolved, the wiring board 11 will remain undissolved. Therefore, when the spring member 25 extends due to the recovery of elasticity, the other end (the end which is not provided with protruding portion 25a) of the spring member 25 is supported by the wiring board 11. As a result of this, the spring member 25 can securely destroy the circuit of the electronic-circuit forming portion 13 of the semiconductor element 12.

Further, the convex external connection terminal 14 of the semiconductor element 12 and the bonding terminal 16 on the wiring board 11 corresponding thereto are connected by a conductive member 20, and therefore, even if the under-fill material 27, the spacer resin 26, and the solder resist layer 15 are dissolved and removed by a chemical solution, the mechanical connection between the semiconductor element 12 and the wiring board 11 is maintained. Therefore, the other end (the end which has no protruding portion 25a) of the spring member 25 is securely supported by the wiring board 11.

From this viewpoint as well, when the spring member 25 extends due to the recovery of its elasticity, the other end (the end which has no protruding portion 25a) is supported by the wiring board 11 and the extension force of the spring member 25 is transferred to the electronic-circuit forming portion 13 of the semiconductor element 12 thereby enabling the secure destruction of the circuit of the electronic-circuit forming portion 13.

Further, before the under-fill material 27 and the solder resist layer 15 are dissolved, the spring member 25 is arranged on the solder resist layer 15 provided on the backup pattern 17 which is selectively formed on the surface of the wiring board 11. Therefore, after the under-fill material 27 and the solder resist layer 15 are dissolved by the chemical solution, the other end (the end having no protruding portion 25a) is supported by the backup pattern 17. The backup pattern 17 reduces the deformation of the wiring board 11. Therefore, the spring member 25 can destroy the circuit of the electronic-circuit forming portion 13 in the semiconductor element 12 more securely.

Further, the thickness of the spacer resin 26 is set to be smaller than the stroke of the spring member 25, that is, the difference in the length of the spring member 25 in its extension direction between a compression state and an elastically recovered state. Therefore, in the course of dissolving and removing the under-fill material 27, the spacer resin 26, and the solder resist layer 15 thereby causing the spring member 25 to recover its elasticity, it is possible to securely destroy the electronic-circuit forming portion 13 of the semiconductor element 12 with the protruding portion 25a of the spring member 25.

In this way, according to the first embodiment, it is possible to configure a flip-chip type semiconductor device with an enhanced tamper resistance without increasing the thickness of the semiconductor device, and thereby to deal with the size and thickness reduction of the semiconductor device.

By the way, the spring member 25 is a leaf spring which has a section of approximately "V" shape (a V shape of which bent point is of a circular arc shape), and is formed with the protruding portion 25a which is a protruding edge having an acute angle shape at an end in its extension direction (upward direction in FIG. 1 in the present example); however, the shape of the spring member 25 is not limited to such a shape. For example, the shapes shown in FIGS. 4 to 9 may be used.

The spring member shown in FIGS. 4 to 9 may be made of the same material as that of the spring member 25 shown in FIG. 2 and further, as with the spring member 25, may be formed by a mechanical or chemical processing, or an electroforming method etc. using a metal plate having a thickness of not less than 20 μm or a wire having a diameter of about 10 μm.

Figure 4:
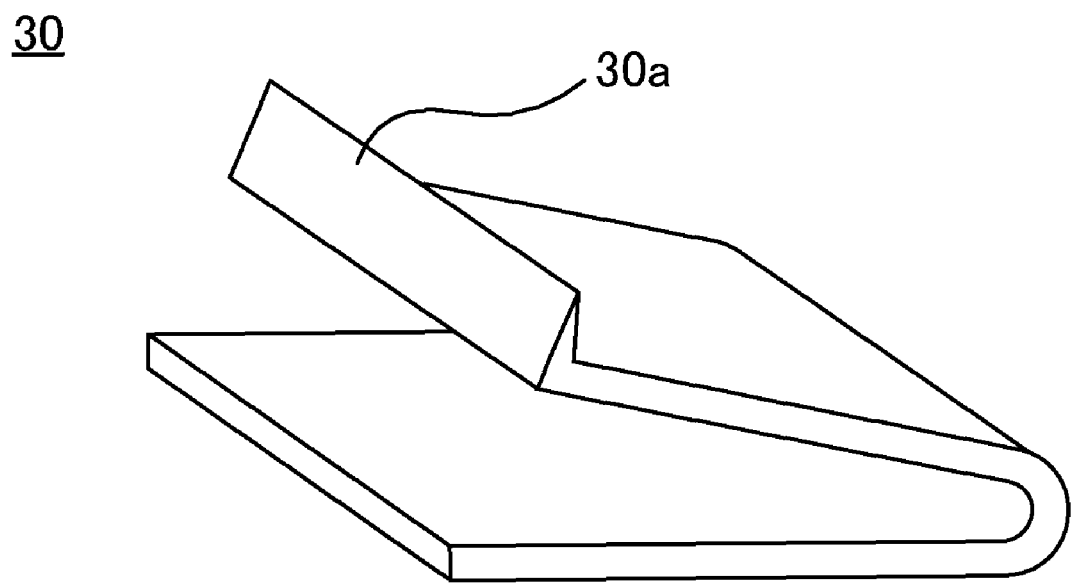
FIG. 4 is a perspective view to show a variant 1 of the spring member shown in FIG. 1.

The spring member 30 shown in FIG. 4 is a compression spring which has a section of an approximately "V" shape (a V shape of which bent point is of a circular arc shape), and is formed at an end in its extension direction with a protruding portion 30a which has an acute angle shape and is shaped like one continuous blade.

Figure 5A:
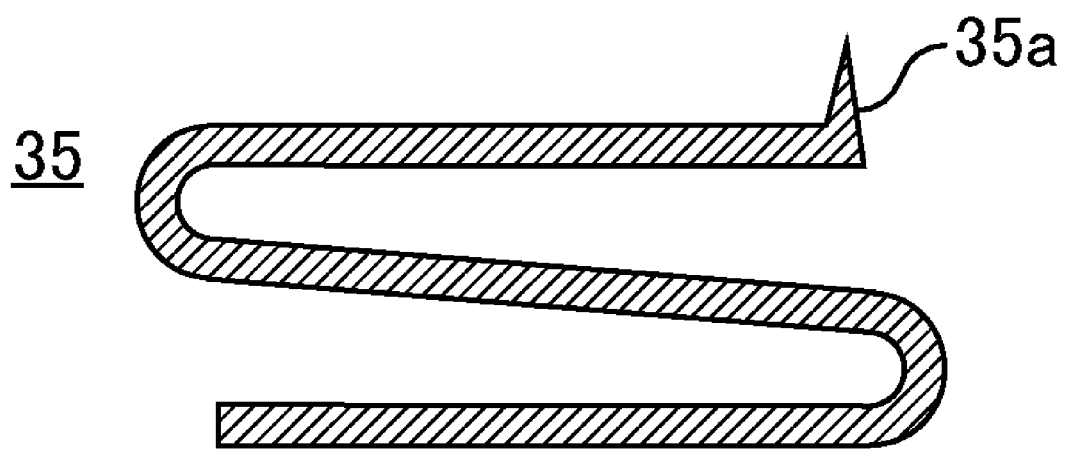
FIGS. 5A to 5E are sectional views to respectively show variants 2 to 6 of the spring member shown in FIG. 1.

A spring member 35 shown in FIG. 5A is a compression spring having a section of an approximately "Z" shape (a Z shape of which bent points are both of circular arc shape), and is formed with a protruding portion 35a having an acute angle shape at an end in its extension direction.

Figure 5B:
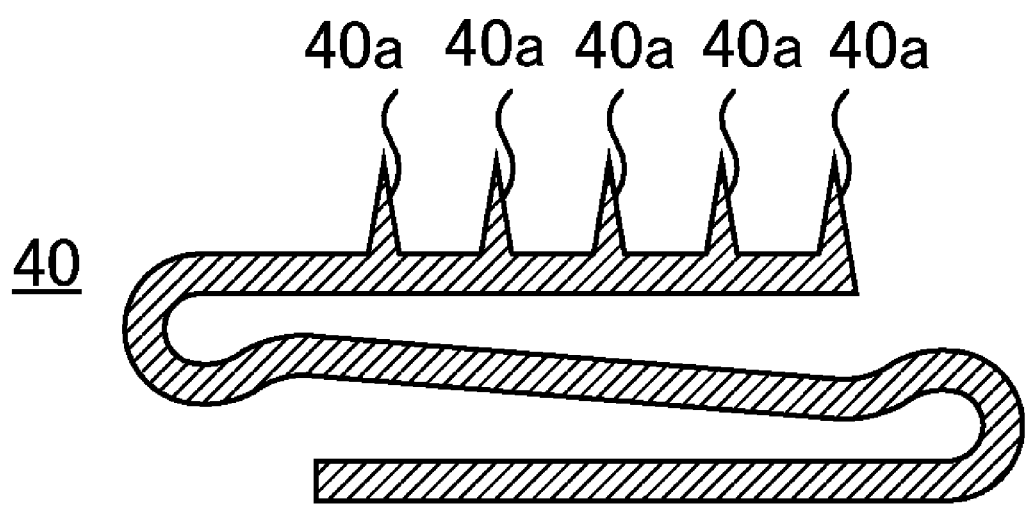

A spring member 40 shown in FIG. 5B is a compression spring having a section of an approximately "Z" shape (a Z shape of which bent points are both of circular arc shape), and is arranged on the top surface with a plurality of protruding portions 40a having an acute angle shape. The plurality of protruding portions 40a enable the destruction of multiple areas of the electronic-circuit forming portion 13 in the semiconductor element 12.

Figure 5C:
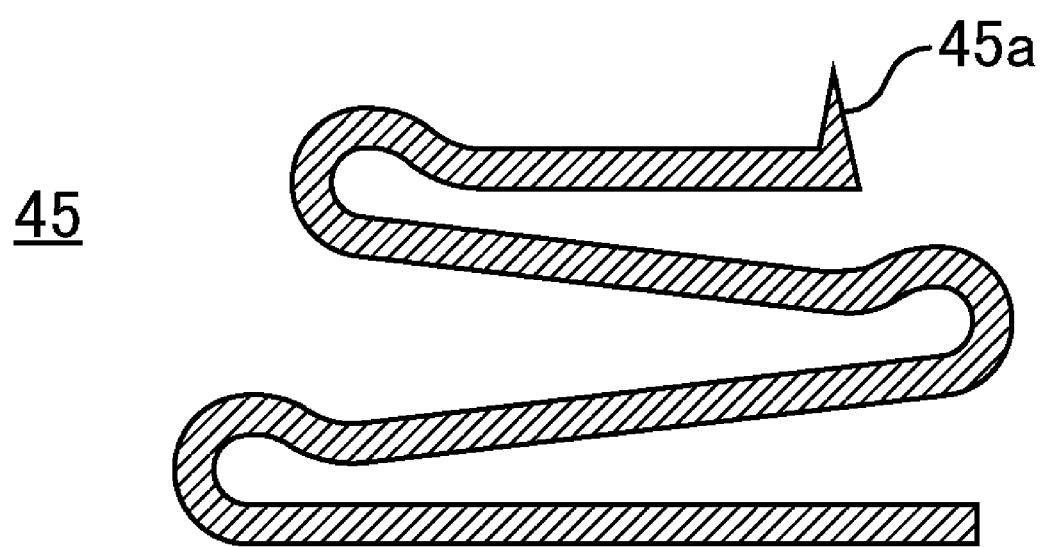

A spring member 45 shown in FIG. 5C is a compression spring having a section of an approximately "Σ" shape (a Σ shape of which any bent point is of a circular arc shape), and is formed with a protruding portion 45a having an acute angle shape at an end in its extension direction.

Figure 5D:
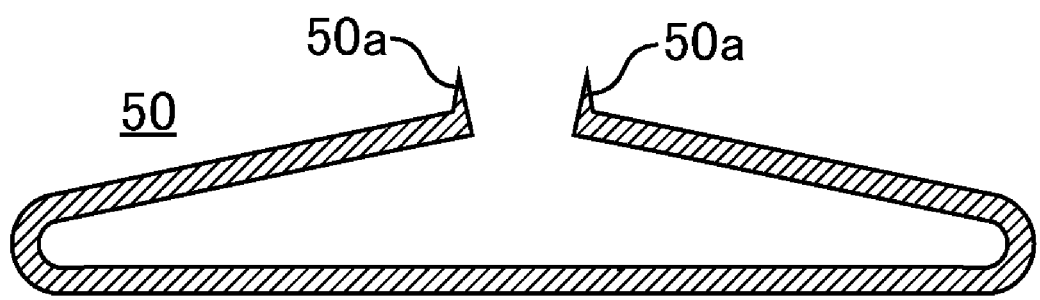

Further, a spring member 50 shown in FIG. 5D is a compression spring having a staple shape which may be formed by connecting opposite ends of the spring member 25 or 30 shown in FIG. 2 or FIG. 4, and is formed with a protruding portion 50a having an acute angle shape at each of the two ends in its extension direction.

Figure 5E:
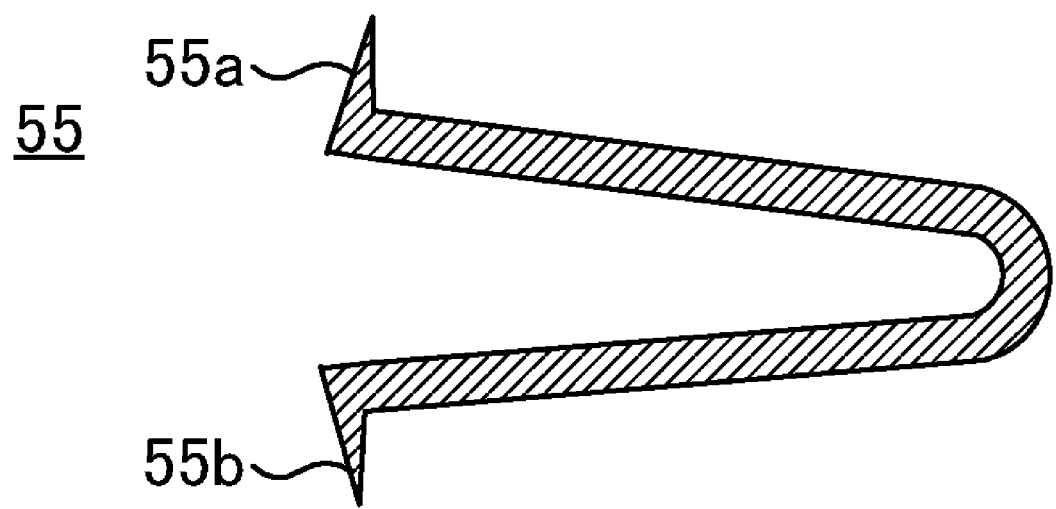

Furthermore, a spring member 55 shown in FIG. 5E is a leaf spring which has a section of approximately "V" shape (a V shape of which bent point is of a circular arc shape), and is formed with protruding portions 55a and 55b each having an acute angle shape, at both ends of its extension part respectively.

Such a structure makes it possible to dispose the spring member 55 with its top and bottom inverted when disposing it, thereby enabling to improve the efficiency of the mounting operation of the spring member 55. Further, when an area to be destroyed is formed as well in a plate member such as the wiring board 11 and in a surface opposite to the semiconductor element 12, it is possible to destroy both the areas of the semiconductor element 12 and the wiring board 11 at the same time with the protruding portions 55a and 55b by arranging the spring member 55 in the gap between the wiring board 11 and the semiconductor element 12 in a compressed state and releasing the compressed state.

Especially, by disposing the protruding portions 55a and 55b vertically in an approximately same position, it is possible to destroy both of them when the areas to be destroyed are in a vertically overlapped position. Therefore, it is possible to destroy both the areas of the semiconductor element 12 and the wiring board 11 with a fewer number of parts thereby reducing the cost. Furthermore, densely arranging the spring member 55 will make it possible to increase the destruction positions in the semiconductor element 12 and the wiring board 11.

The protruding portions in each of the spring member 30, 35, 40, 45, 50, or 55 shown in FIGS. 4 and 5 are integrally formed when the spring member 30, 35, 40, 45, 50 or 55 is formed, as with the protruding portion 25a in the spring member 25 shown in FIG. 2. That is, when the spring member 30, 35, 40, 45, 50, or 55 is formed by a mechanical processing, it is possible to form the protruding portion by intentionally producing a bur when cutting an end part of the spring.

It is noted that the protruding portion 30a, 35a, 40a, 45a, 50a, 55a, or 55b may be formed separately from the spring member 30, 35, 40, 45, 50, or 55 and joined to the concerned spring member.

Further, although the above described protruding portion 30a, 35a, 40a, 45a, 50a, 55a, or 55b has an acute angle shape, they are not limited to such a form, but may have a needle shape, conical shape, pyramidal shape, blade shape, or approximately spherical shape.

Figure 6A:
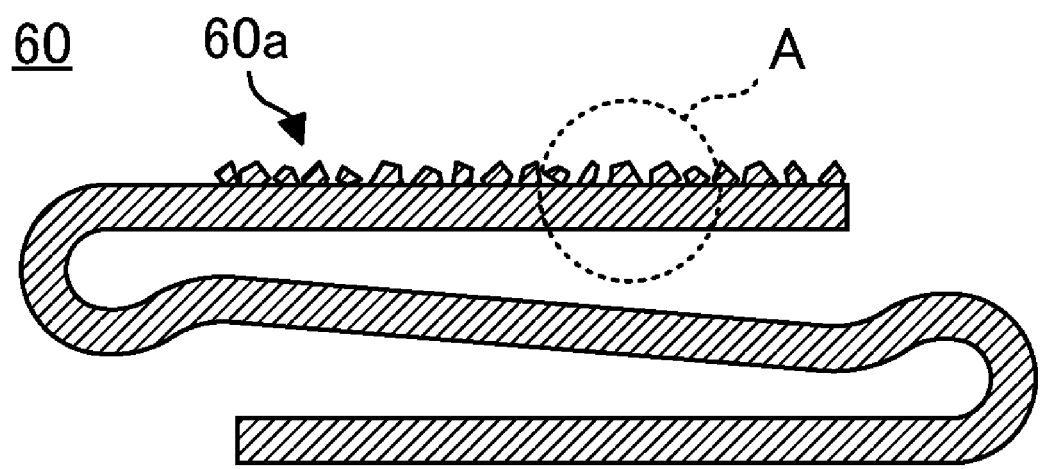
FIGS. 6A to 6C are sectional views to respectively show variants 7 and 8 of the spring member shown in FIG. 1.

For example, the spring member 60, which has a section of approximately "Z" shape shown in FIG. 6A, is formed with a protruding portion 60a in which hard particles are dispersedly fixed on the top surface of the extension part thereof.

Figure 6B:
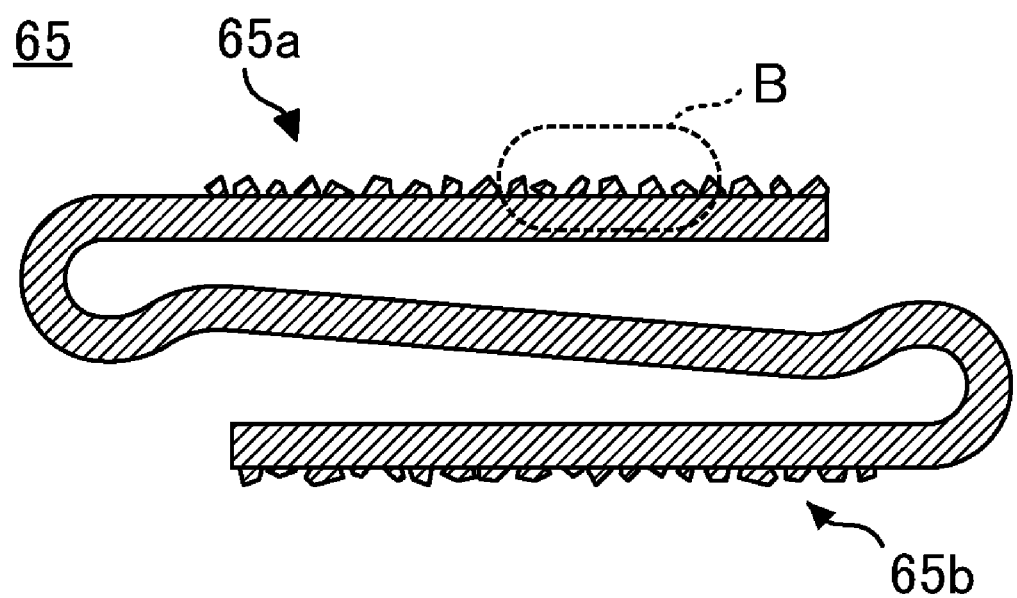

Further, the spring member 65 having a section of approximately "Z" shape shown in FIG. 6B is configured such that hard particles are dispersedly fixed on the top and bottom surfaces thereof thereby forming the protruding portions 65a and 65b.

Figure 6C:
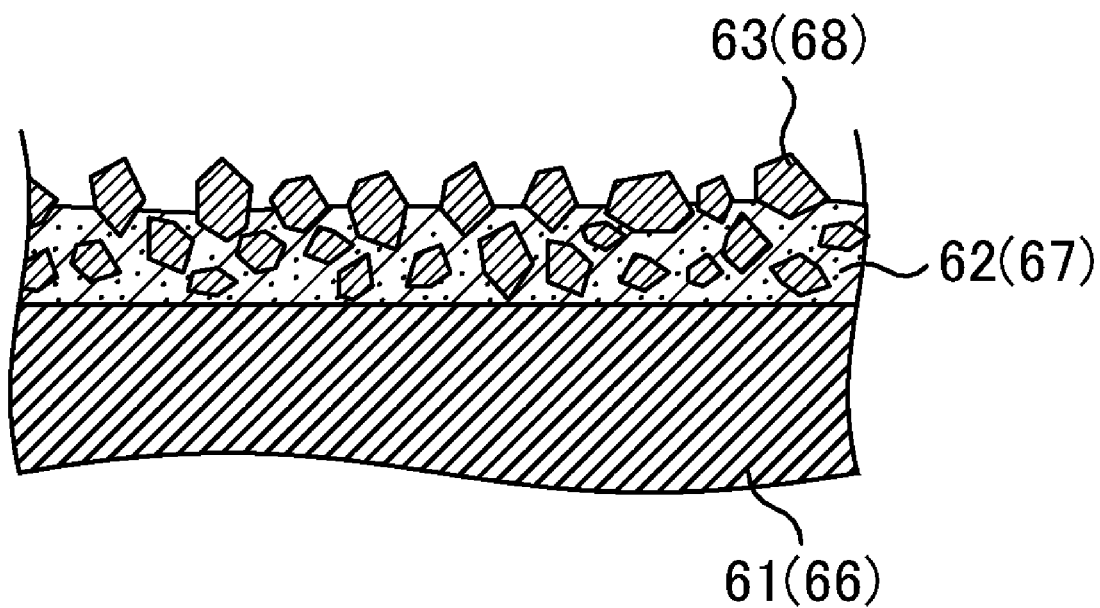

The portion encircled by the dash line A in FIG. 6A (the portion encircled by the dash line B in FIG. 6B) is shown in an enlarged state in FIG. 6C.

A metal plating layer 62 (67) is formed on the surface layer of the spring member 61 (66) of the spring member 60 (65) by an electrodeposition method such as an electrolytic plating method or an electroless plating method etc. and further, angular hard particles 63 (68) are dispersedly fixed on the metal plating layer 62 (67) thereby forming protruding portions 65a and 65b.

In such a configuration, from the viewpoint of the applicability of the electrodeposition method and the spring characteristics, a nickel alloy such as nickel-manganese (Ni—Mn) or nickel-cobalt (Ni—Co) etc. is selected as the spring member 61 (66).

Further, as the hard particles 63 (68), angular powder made up of various ceramics such as alumina (Al), zirconia ($ZrO_2$), silicon nitride ($Si_3N_4$), silicon carbide (SiC), and aluminum nitride (AlN) etc.; various aluminum (Al)-based alloys such as Al—Mn, Al—Si, and Al—Mg based alloys etc.; silicon dioxide ($SiO_4$); diamond; silicon (Si); and tungsten (W) etc. may be adopted.

According to such an electrodeposition method, it is possible to adopt high hardness materials as the material for the protruding portions 60a, 65a, or 65b, and to select the material for the protruding portion depending on the material or the layer configuration of the object to be destroyed such as the electronic-circuit forming portion 13 of the semiconductor element 12. Further, a fine structure of the protruding portion 60a, 65a, or 65b can be easily formed without involving mechanical processing. This enables a thickness reduction of the semiconductor device.

It is noted that when forming the protruding portion 60a, 65a, or 65b, an insulation coating is applied in advance using resin etc. on the region where the application of the hard particles 63 (68) is not desired.

Further, in the spring member 25, 30, 35, 40, 45, 50, 55, or 60 shown in FIG. 2 and FIGS. 4 to 6, it is also possible to apply a method of roughening the surface of the spring member by mechanical means such as grind-wheel grinding, abrasive grain blasting, or laser processing etc., as the method of forming the protruding portion.

On the other hand, it is also possible to apply a so-called coil spring as the spring member in place of the above described leaf spring.

Figure 7:
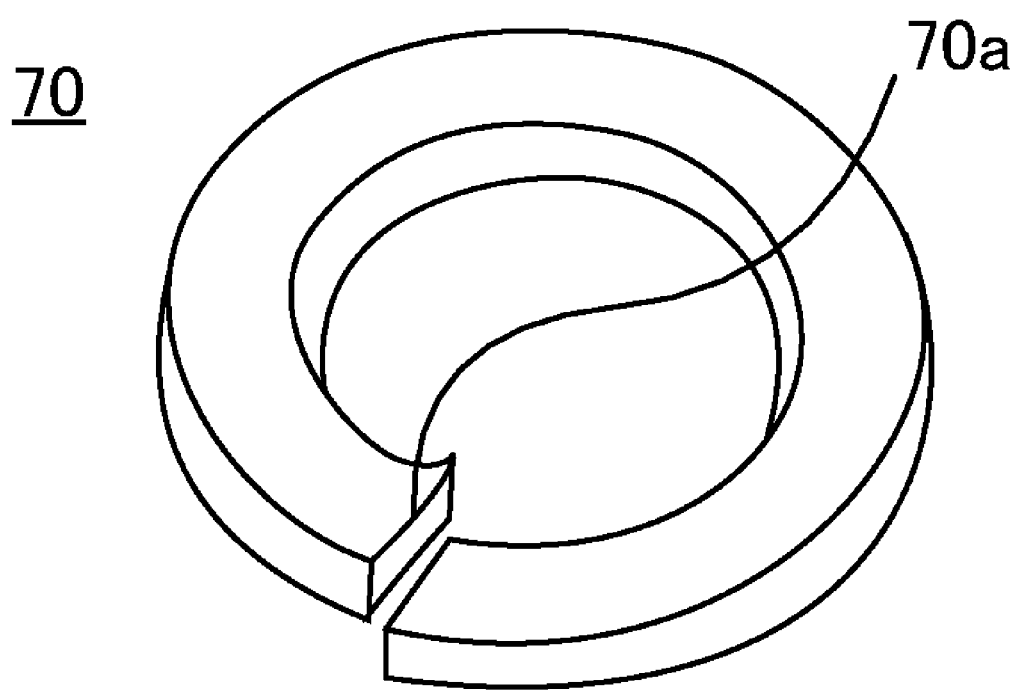
FIG. 7 is a perspective view to show a variant 9 of the spring member shown in FIG. 1.

Firstly, as shown in FIG. 7, a ring like spring washer 70 provided with a slit can be used as the spring member. At an end formed by a slit, an acute angle part 70a projected in the extension direction is formed.

Figure 8A:
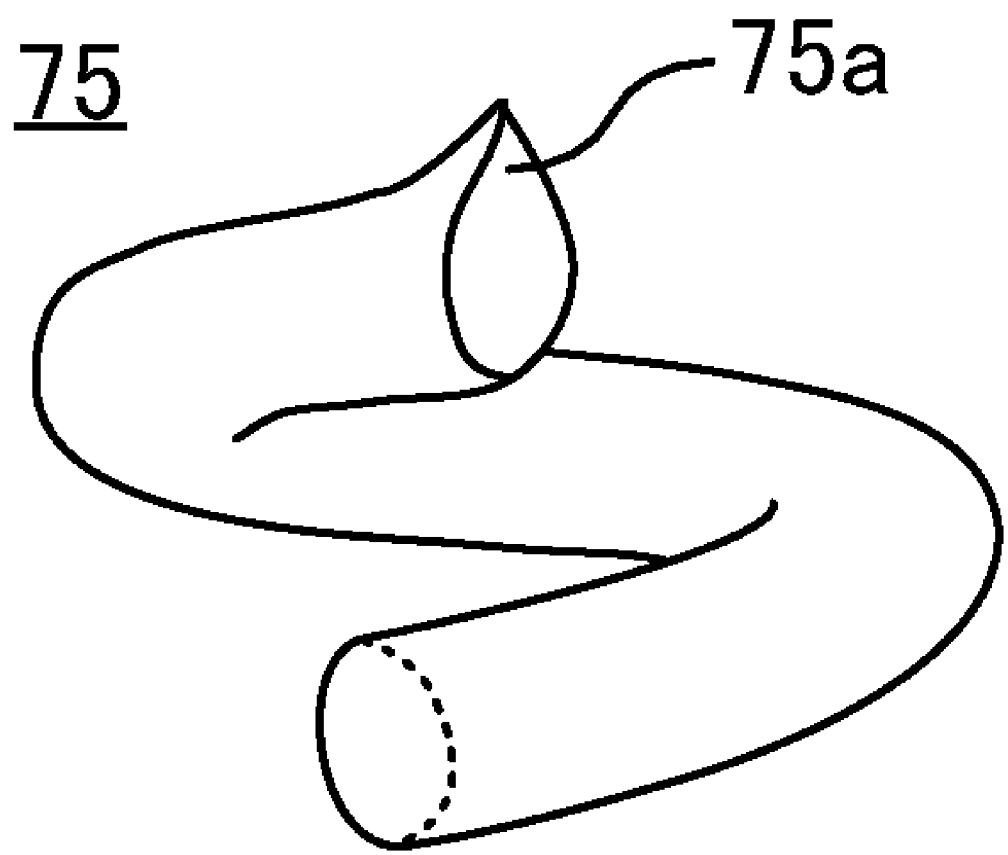
FIGS. 8A and 8B are perspective views to show a variant 10 of the spring member shown in FIG. 1.
Figure 8B:
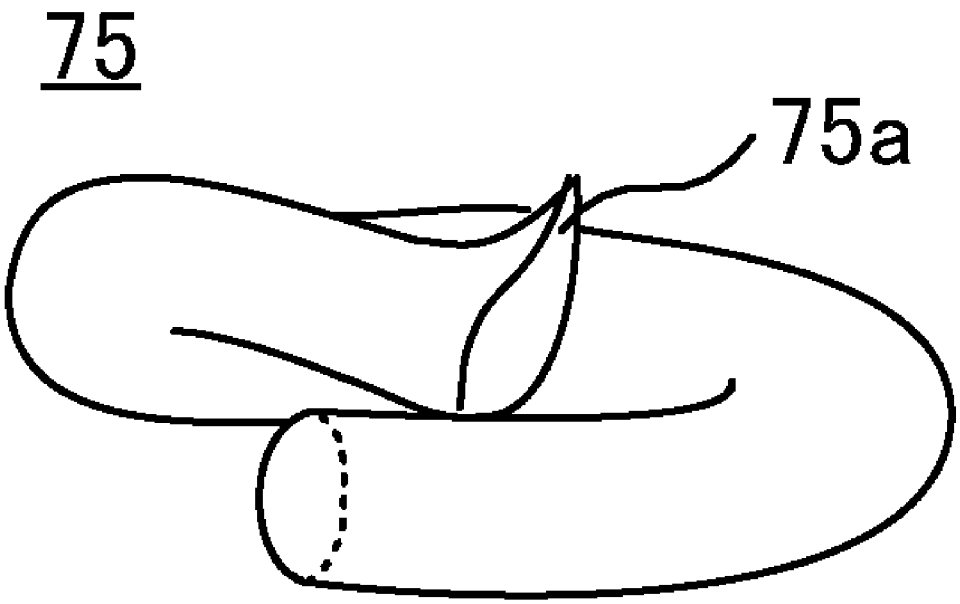

Further, as shown in FIGS. 8A-8B, a coil spring 75 can be used as the spring member. The coil spring 75 exhibits an extended state as shown in FIG. 8A or a compressed state as shown in FIG. 8B. The coil spring 75 is formed at its upper end with an acute angle part 75a projected in its extension direction.

Figure 9:
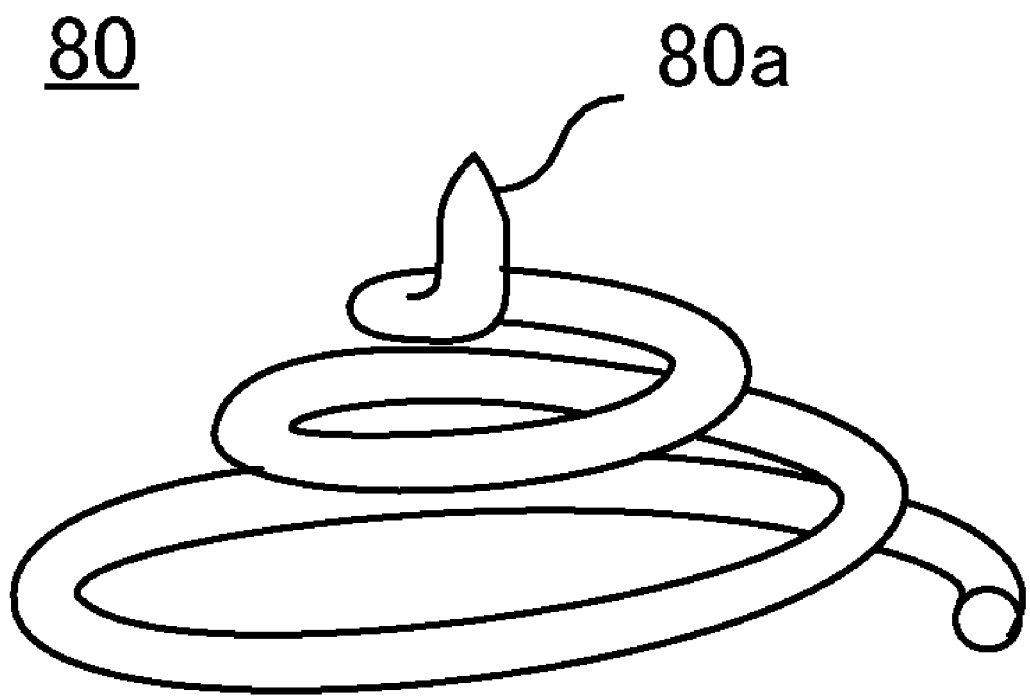
FIG. 9 is a perspective view to show a variant 11 of the spring member shown in FIG. 1.

Moreover, as the spring member, as shown in FIG. 9, a coil spring 80 which is formed by being spirally wound is used. The coil spring 80 is formed in its upper end with an acute angle part 80a projected in its extension direction.

In such a coil spring, when it extends, the acute angle part causes damage to the electronic-circuit forming portion 13 of the semiconductor element 12. Such a coil spring can be easily manufactured by a known method, and the size reduction thereof is easy. Therefore, it is advantageous when a plurality of spring members are to be disposed in the gap between the wiring board 11 and the semiconductor element 12.

Figure 10A:
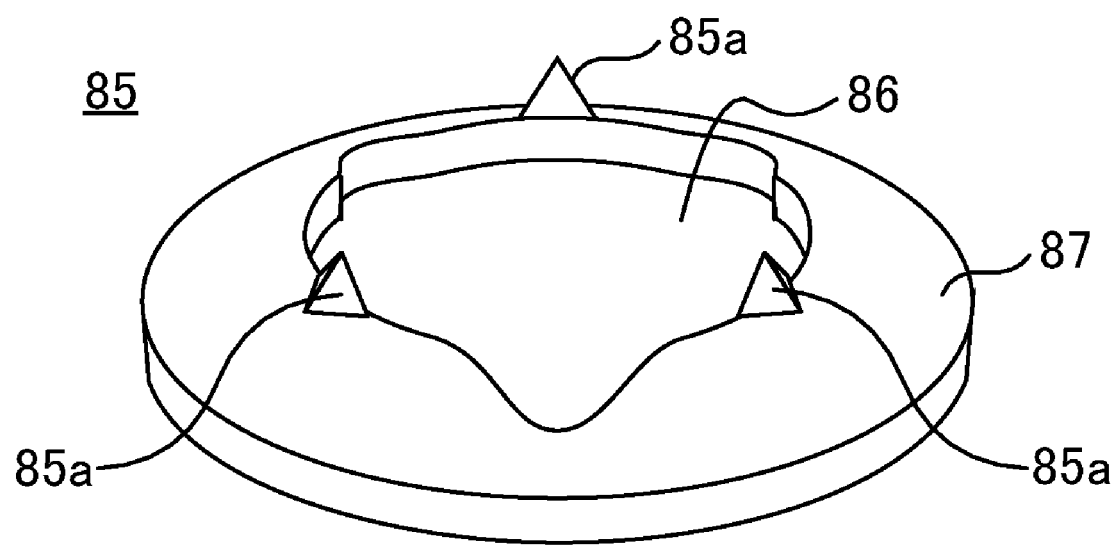
FIGS. 10A to 10C show a variant 12 of the spring member shown in FIG. 1.
Figure 10B:
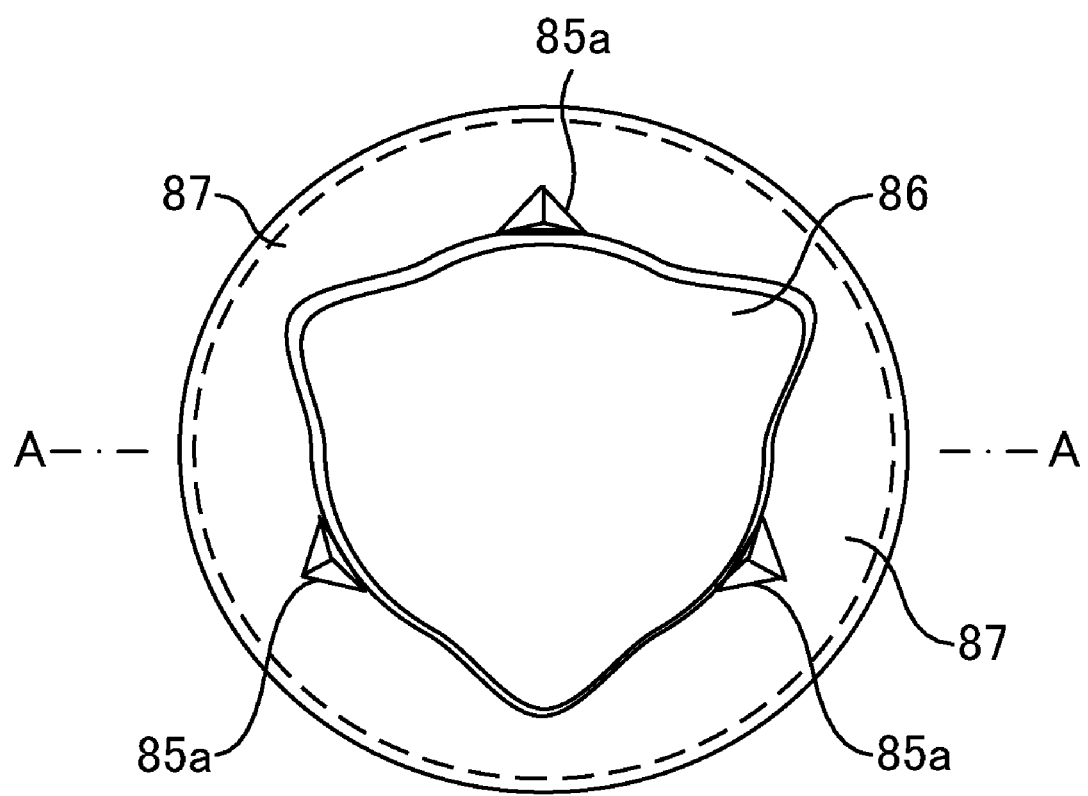
Figure 10C:
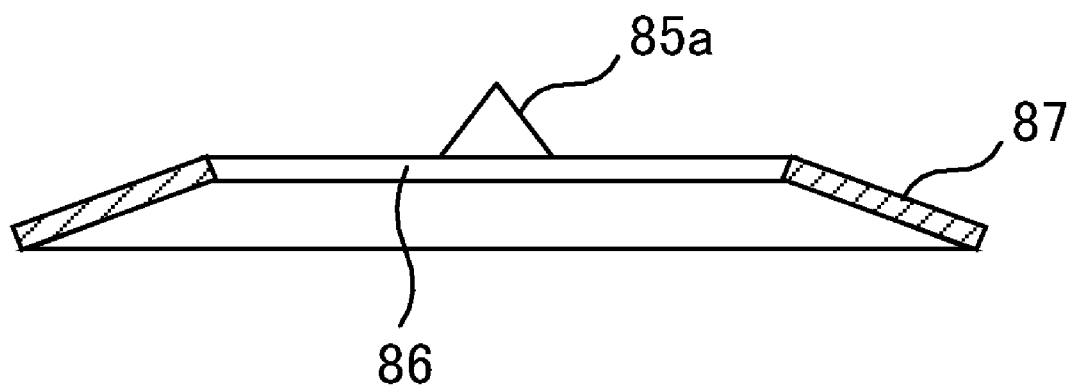
Figure 11A:
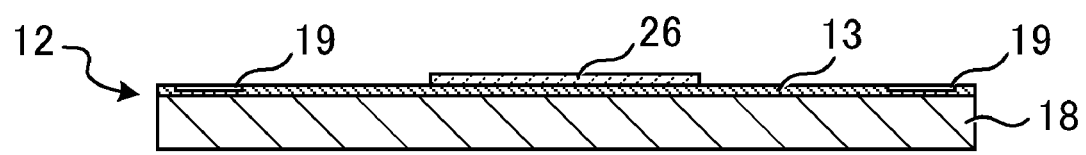
FIGS. 11A to 11D illustrate the manufacturing method of the semiconductor device shown in FIG. 1.
Figure 11B:
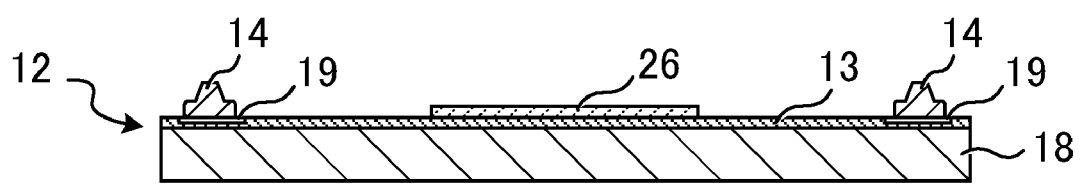
Figure 11C:
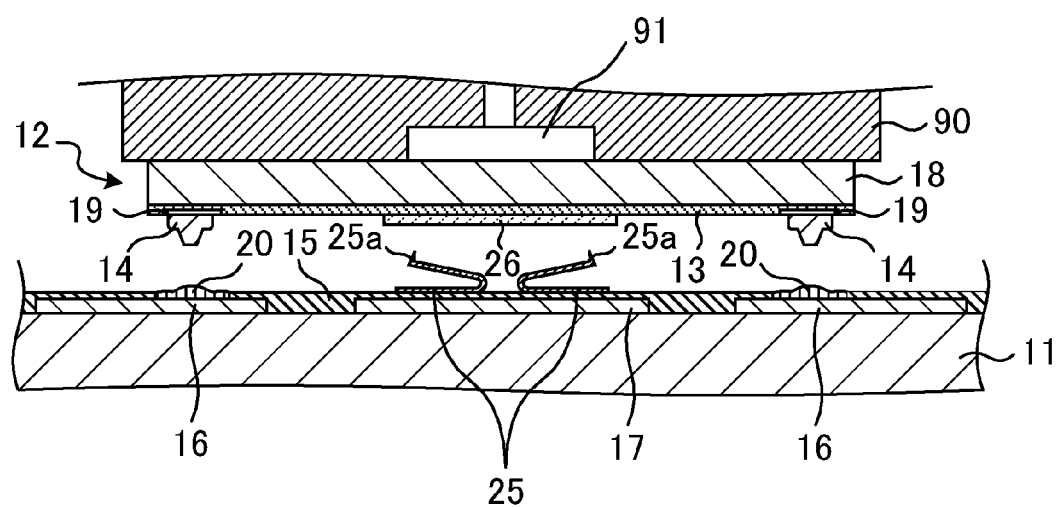
Figure 11D:
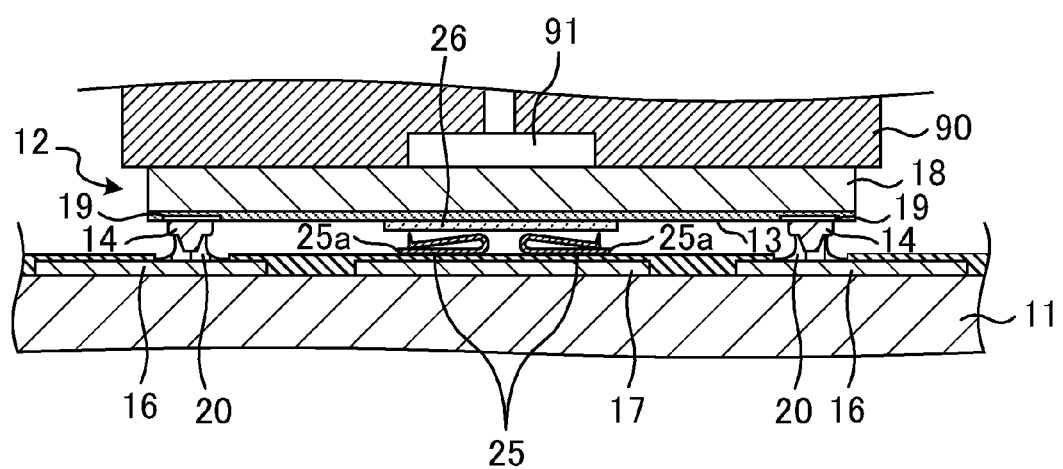
Figure 12B:
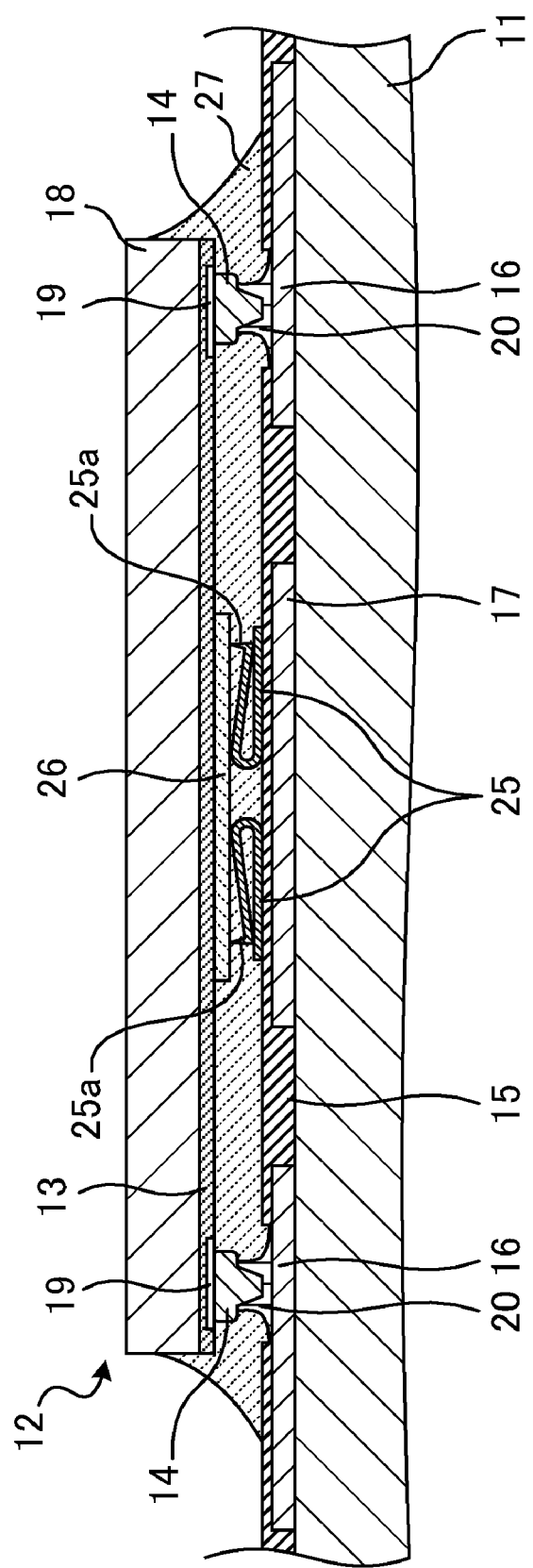

Further, as the spring member, a so-called disc spring can be applied in place of the leaf spring or the coil spring as described above. An example of such disc spring is shown in FIG. 10. It is noted that FIG. 10A is an external perspective view of the disc spring 85, FIG. 10B is a plan view of the disc spring 85, and FIG. 10C is a sectional view taken along the line A-A in FIG. 10B.

The disc spring 85, which has a circular shape, is formed with an opening 86 in an approximately middle part thereof, and is provided with a side surface 87 which is inclined from the opening 86 to the outer peripheral part. Further, an acute angle part 85a projected in the extension direction is arranged at three positions in the outer peripheral part (upper end part of the side surface 87) of the opening 86.

Thus, the spring member 30, 35, 40, 45, 50, 55, 60, 65, 70, 75, 80, or 85 shown in FIGS. 4 to 10 is disposed such that the protruding portion in each spring member is opposed to the electronic-circuit forming portion 13 of the semiconductor element 12.

The length of the spring member 30, 35, 40, 45, 50, 55, 60, 65, 70, 75, 80, or 85 in its extension direction in an uncompressed and elastically released state is set to be larger than the distance in the gap between the semiconductor element 12 and the wiring board 11.

Then the spring member is configured such that the pressure applied to the electronic-circuit forming portion 13 of the semiconductor element 12 by the protruding portion when the spring member 30, 35, 40, 45, 50, 55, 60, 65, 70, 75, 80, or 85 is elastically released from a compressed state and is extended, is set to be larger than a pressure necessary to securely destroy at least part of the electronic-circuit forming portion 13 of the semiconductor element 12, for example, about 20 GPa.

The manufacturing method of the semiconductor device 100 which has such a configuration will be described with reference to FIGS. 11A to 12B.

First, a known semiconductor manufacturing process is applied to prepare a semiconductor element 12 in which the electronic-circuit forming portion 13 is formed on one principal surface of a semiconductor substrate 18 made of a semiconductor material such as silicon (Si) etc. (See FIG. 11A.)

The electronic circuit is formed of active elements such as a transistor etc., passive elements such as a capacitive element or a resistive element etc., and a wiring layer made of copper (Cu), aluminum (Al), or an alloy of these metals and for interconnecting those functional elements.

A plurality of external connection electrode pads 19 connected to the wiring are formed in the peripheral portion of the electronic-circuit forming portion 13 of the semiconductor element 12 and in the upper most layer of the multilayer wiring. The external connection electrode pad 19 is made of for example aluminum (Al), copper (Cu), and an alloy including those metals, as with the wiring layer. It is noted that for example a nickel/gold (Ni/Au) plating layer from the bottom layer may be arranged on the surface of the external connection electrode pad 19.

Then, a spacer resin 26 is selectively arranged on the electronic-circuit forming portion 13 of the semiconductor element 12.

The spacer resin 26 is made of an epoxy-based or acryl-based resin material which is dissolved by a chemical solution such as fuming nitric acid, sulfuric acid, or mixed acid obtained by mixing for example fuming nitric acid and sulfuric acid in a proportion of 10 to 1. The spacer resin 26 is formed of a resin material of which dissolution rate into chemical solution is equal to or greater than that of an underfill material 27. Further, the thickness of the spacer resin 26 is set to be smaller than the spring stroke of the spring member 25, that is, the difference in the length of the spring member 25 in its extension direction between a compressed state and an elastically recovered state.

It is noted that the spacer resin 26 may also be formed for example by pasting film-like resin and thermo-curing or photo-curing it depending on the type of resin to be applied.

Then, a convex external connection terminal 14 made of metal such as gold (Au), copper (Cu), or an alloy of these is formed on the external connection electrode pad 19 of the semiconductor element 12 by a so-called ball bonding method. (See FIG. 11B.)

The convex external connection terminal 14 may be made of nickel (Ni) formed by an electroless plating method, electro-plating method, and the like. The top part of the convex external connection terminal 14 is subjected to a flattening process as needed.

It is noted that in such a manufacturing process, first the convex external connection terminal 14 may be formed on the external connection electrode pad 19 of the semiconductor element 12 and then the spacer resin 26 is arranged on the electronic-circuit forming portion 13 of the semiconductor element 12. In such a case, it is possible to use a method of applying pasty resin on the electronic-circuit forming portion 13 of the semiconductor element 12 by a spin coating etc., spreading the resin by means of compressed air, and thereafter thermo-curing the resin, or a method of pasting film-like resin onto the surface of the electronic-circuit forming portion 13 of the semiconductor element 12, and thermo-curing or photo-curing the resin.

It is noted that although the spacer resin 26 and the convex external connection terminal 14 are herein formed for individualized semiconductor elements, the individualization may be performed after integrally forming the spacer resin 26 and the convex external connection terminal 14 for the electronic-circuit forming portion in a plurality of semiconductor elements formed in one semiconductor substrate.

That is, a film-like spacer resin 26 material is integrally pasted on the electronic-circuit forming portion in each of a plurality of semiconductor elements formed on one principal surface of the semiconductor substrate, and the resin material is thermo-cured or photo-cured. Alternatively, pasty spacer resin 26 material is integrally applied to the electronic-circuit forming portion 13 in each of the semiconductor elements 12.

Then, the spacer resin 26 is selectively removed by a patterning process by photolithography etc. such that at least the portion to be destroyed by the spring member 25 is left and the external connection electrode pads 19 are exposed.

Thereafter, a convex external connection terminal 14 is formed on the external connection electrode pad 19; then the back surface of the semiconductor substrate is ground to reduce the thickness; and further a dicing process is conducted to form individualized semiconductor elements 12.

Alternatively, the resin for forming a film-like spacer resin 26 is selectively formed in a B-stage state on the base film having a width of not less than the size of the semiconductor substrate corresponding to the electronic-circuit forming portion 13 in each of the plurality of the semiconductor elements 12 formed on the semiconductor substrate.

Then, the alignment of the base film and the semiconductor substrate is performed, and further the film-like resin is transferred to be pasted to the semiconductor substrate using a roller type laminator etc.

Then, the resin is thermo-cured or photo-cured. Thereafter, the convex external connection terminals 14 are formed on the external connection electrode pads 19; then the back face of the semiconductor substrate is ground to reduce the thickness; and a further dicing process is conducted to form individualized semiconductor elements 12.

In this way, in either of the method in which the spacer resin 26 is arranged on the electronic-circuit forming portion 13 of the semiconductor element 12, and the convex external connection terminals 14 are formed on the external connection terminal pads 19, or a method in which firstly the convex external connection terminals 14 are formed on the external connection electrode pads 19, and then the spacer resin 26 is formed on the electronic-circuit forming portion 13 of the semiconductor element 12, the alignment of the wiring board 11 and the semiconductor element 12 is conducted after the spacer resin 26 is cured. (See FIG. 11C.)

As described so far, as the wiring board 11, an insulating substrate based on inorganic materials or an insulating substrate based on organic materials is used. Then, a wiring layer made of for example copper (Cu) etc. is selectively arranged on the surface of and/or inside of the wiring board 11, and a conductive layer connected to the wiring layer is selectively arranged on the surface which is one principal surface of the wiring board 11 and on which the semiconductor element 12 is to be mounted. Further, a solder resist layer 15 is selectively coated on the conductive layer except the area thereof to which the external connection terminal 14 of the semiconductor element 12 is connected, and the periphery thereof.

As a result of this, a part of the above described conductive layer is exposed as the bonding terminal 16 in the opening part provided in the solder resist layer 15. It is noted that the solder resist layer 15 is formed of resin such as epoxy-based resin, acryl-based resin or polyimide-based resin, etc., or mixed resin of these.

Further, the bonding terminal 16 is formed of aluminum (Al) or an alloy thereof. It is noted that a 2-layer plating nickel/gold (Ni/Au) or a 3-layer plating of copper/nickel/gold (Cu/Ni/Au) from the bottom layer, or solder coating may be applied to the surface of the bonding terminal 16. The solder coating is formed for example by a solder deposition method, solder powder adhesion method, printing method, or electrolytic plating method, and the like.

Further, a remeltable conductive member 20 such as conductive resins containing solder or silver (Ag) particles etc. is precoated on the surface of the bonding terminal 16.

On the other hand, a backup pattern 17 made of the same material as that of the bonding terminal 16 is selectively formed on the surface of the wiring board 11, and the solder resist layer 15 is formed on the backup pattern 17. The spring member 25 is arranged on the solder resist layer 15 via an adhesive agent.

It is noted that when a substrate based on an organic material is used as the wiring board 11, as the organic material, an organic material which has a lower dissolution rate in a chemical solution than those of the under-fill material 27 and the spacer resin 26 is adopted.

The wiring board 11 is sucked and supported by a bonding stage (not shown). The wiring board 11 may be preheated to 50° C. to 100° C. by heating the bonding stage.

In such a situation, the semiconductor element 12 is sucked and held onto the bonding tool 90, which is heated to for example 180° C. to 280° C., via a suction hole 91 and the principal surface of the electronic-circuit forming portion 13 of the semiconductor element 12 and the wiring board 11 are opposed to each other such that the protruding portion 25a of the spring member 25 is opposed to the spacer resin 26. Then, the convex external connection terminal 14 and the bonding terminal 16 arranged on the wiring board 11 are aligned.

Thereafter, the bonding tool 90 is lowered and the convex external connection terminal 14 of the semiconductor element 12 is pressed against and brought into contact with the bonding terminal 16 of the wiring board 11 to heat and melt the conductive member 20 coated on the surface of the bonding terminal 16, thereby connecting the convex external connection terminal 14 of the semiconductor element 12 and the bonding terminal 16 of the wiring board 11. (See FIG. 11D.)

At this moment, the spring member 25 is compressed by the semiconductor element 12 via the spacer resin 26.

Since the spacer resin 26 has already been cured, it will block the intrusion of the protruding portion 25a of the spring member 25 so that the protruding portion 25a will not reach the electronic-circuit forming portion 13 of the semiconductor element 12. Accordingly, the electronic-circuit forming portion 13 of the semiconductor element 12 will not be destroyed and the spring member 25 will be disposed in a compressed state between the wiring board 11 and the semiconductor element 12.

Then, a pasty under-fill material 27 is supplied from a dispenser (not shown) via a nozzle 95 and is applied to the vicinity of one end of the semiconductor element 12. (See FIG. 12A.)

The under-fill material 27 is charged into the gap between the semiconductor element 12 and the wiring board 11 due to the capillary effect, and is further arranged in the outer peripheral part of the semiconductor element 12.

It is noted that when injecting the under-fill material 27, the wiring board 11 may be heated to a temperature at which the curing of the under-fill material 27 will not be initiated (for example, about 50° C. to 100° C.). As a result of this, the under-fill material 27 will flow while maintaining a high fluidity and thereby the charging time will be reduced. Further, the occurrence of a portion unfilled with the under-fill material 27 and generation of voids are prevented/reduced.

Thereafter, the under-fill material 27 is heated such as in a thermostatic oven etc. to be cured. In such a heating process, the heating temperature is set to be for example about 120° C. to 180° C. Further, the heating time is set to be about 30 minutes to 90 minutes. As a result of this, the under-fill material 27 is cured and thus the implementation of the semiconductor element 12 on the wiring board 11 is finalized. (See FIG. 12B.)

As a result, the under-fill material 27 is charged between the semiconductor element 12, which has been mounted and fastened onto one principal surface of the wiring board 11 by a flip-chip (face down) process, and one principal surface of the wiring board 11, thereby reinforcing the connection between them.

The under-fill material 27 is, as with the spacer resin 26, made of epoxy-based or acryl-based resin material which is dissolved by a chemical solution such as fuming nitric acid, sulfuric acid, or mixed acid obtained by mixing for example fuming nitric acid and sulfuric acid in a proportion of 10 to 1. It is noted that when the spacer resin 26 and the under-fill material 27 are made of similar materials, the spacer resin 26 is formed of a resin material having a dissolution rate in chemical solution equal to or greater than that of the under-fill material 27.

Thereafter, a plurality of solder balls (not shown) constituting external connection electrode terminals are arranged on the other principal surface (back surface) of the wiring board 11. Thus, the semiconductor device 100 shown in FIG. 1 is formed.

Second Embodiment

Figure 13:
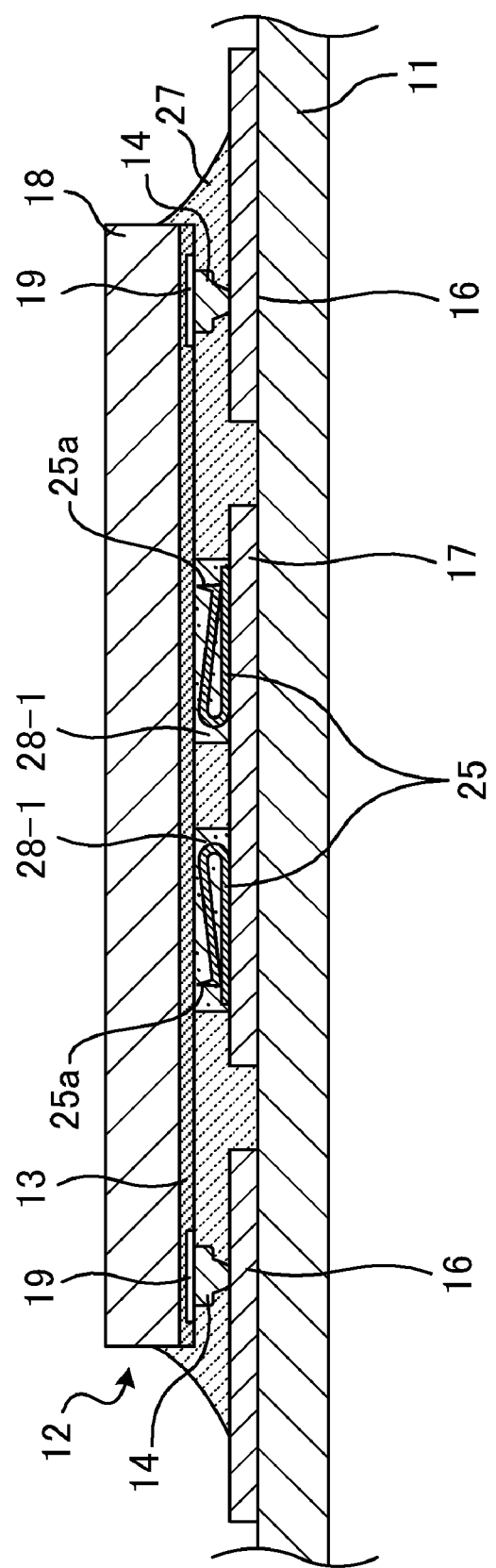
FIG. 13 is a partial sectional view of the semiconductor device relating to a second embodiment.

A semiconductor device 200 relating to a second embodiment is shown in FIG. 13.

It is noted that in the semiconductor device 200, parts corresponding to the parts in the semiconductor device 100 are given like symbols thereby omitting the description thereof.

Although the semiconductor device 200 shares the basic structure with the semiconductor device 100, it has structural differences mainly in the following points.

For one thing, the convex external connection terminal 14 of the semiconductor element 12 and the bonding terminal 16 on the wiring board 11 corresponding thereto are connected by a thermo-compression bonding without interposing the remeltable conductive member 20.

Further, on the backup pattern 17 which is made of the same material as that of the bonding terminal 16 and which is selectively arranged on the surface of the wiring board 11, there is arranged a spring-fixing resin piece (elastic body fixing resin piece) 28-1 in which the spring member 25 including a protruding portion 25a is resin-sealed in a compressed state.

Figure 14A:
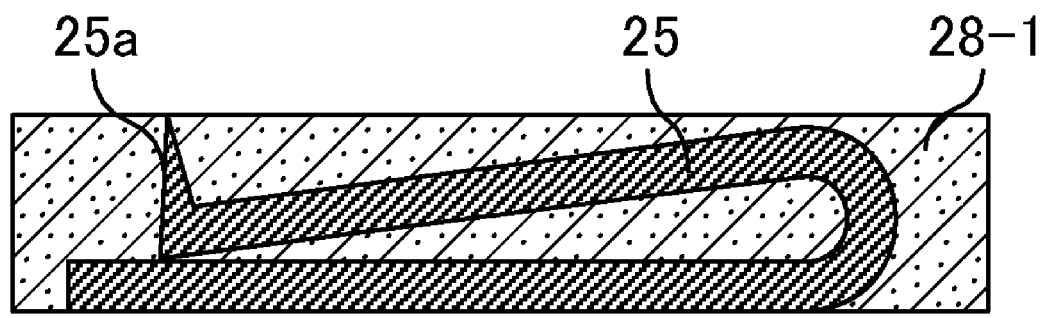
FIGS. 14A and 14B show a spring-fixing resin part for coating the spring member shown in FIG. 13.
Figure 14B:
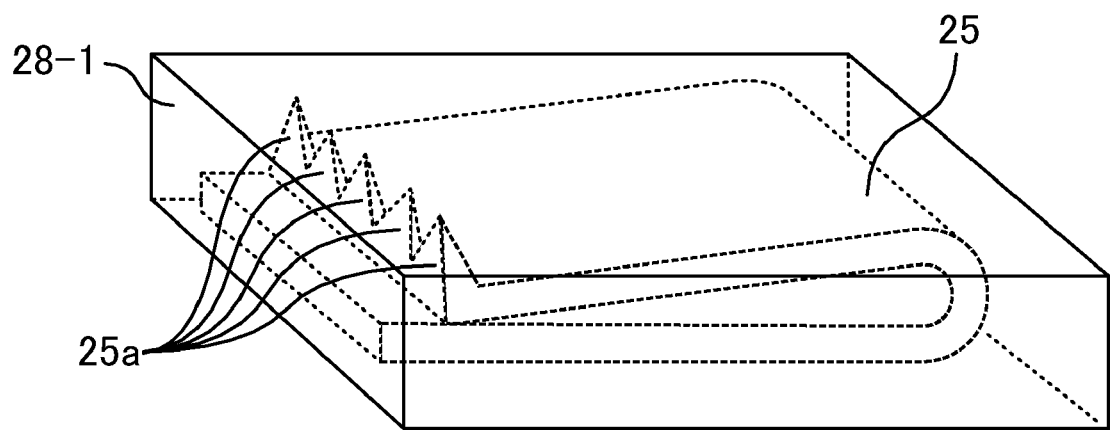

That is, each spring member 25 is sealed in the spring-fixing resin piece 28-1 while being in a compressed state as a whole as shown in FIG. 14. It is noted that FIG. 14A shows a section of the spring-fixing resin piece 28-1 for resin-sealing the spring member 25 in a compressed state, and FIG. 14B perspectively shows the form of the spring member 25 in the spring-fixing resin piece 28-1.

Since, in this way, the entire spring member 25 is accommodated in the spring-fixing resin piece 28-1 in a state of being compressed as a whole, the spacer resin is not disposed in the second embodiment.

The spring-fixing resin piece 28-1 is, as with the under-fill material 27, made of an epoxy-based or acryl-based resin material which is dissolved by a chemical solution such as fuming nitric acid, sulfuric acid, or mixed acid obtained by mixing for example fuming nitric acid and sulfuric acid in a proportion of 10 to 1. Further, when the spring-fixing resin piece 28-1 and the under-fill material 27 are made of the same material, the dissolving rate of the spring-fixing resin piece 28-1 in the chemical solution is set to be equal to or greater than that of the under-fill material 27.

Moreover, the spring member 25 sealed in the spring-fixing resin piece 28-1 is arranged in the gap between the electronic-circuit forming portion 13 of the wiring board 11 and the backup pattern 17, and corresponding to the region excepting the middle part of the wiring board 11.

If the under-fill material 27 is dissolved and removed by a chemical solution in an attempt to take out the semiconductor element 12 from the semiconductor device 200 having such a structure, the spring-fixing resin piece 28-1 will also be dissolved so that the spring member 25 which has been compressed recovers its elasticity and extends. As a result of this, the electronic-circuit forming portion 13 of the semiconductor element 12 will be destroyed by the protruding portion 25a of the spring member 25. This will be described with reference to FIGS. 15A and 15B.

Figure 15A:
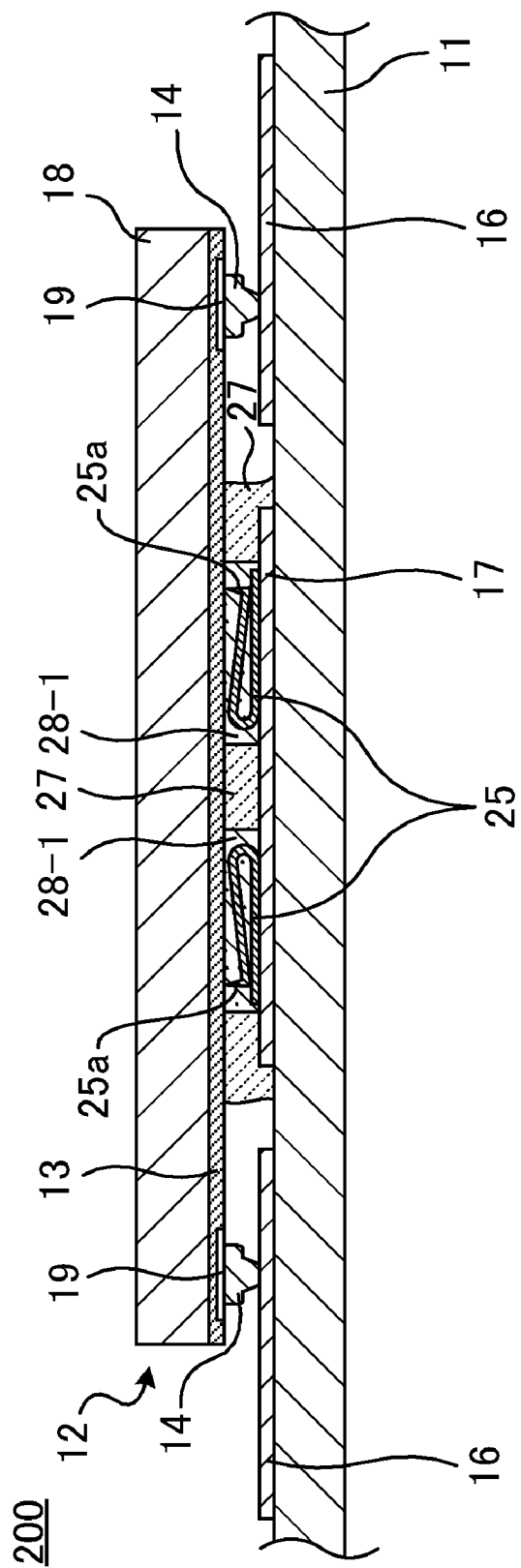

FIG. 15A shows a middle step before the under-fill material 27 is dissolved by the chemical solution from its outer peripheral part, and FIG. 15B shows a state in which the dissolution of the under-fill material 27 has proceeded further causing the under-fill material 27 to be removed, and moreover the spring-fixing resin piece 28-1 has been almost dissolved and removed.

Upon taking out the semiconductor element 12 from the semiconductor device 200, as described above, a chemical solution such as fuming nitric acid, sulfuric acid, or a mixed acid obtained by mixing for example fuming nitric acid and sulfuric acid in a proportion of 10 to 1 is used.

Then, the semiconductor device 200 is immersed into the chemical solution which has been heated, or the chemical solution is dropped onto the outer peripheral part of the under-fill material 27 in the semiconductor device 200. The underfill material 27 and the spring-fixing resin piece 28-1 are dissolved by such a chemical solution.

It is noted that when a substrate based on an organic material is used as the wiring board 11; as that material, an organic material which has a dissolution rate in chemical solution lower than those of under-fill material 27 and the spring-fixing resin piece 28-1 is selected. Therefore, even if the under-fill material 27 and the spring-fixing resin piece 28-1 are dissolved, the wiring board 11 will not be dissolved.

Further, the spring-fixing resin piece 28-1 is made of a resin material of which dissolution rate in chemical solution is equal to or greater than that of the under-fill material 27. Therefore, as shown in FIG. 15B, before the under-fill material 27 is fully dissolved, the spring-fixing resin piece 28-1 will be dissolved, and the spring member 25 which has been compressed will recover its elasticity and extend. As a result of this, the protruding portion 25a of the spring member 25 is pressed against the electronic-circuit forming portion 13 of the semiconductor element 12 and the electronic-circuit forming portion 13 will be destroyed.

As described so far, when a substrate based on an organic material is used as the wiring board 11, a material having a lower dissolution rate in chemical solution than those of the under-fill material 27 and the spring-fixing resin piece 28-1 is selected as the organic material. Therefore, even if the under-fill material 27 and the spring-fixing resin piece 28-1 are dissolved, the wiring board 11 will not be dissolved. Thereby, when the spring member 25 extends due to elastic recovery, the wiring board 11 can support one end of the spring member 25, and thus the electronic-circuit forming portion 13 is securely destroyed.

The spring member 25 resin-sealed by the spring-fixing resin piece 28-1 is arranged at a position farther from the middle part of the semiconductor element 12, that is, in the vicinity of the peripheral edge of the semiconductor element 12 in the gap between the electronic-circuit forming portion 13 of the semiconductor element 12 and the backup pattern 17.

Therefore, even if the under-fill material 27 provided in the gap between the semiconductor element 12 and the wiring board 11 is gradually dissolved and removed from the peripheral edge of the semiconductor element 12, and further the spring-fixing resin piece 28-1 is dissolved and removed, the under-fill material 27 positioned at the middle part of the semiconductor element 12 will remain undissolved. That is, the gap between the semiconductor element 12 and the wiring board 11 is maintained to be its original spacing by the under-fill material 27 which remains at the middle part of the semiconductor element 12.

As a result of this, when the spring member 25, which has been exposed by the dissolution of the spring-fixing resin piece 28-1, extends due to elastic recovery, one end of the spring member 25 will be supported by the wiring board 11, and the electronic-circuit forming portion 13 in the semiconductor element 12 will be securely destroyed. That is, since even in a state in which the connection between the convex external connection terminal 14 and the wiring board 11 is disengaged and the spring-fixing resin piece 28-1 has been dissolved, the under-fill material 27 remains at the middle part of the wiring board 11, the elastic force of the spring member 25 will be transferred to the electronic-circuit forming portion 13 of the semiconductor element 12 thereby enabling the destruction of the electronic-circuit forming portion 13 by pressing force.

In this way, when a third party attempts to dissolve the under-fill material 27 and the spring-fixing resin piece 28-1 by using a chemical solution and take out the semiconductor element 12 from the semiconductor device 200 to fraudulently analyze the interior of the semiconductor element 12, the spring member 25, which has been compressed and held in the spring-fixing resin piece 28-1, recovers its elasticity and extends causing the electronic-circuit forming portion 13 of the semiconductor element 12 to be physically destroyed by the protruding portion 25a of the spring member 25.

As a result of this, it becomes possible to securely prevent the readout of the information within the electronic-circuit forming portion 13 and the observation of the physical structure of the electronic-circuit forming portion 13, and further to disable the operation of electronic circuit in the electronic-circuit forming portion 13.

That is, according to the second embodiment, it is possible to configure a flip-chip type semiconductor device with an enhanced tamper resistance without increasing its thickness, thus enabling size and thickness reduction of the semiconductor device.

In the second embodiment, an aspect in which the spring member 25 shown in FIG. 2 is resin-sealed in the spring-fixing resin piece 28-1 has been shown. However, the second embodiment is not limited to such a configuration, and the spring member 30, 35, 40, 45, 50, 55, 60, 65, 70, 75, 80, or 85 shown in FIGS. 4 to 10 may be accommodated in a compressed state in the spring-fixing resin piece.

Further, at this moment, it is possible to select a configuration in which a plurality of springs are accommodated and disposed within one spring-fixing resin piece.

Figure 16A:
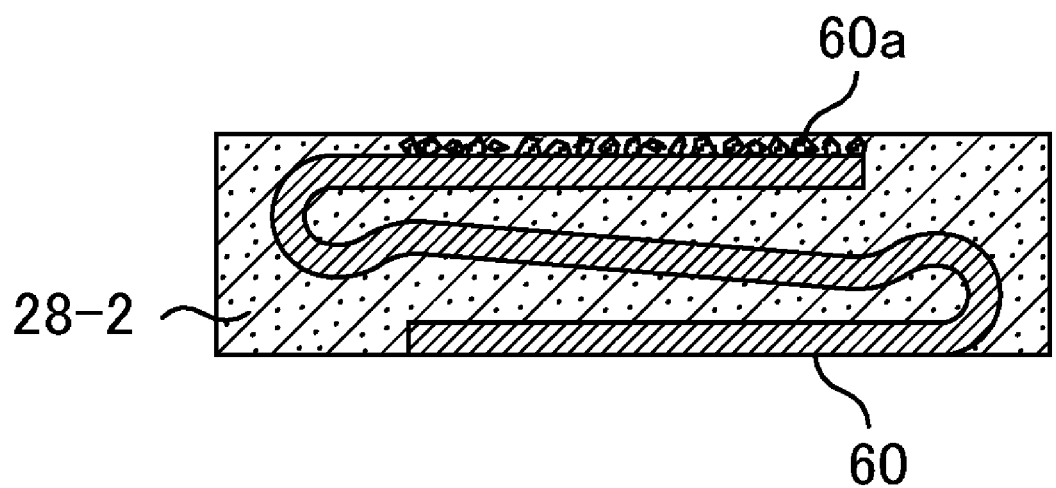
FIGS. 16A and 16B are sectional views to show variants 1 and 2 of the spring-fixing resin part for coating the spring member shown in FIG. 13.

FIG. 16A shows an aspect in which the spring member 60 shown in FIG. 6A and containing the protruding portion 60a to which hard particles are dispersedly fixed, is resin-sealed in a spring-fixing resin piece 28-2.

Figure 16B:
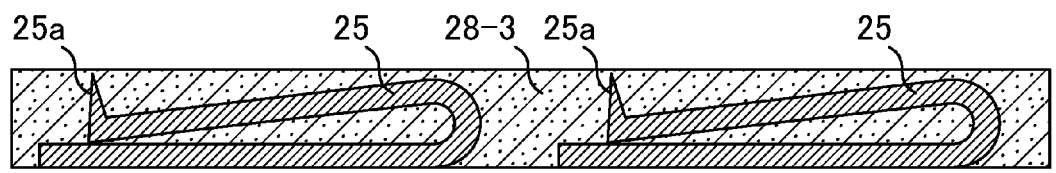

Further, FIG. 16B shows an aspect in which two of the spring members 25 are resin-sealed in a spring-fixing resin piece 28-3.

Figure 17A:
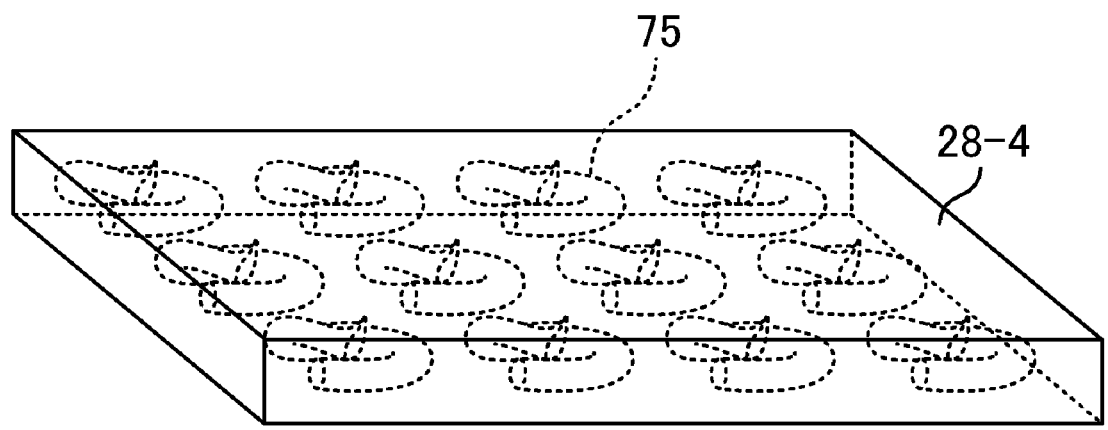
FIGS. 17A and 17B show a variant 3 of the spring-fixing resin part for coating the spring member shown in FIG. 13.
Figure 17B:
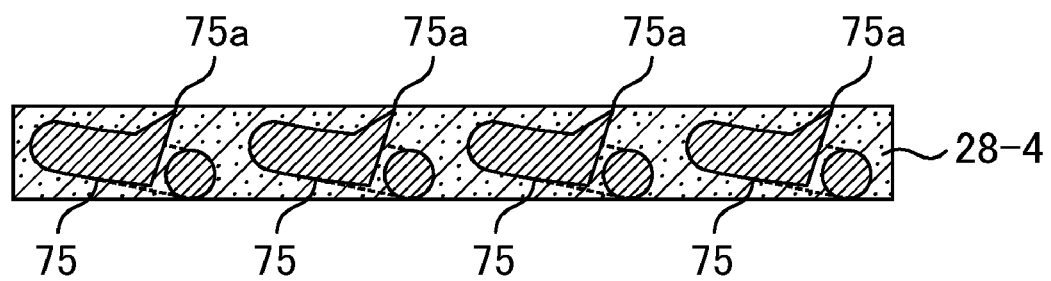

Further, FIGS. 17A and 17B show an aspect in which the spring members 75 shown in FIG. 8 are arranged in a form of 3 columns and 4 rows, and the entire spring members 75 are resin-sealed in one spring-fixing resin piece 28-4. It is noted that FIG. 17A is a perspective transparent view to show the accommodation form of the spring members 75, and FIG. 17B is a sectional view to show the same.

Figure 18:
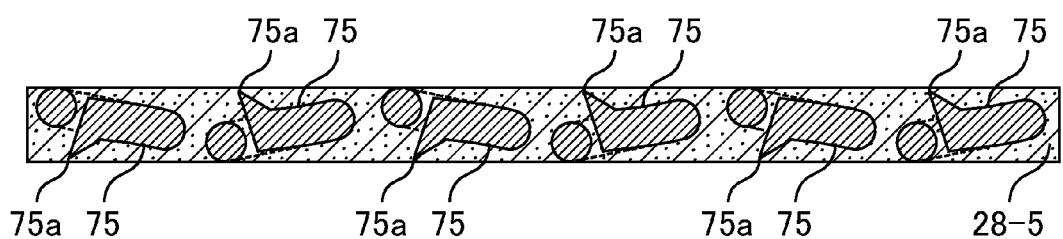
FIG. 18 is a sectional view to show a variant 4 of the spring-fixing resin part for coating the spring member shown in FIG. 13.

Further, an aspect in which a plurality of spring members 75 shown in FIG. 8 are resin-sealed in a spring-fixing resin piece 28-5 is shown in FIG. 18. In such a configuration, the protruding portions 75a of some spring members 75 are positioned on the top surface side of the spring-fixing resin piece 28-5 in the plurality of spring members 75, and the protruding portions 75a of the other spring members 75 are positioned on the bottom surface side of the spring-fixing resin piece 28-5.

Such a configuration makes it possible to arrange the spring-fixing resin piece 28-5 by reversing the front and back sides thereof when arranging it in the gap between the semiconductor element and a plate member such as the wiring board opposite thereto, thereby improving the work efficiency.

Further, when an area to be destroyed is formed in a plate member such as the wiring board 11 etc. and in the surface opposite to the semiconductor element 12 as well, it is possible to destroy both areas in the semiconductor element 12 and the plate member with the protruding portions 75a positioned on the top surface side of the spring-fixing resin piece 28-5 and the protruding portions 75a positioned on the bottom surface side of the spring-fixing resin piece 28-5 by releasing the compressed state of the spring members 75.

Figure 19A:
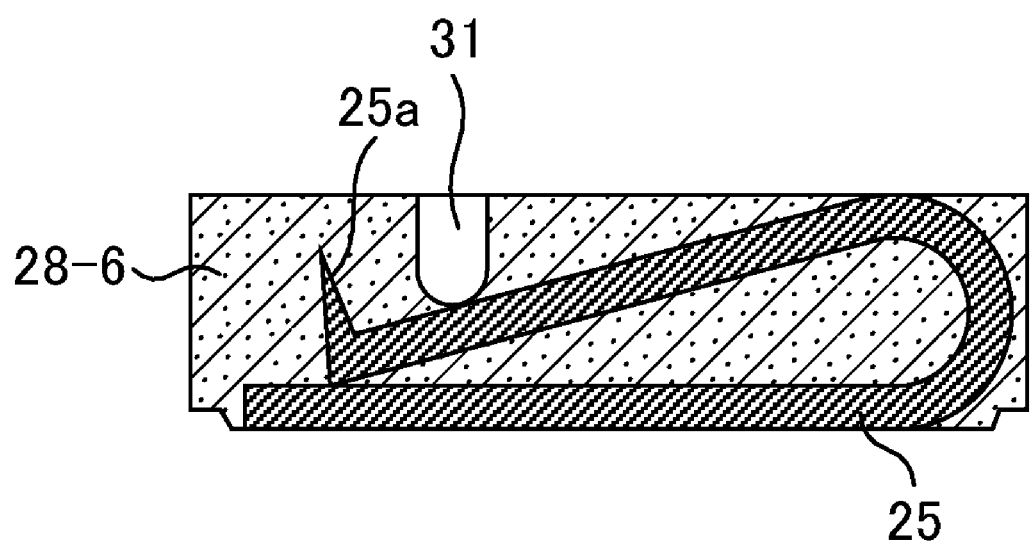
FIGS. 19A and 19B show a variant 5 of the spring-fixing resin part for coating the spring member shown in FIG. 13.
Figure 19B:
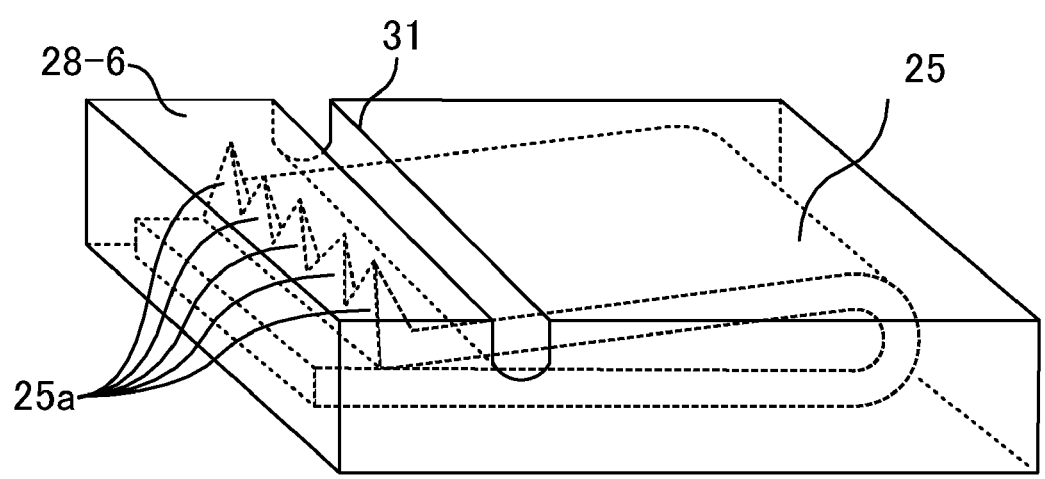

An example in which a concave part 31 is selectively arranged in a spring-fixing resin piece 28-6 which resin-seals the spring member 25 is shown in FIG. 19.

FIG. 19A shows a section of the spring-fixing resin piece 28-6 which resin-seals the spring member 25 in a compressed state, and FIG. 9B illustrates the accommodation form of the spring member 25 with a transparent structure.

In such a configuration, the concave part 31 is formed more inwardly than the protruding portion 25a of the spring member 25. The tip end of the concave part 31 reaches the spring member 25 and the concave part 31 is formed in such a way to communicate the side surfaces in the width direction on the top surface of the spring-fixing resin piece 28-6. Further, the protruding portion 25a of the spring member 25 is spaced apart from the top surface of the spring-fixing resin piece 28-6 and contained in the resin.

Such an arrangement of the concave part 31 enables the flow of the under-fill material 27 thereby restricting and preventing the generation of voids due to insufficient charging thereof, when arranging the spring-fixing resin piece 28-6 and thereafter injecting the under-fill material 27 into the gap between the semiconductor element 12 and the wiring board 11.

Further, as a result of the arrangement of such concave part 31, the amount of resin of the spring-fixing resin piece 28-6 in the vicinity of the protruding portion 25a of the spring member 25 is less than that of the structure shown in FIG. 14. Therefore, it is possible to decrease the time needed to dissolve the spring-fixing resin piece 28-6.

It is noted that a hole 32 having a predetermined aperture size may be disposed in place of the groove-like concave part 31. (See FIG. 20.)

Even in such a configuration, the amount of resin of the spring-fixing resin piece 28-6 is less than that of the structure shown in FIG. 14. Of course, it is also possible to arrange a plurality of the holes 32.

Here, a first manufacturing method of the spring-fixing resin pieces 28-1 to 28-5 shown in FIG. 14 and FIGS. 16 to 18 will be described taking for example the spring-fixing resin piece 28-1 shown in FIG. 14 and referring to FIGS. 21A to 23.

First, a plurality of spring members 25 are disposed at positions which are on a lower die 121 fixed to a lower die fixing part 120 of a resin sealing apparatus and which correspond to a cavity part 127 concavely formed in the upper die 126 fixed to the upper die fixing part 125. (See FIG. 21A.)

A pot part 128, into which resin 129 constituting the spring-fixing resin piece 28-1 is charged, is arranged in a region spaced apart from the region corresponding to the cavity part 127 in the lower die 121, and a region in the lower die fixing part 120 corresponding to the aforementioned region, communicating the both regions.

In the pot part 128, there is disposed a plunger 130 which is movable in the vertical direction by a driving part (not shown). The opening part of the pot part 128 is connected to a cull part 131 formed on the lower die side of the upper die 126, and the cull part 131 is in communication with a runner part 133, which in turn is connected to the cavity part 127, via a gate part 132.

As the resin 129 for forming the spring-fixing resin piece 28-1, an epoxy-based or acryl-based resin material which is dissolved by a chemical solution, which is applied to dissolve and remove the under-fill material 27, such as fuming nitric acid, sulfuric acid, or mixed acid obtained by mixing fuming nitric acid and sulfuric acid in a proportion of 10 to 1. The individual pieces of the resin 129 are disposed on and heated by the plunger 130 in the pot part 128. The resin 129 which has been heated in the pot part 128 is pressed by the plunger 130 and is introduced and disposed in the cull part 131.

In this step, the upper die 126 and the lower die 121 have been heated by heating mechanisms (not shown) provided in the upper die fixing part 125 and the lower die fixing part 120.

Thereafter, mold closing is performed by bringing the upper die 126 which is fixed to the upper die fixing part 125 into contact with the lower die 121, and then mold clamping is performed with a predetermined pressing pressure. (See FIG. 21B.)

At this point, the spring member 25 provided on the lower die 121 is compressed by the pressure from the upper die 126. Further, at this point, a solid resin 129 placed on the plunger 130 will melt, the plunger 125 being provided in the lower die 121 which is heated by the heating mechanism.

Then, the plunger 130, on the top surface of which the resin 129 is placed, is caused to ascend by the driving part. (See FIG. 22A.)

The molten resin pressed into the cull part 131 by the plunger 125 flows into the cavity part 127 via the runner part 133 and the gate part 132, and integrally coats and resin-seals the plurality of spring members 25 placed inside the cavity part 127.

After such a resin sealing process is performed, mold opening is performed to take out a resin molded part 129A, which is made up by integrally resin-sealing the plurality of spring members 25, from the die. (see FIG. 22B.)

At this moment, the resin 129B charged in the cull part 131, the runner 133, and the gate part 132 is also taken out at the same time. The resin molded parts 129A and 129B are solidified. It is noted that since the runner part 133 has a tapered sectional shape which tapers off toward the bottom surface of the upper die 126, the portion at which the resin 129A is in contact with the resin 129B will be easily ruptured and separated.

Thereafter, the resin molded part 129A is cut using a rotary blade 135 to form a spring-fixing resin piece 28-1 in which at least one spring member 25 is resin-sealed. (See FIG. 23.)

According to such a resin molding method, it is possible to easily and effectively manufacture the spring-fixing resin piece 28-1 for resin-sealing the spring member 25.

It is noted that although the manufacturing method of the spring-fixing resin piece 28-1 has been presented herein, the spring-fixing resin pieces 28-2 to 28-5 shown in FIG. 16 to 18 can be formed by changing the spring member to be resin-sealed in the spring-fixing resin piece 28 and its arrangement form and applying the manufacturing method shown in FIGS. 21A to 23.

Figure 20:
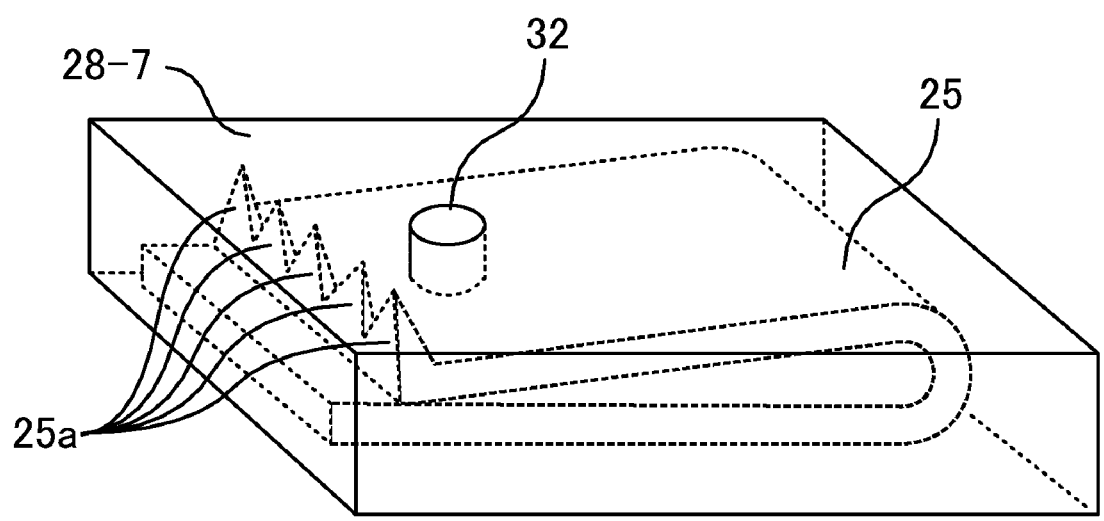
FIG. 20 is a perspective view to show a variant 6 of the spring-fixing resin part for coating the spring member shown in FIG. 13.
Figure 21A:
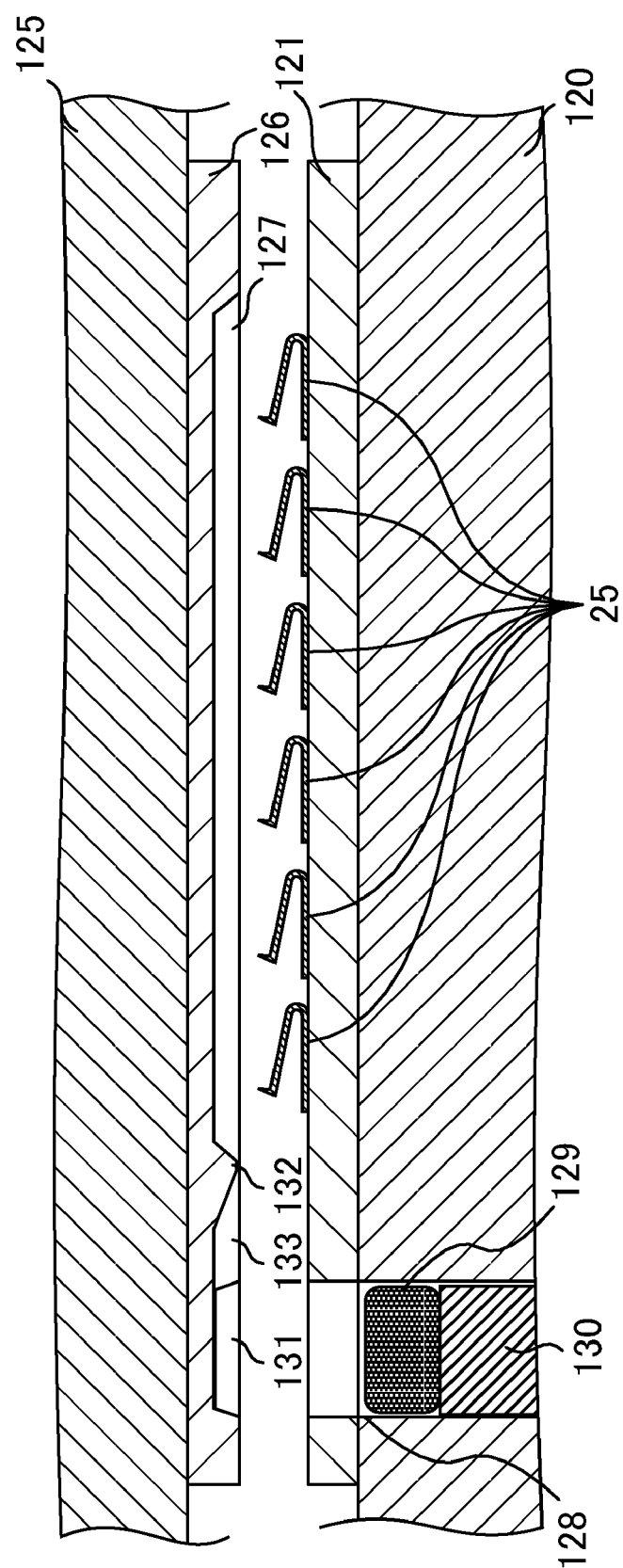
FIGS. 21A and 21B illustrate a first manufacturing method of a spring-fixing resin part for resin-sealing spring members.
Figure 21B:
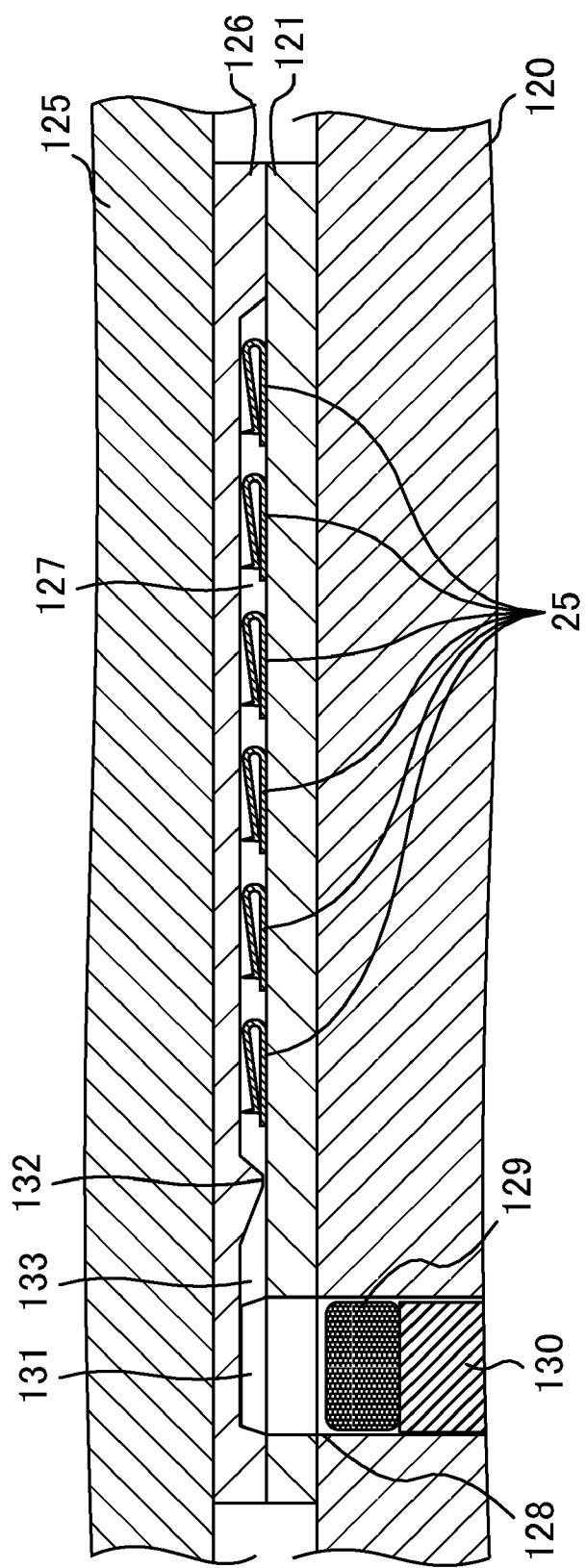
Figure 22A:
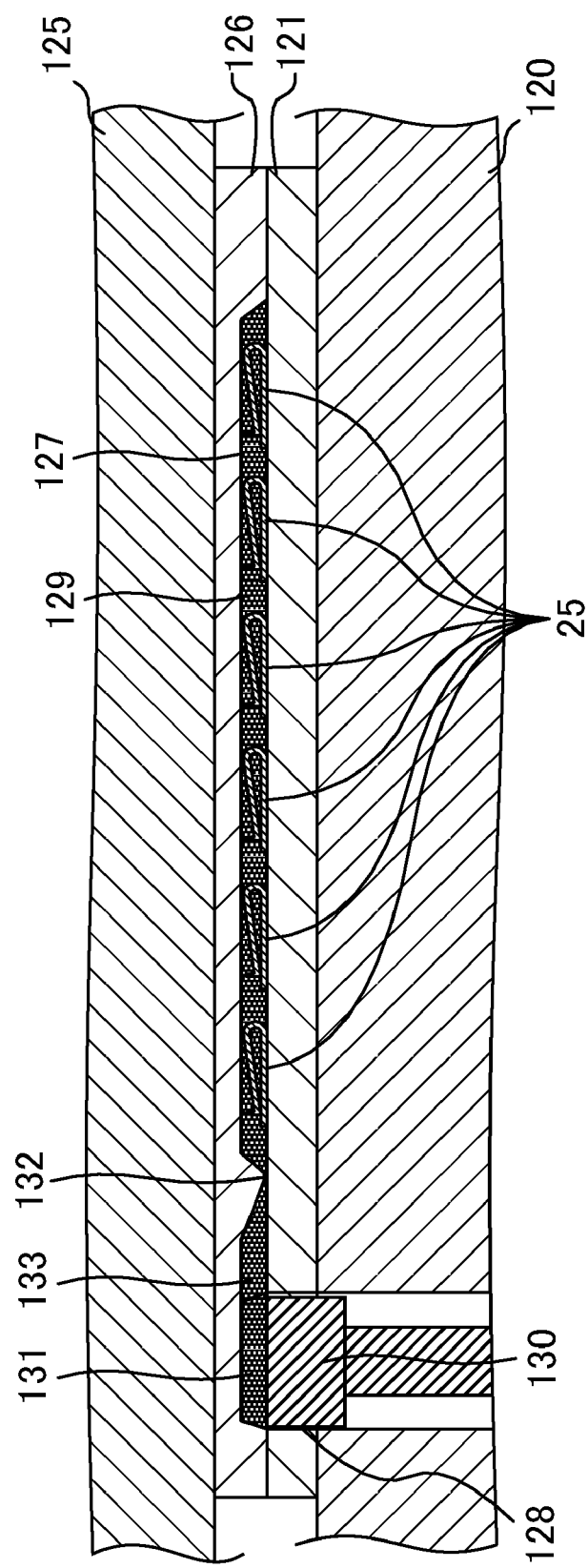
FIGS. 22A and 22B illustrate the first manufacturing method of the spring-fixing resin part for resin-sealing the spring members.
Figure 22B:
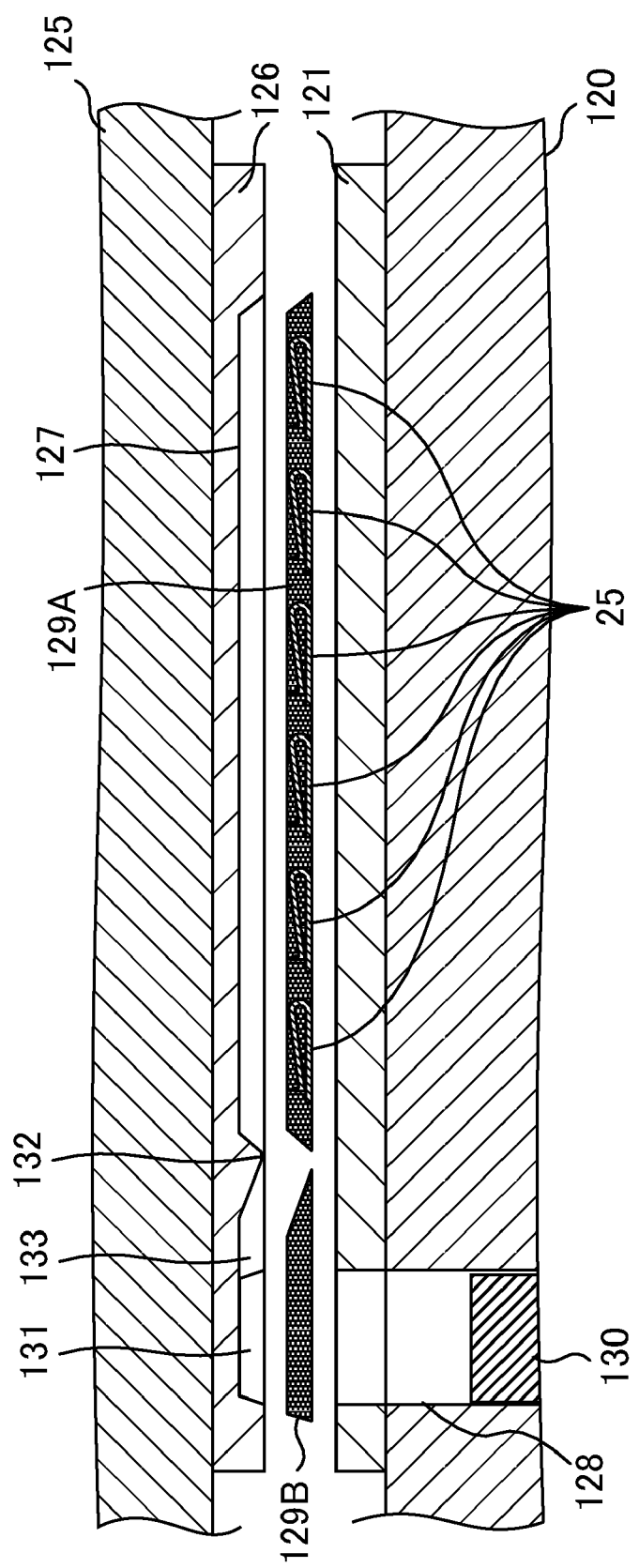
Figure 23:
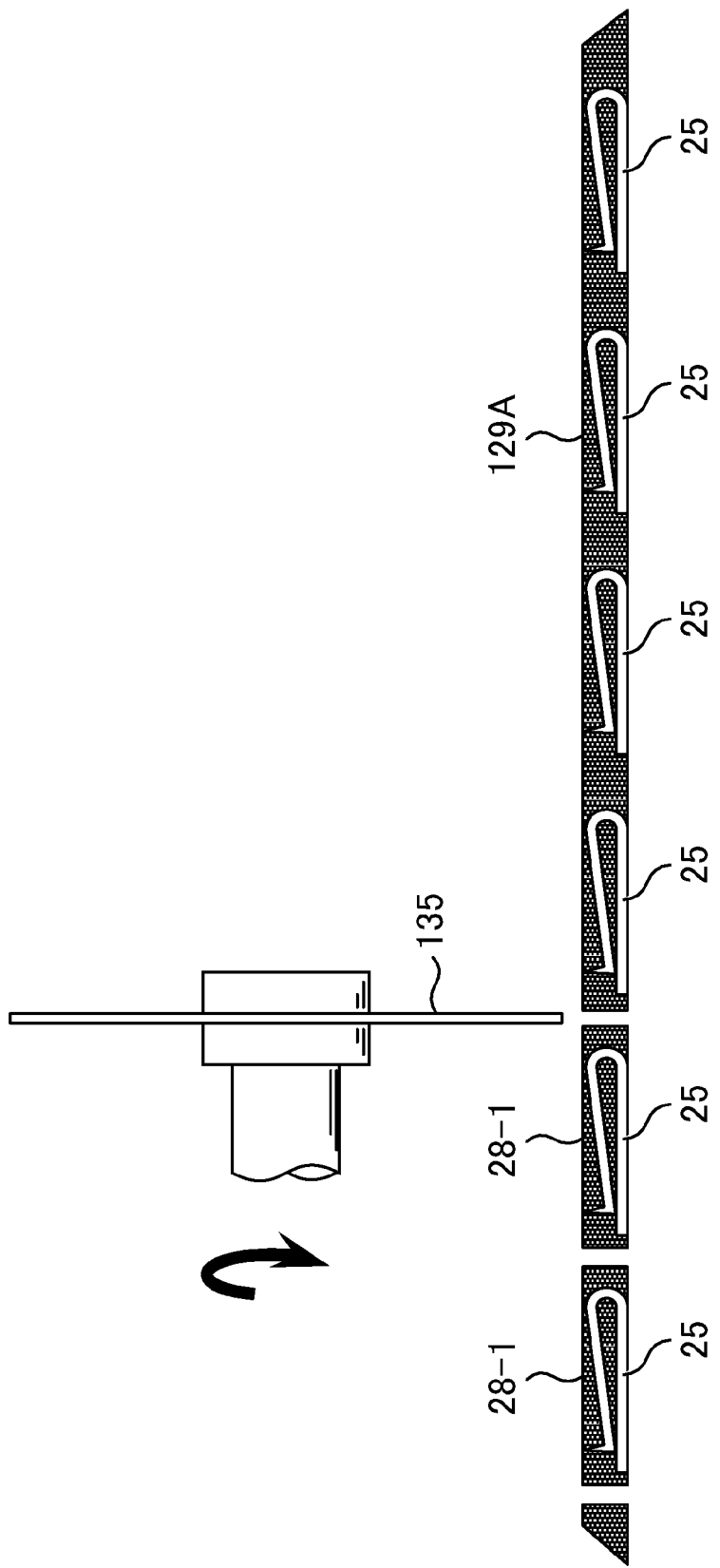
FIG. 23 illustrates the first manufacturing method of a spring-fixing resin part for resin-sealing spring members.
Figure 24A:
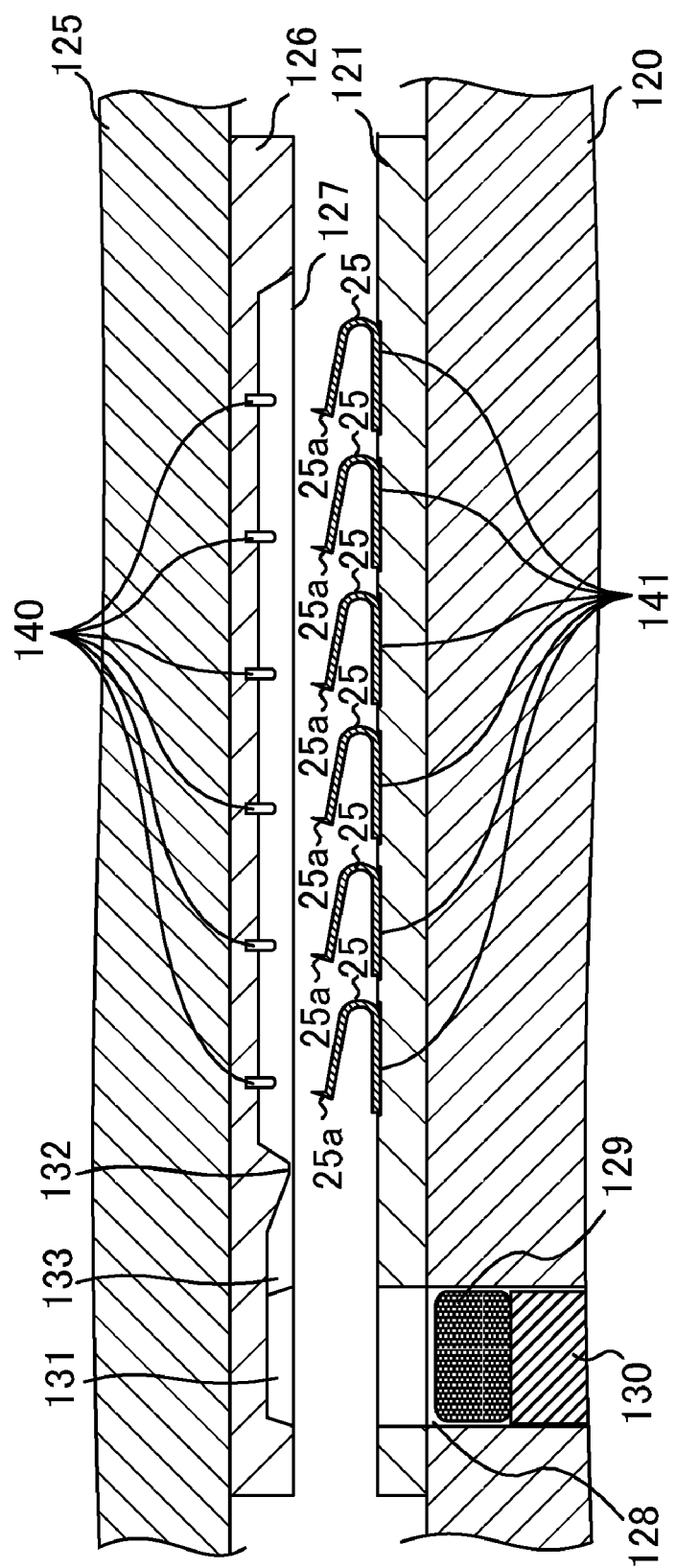
FIGS. 24A and 24B illustrate a second manufacturing method of a spring-fixing resin part for resin-sealing spring members.
Figure 24B:
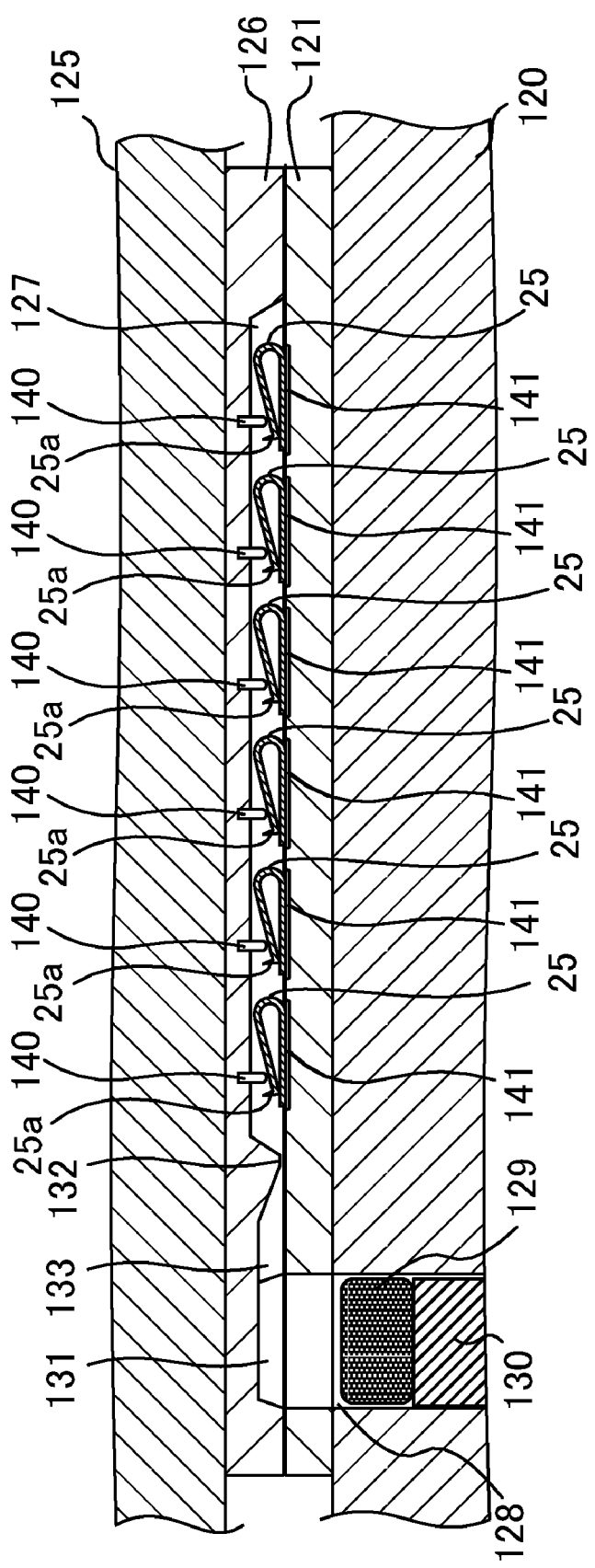
Figure 25A:
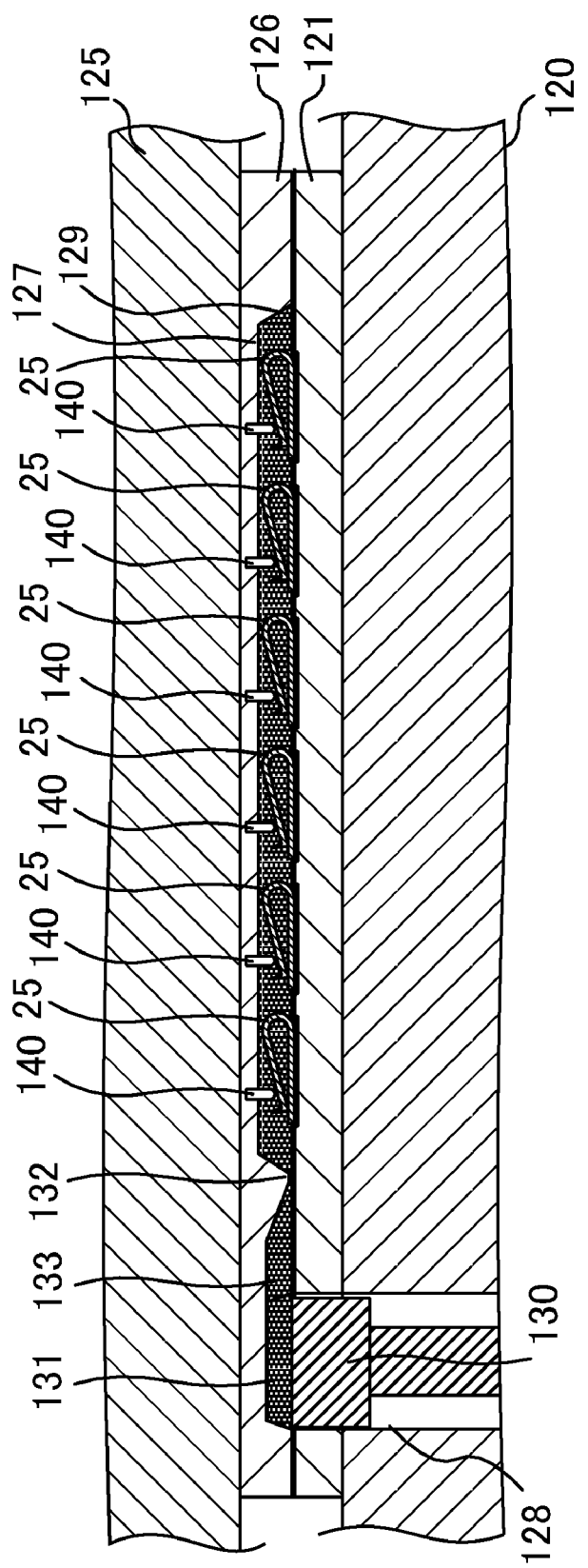
Figure 26A:
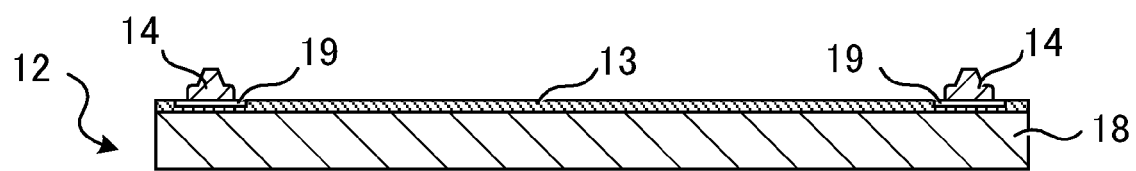
FIGS. 26A to 26C illustrate a manufacturing method of the semiconductor device shown in FIG. 13.
Figure 26B:
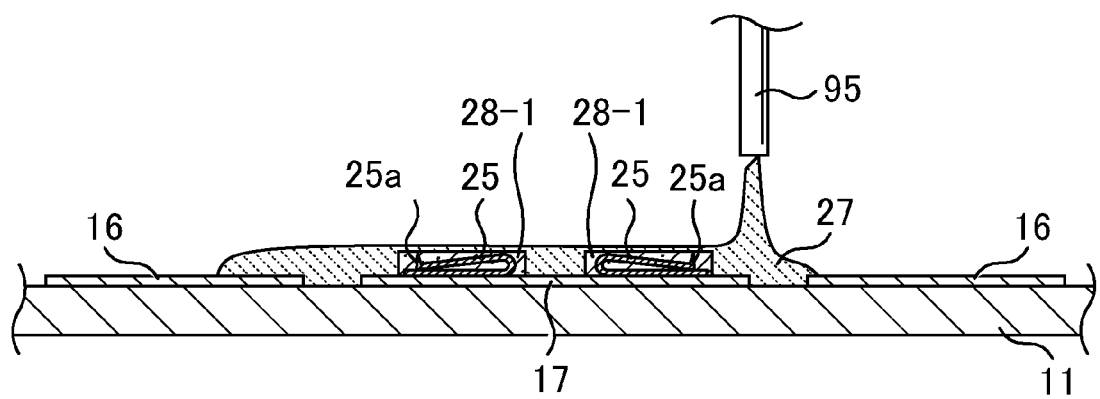
Figure 26C:
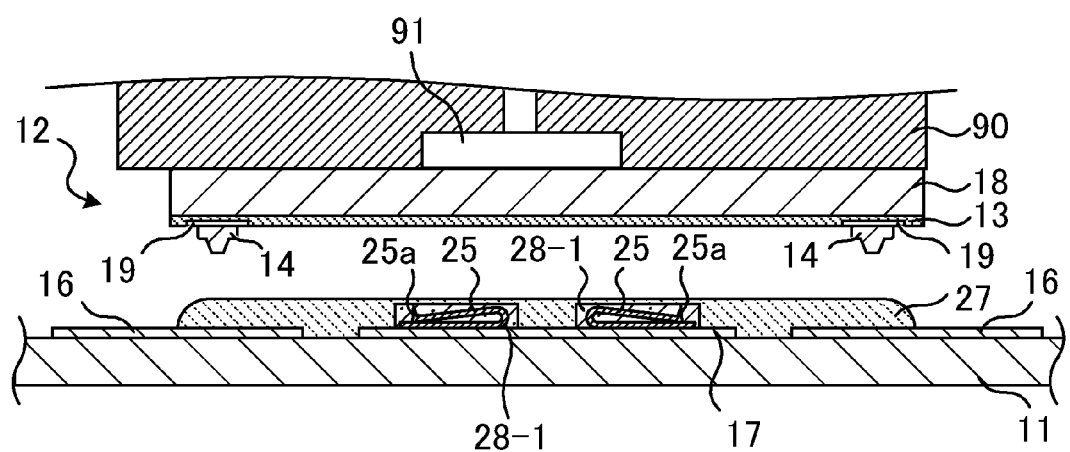

Next, a second manufacturing method of the spring-fixing resin piece 28-6 or 28-7 shown in FIGS. 19A to 20 will be described taking for example a spring-fixing resin piece 28-6 shown in FIG. 19 and with reference to FIGS. 24A to 25B. It is noted that in FIGS. 24A to 25B, parts corresponding to the parts shown in FIGS. 21A to 22B are given like symbols thereby omitting the description thereof.

In the resin sealing apparatus applied in the present method, a spring-pressing protrusion member 140 is arranged at a position corresponding to the spring member 25 disposed on the lower die 121, in the cavity part 127 forming part of the upper die 126. The spring-pressing protrusion member 140 is disposed corresponding to a position which is the vicinity of the protruding portion 25a of the spring member 25 and at which the spring member 25 is bent.

The spring-pressing protrusion member 140 has a plate shape. The spring-pressing protrusion member 140 may be integrally formed by grinding etc. when forming the cavity 127 of the upper die 126, or may be fittedly disposed in the inner surface (the surface opposite to the lower die) of the cavity 127 of the upper die 126.

The amount of protrusion of the spring-pressing protrusion member 140 from the inner surface of the cavity 127 is set to a length which allows the spring member 25 to be compressed such that the protruding portion 25a of the spring member 25 presses the spring member 25, and the protruding portion 25a of the spring member 25 will not come into contact with the inner surface of the cavity 127 of the upper die 126 when the upper die 126 and the lower die 121 are mold-clamped.

On the other hand, a spring member aligning concave part 141 which sets the spring member 25 corresponding to the spring-pressing protrusion member 140, is arranged in the area of the top surface of the lower die 121, corresponding to the cavity part 127 in the upper die 126. As a result of this, the spring member 25 is disposed corresponding to the arrangement position of the spring-pressing protrusion member 140.

Using resin sealing dies having such a configuration, first, the spring member 25 is set in each of the plurality of spring member aligning concave parts 141 on the lower die 121. Further, a piece of the resin 129 which forms a spring-fixing resin piece is disposed on the plunger 130 in the pot part 128 and is heated. (See FIG. 24A.)

In this step, the upper die 126 and the lower die 121 have been heated by heating mechanisms (not shown) provided in the upper die fixing part 125 and the lower die fixing part 120.

Next, mold closing is performed by bringing the upper die 126 into contact with the lower die 121, and then mold clamping is performed with a predetermined pressing pressure. (See FIG. 24B.)

At this point, the tip end of the spring-pressing protrusion member 140 is in contact with the spring member 25 disposed on the lower die 121, and the spring-pressing protrusion member 140 presses the vicinity of the protruding portion 25a of the spring member 25 toward the lower die 121. At this point, solid resin 129 placed on the top surface of the plunger 125 melts.

Then, the plunger 130 is caused to ascend in the vertical direction by the driving part (not shown). (See FIG. 25A.)

The molten resin pressed into the cull part 131 by the plunger 130 flows into the cavity part 127 via the runner part 133 and the gate part 132, and integrally coats to thereby resin-seal the plurality of spring members 25 placed inside the cavity part 127.

After such a resin sealing processing is performed, mold opening is performed to take out a resin molded part 129A, which is made up by integrally resin-sealing the plurality of spring members 25, from the die. (See FIG. 25B.)

At this point, the resin 129B charged in the cull part 131, the runner part 133, and the gate part 132 are taken out at the same time. The resin molded parts 129A and 129B are solidified. It is noted that since the runner part 133 has a tapered sectional shape which tapers off toward the bottom surface of the upper die 126, the portion at which the resin 129A is in contact with the resin 129B will be easily ruptured.

Thereafter, the resin molded part 129A is cut using a rotary blade to form a spring-fixing resin piece 28-6 in which at least one spring member 25 is resin-sealed.

The spring member 25 accommodated in such spring-fixing resin piece 28-6 has been resin-sealed in a curved state as a result of being resin-sealed while being pressed by the spring-pressing protrusion member 140.

In this way, it is possible to easily and effectively manufacture a structure in which the tip end of the protruding portion 25a of the spring member 25 is positioned more inwardly than the surface of the spring-fixing resin piece 28-6.

It is noted that in such a manufacturing method, the shape of the spring-pressing protrusion member 140 is not limited to a plate shape, but may be a pin shape or a bar shape. Further, the shape and size of the spring-pressing protrusion member 140 may be appropriately changed corresponding to the shape of the spring member.

Next, the manufacturing method of the semiconductor device 200 will be described with reference to FIGS. 26A to 27B.

First, a known semiconductor manufacturing process is applied to prepare a semiconductor element 12 in which an electronic-circuit forming portion 13 is formed on one principal surface of the semiconductor substrate 18 made of a semiconductor material such as silicon (Si). (See FIG. 26A.)

The electronic circuit is formed of active elements such as transistors etc., passive elements such as capacitive elements or resistive elements etc., and a wiring layer for interconnecting those functional elements and made of copper (Cu), aluminum (Al), or an alloy of these metals.

A plurality of external connection electrode pads 19 connected to the wiring are formed in the peripheral portion of the electronic-circuit forming portion 13 of the semiconductor element 12, and in the upper most layer of the multi-layer wiring. Further, a convex external connection terminal 14 made of gold (Au), copper (Cu), or an alloy thereof is formed on the external connection electrode pad 19 by a so-called ball bonding method using a wire bonding technique. It is noted that the top part of the convex external connection terminal 14 is subjected to a flattening process as needed. The convex external connection terminal 14 may also be made of nickel (Ni) deposited by an electroless plating method or electroplating method etc.

On the other hand, the wiring board 11, which utilizes a substrate based on silicon (Si) or ceramics, or a substrate based on an organic material such as a polyimide substrate or an organic substrate including glass cloth, is sucked and held on a bonding stage (not shown).

The bonding terminal 16 made of for example aluminum or an alloy thereof is disposed as a part of a conductive layer in one principal surface (top surface) of the wiring board 11, and also a backup pattern 17 made of the same material as that of the bonding terminal 16 is selectively formed on the surface of the wiring board 11. At this time, the bonding stage may be heated to preheat the wiring board 11 up to about 50 to 100° C.

Then, the spring-fixing resin piece 28-1 is disposed in a plural number on the backup pattern 17 in the wiring board 11. At this moment, the spring-fixing resin piece 28-1 is arranged such that the protruding portion 25a of the spring member 25 which is accommodated therein is oriented opposite to the circuit forming portion 13 of the semiconductor element 12, and fastened onto the backup pattern 17 via an adhesive agent (not shown).

It is noted that when a substrate based on an organic material is used as the wiring board 11, the organic material is selected to have a lower dissolution rate in a chemical solution than that of the under-fill material 27 and the spring-fixing resin piece 28-1.

Thereafter, a dispenser (not shown) is used to apply a pasty under-fill material 27 on the wiring board 11 and the spring-fixing resin piece 28-1 from the nozzle 95. (See FIG. 26b.)

Then, the semiconductor element 12 is aligned onto the wiring board 11. (See FIG. 26C.)

That is, the back surface (other principal surface) of the semiconductor element 12 in which a convex external connection terminal 14 is formed on the external connection terminal pad 19 is sucked and held by the bonding tool 90 which has been heated to about 180° C. to 260° C., via a suction hole 91. Then, the convex external connection terminal 14 of the semiconductor element 12 and the bonding terminal 16 of the wiring board 11 are arranged opposite to each other to be aligned.

Then, the bonding tool 90 is descended so that the convex external connection terminal 14 of the semiconductor element 12 is pressed against and brought into contact with the bonding terminal 16 of the wiring board 11. (See FIG. 27A.)

That is, a load is applied to the convex external connection terminal 14 of the semiconductor element 12. At this time, the under-fill material 27 is caused to flow over the entire region of the bottom surface of the semiconductor element 12 so as to be disposed in the gap between the semiconductor element 12 and the wiring board 11, and in the outer peripheral part of the side surface of the semiconductor element 12, and is thermo-cured in such a condition.

At this time, as a result of the spring-fixing resin piece 28-1 being positioned in the gap between the wiring board 11 and the semiconductor element 12, the spacing (distance) between the wiring board 11 and the semiconductor element 12 is defined by the spring-fixing resin piece 28-1. Therefore, the convex external connection terminal 14 is prevented from being significantly deformed when a load is applied, and thus the occurrence of short circuit in the convex external connection terminal 14 is prevented.

It is noted that as the fastening method of the semiconductor element 12, besides such a method of load application and heating, a method of applying an ultrasonic vibration to the semiconductor element 12, or applying a load and ultrasonic vibration without heating may also be used.

Then, the under-fill material 27 is heated to be cured. In such a process, a thermostatic oven is applied as the processing tank, and heating temperature is set to be for example about 120° C. to 180° C., and heating time to about 30 minutes to 90 minutes.

As a result of this, the under-fill material is cured and thereby the semiconductor element 12 is implemented onto the wiring board 11. (See FIG. 27B.)

It is noted that in the process shown in FIG. 27A, when the under-fill material 27 is fully cured, the present process may be omitted.

Thereafter, a plurality of solder balls (not shown) constituting external connection terminals are disposed in the other principal surface (back surface) of the wiring board 11, thereby forming a semiconductor device 200.

Third Embodiment

Figure 28:
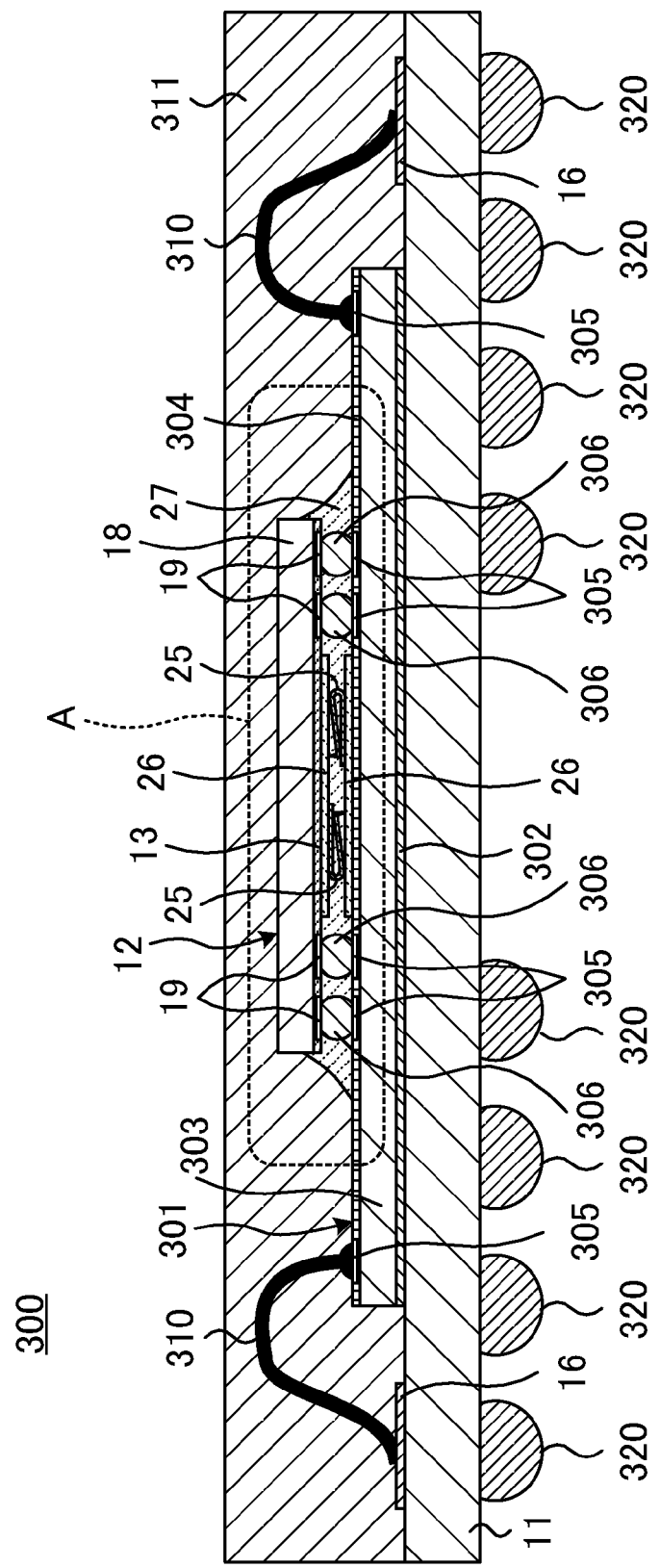
FIG. 28 is a partial sectional view of the semiconductor device relating to a third embodiment.
Figure 29:
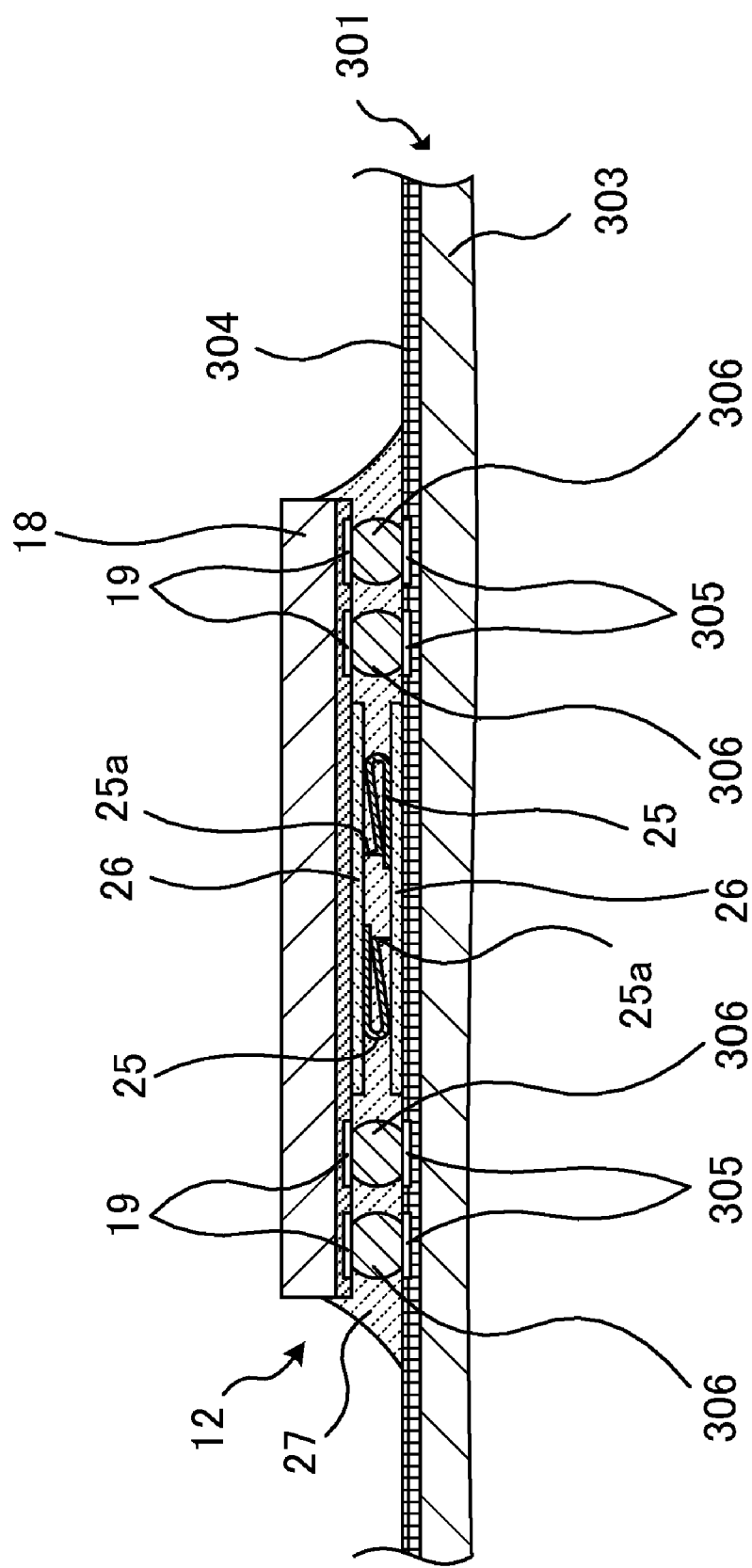
FIG. 29 is an enlarged view of the portion surrounded by the dash line A in FIG. 28.

A semiconductor device 300 relating to a third embodiment is shown in FIG. 28. It is noted that in the semiconductor device 300, parts corresponding to the parts in the above described two embodiments are given like symbols thereby omitting the description thereof. Further, the part encircled by the dash line A in FIG. 28 is enlarged to be shown in FIG. 29. In FIG. 29, the illustration of the sealing resin 311 is omitted.

In the third embodiment, a semiconductor element 12 is implemented on a semiconductor element 301 mounted on the wiring board 11, and two spring members 25 are arranged in the gap between the semiconductor element 301 and the semiconductor element 12. That is, the semiconductor element 301 is mounted on one principal surface of the wiring board 11 via an adhesive agent 302.

The semiconductor element 301 is, as with the semiconductor element 12, subjected to a known semiconductor manufacturing process, and formed with an electronic-circuit forming portion 304 made up of a multi-layered wiring structure on one principal surface of the semiconductor substrate 303 made of a semiconductor material such as silicon (Si). A plurality of external connection electrode pads 305 connected to the wiring are arranged in the upper most layer of the multilayer wiring of the electronic-circuit forming portion 304.

Further, the semiconductor element 12 is mounted onto the semiconductor element 301 by the flip-chip (face down) process, and the external connection electrode pad 19 of the semiconductor element 12 and the external connection electrode pad 305 of the semiconductor element 301 are connected by a solder bump 306 made of a solder predominantly composed of tin (Sn).

The solder bump 306 may be formed by, for example, an electrolytic plating method, a transfer method, or a printing method etc.

It is noted that an under bump metal (UBM) layer such as nickel, titanium/copper/nickel (Ni/Ti/Cu/Ni), or titanium/chromium/copper/nickel (Ti/Cr/Cu/Ni) etc. may be arranged under the external connection electrode pad 19 of the semiconductor element 12, or the external connection electrode pad 305 of the semiconductor element 301.

A spacer resin 26 is respectively arranged on the electronic-circuit forming portion 304 of the semiconductor element 301 and on the electronic-circuit forming portion 13 of the semiconductor element 12, and more inwardly than the external connection electrode pad 19.

Then, two spring members 25 are disposed between the spacer resin 26 arranged on electronic-circuit forming portion 304 of the semiconductor element 301 and the spacer resin 26 arranged on the electronic-circuit forming portion 13 of the semiconductor element 12.

As shown in FIG. 29, the protruding portion 25a of one spring member 25 is opposed to the spacer resin 26 arranged on the semiconductor element 301, and the protruding portion 25a of the other spring member 25 is opposed to the spacer resin 26 arranged on the semiconductor element 12. Further, an under-fill material 27 made of a thermosetting resin adhesive agent etc. is charged into the gap between the semiconductor element 12 and the semiconductor element 301 thereby reinforcing the connection of the semiconductor elements.

Further, the external connection electrode pad 305 provided in the vicinity of the edge part of the top surface of the semiconductor element 301 and a bonding terminal 16 provided on one principal surface (front surface) of the wiring board 11 are connected by a bonding wire 310 such as gold (Au) wire etc.; and further one principal surface of the wiring board 11, the semiconductor element 301, and the semiconductor element 12 are resin-sealed by a sealing resin 311 such as epoxy resin etc.

A conductive layer (not shown) is selectively provided on one principal plane (back surface) of the wiring board 11, and an external connection terminal 320 made of a spherical electrode terminal predominantly composed of solder are arranged in a plural number in the conductive layer.

When the under-fill material 27 etc. is dissolved and removed by a chemical solution in an attempt to take out the semiconductor element 12 and/or semiconductor element 301 from the semiconductor device 300 having such a structure, the spacer resin 26 will be dissolved as well.

While, at this moment, the under-fill material 27 and the spacer resin 26 are dissolved by the chemical solution, the spacer resin 26 is made of a resin material which has a dissolution rate into chemical solution equal to or greater than that of the under-fill material 27. Therefore, the spacer resin 26 will be dissolved and removed, and the spring member 25 which has been compressed will recover its elasticity before the under-fill material 27 is fully dissolved.

That is, although the dissolution of the under-fill material 27 and the spacer resin 26 gradually proceeds from the outer peripheral part of the semiconductor element 12, the distance between the semiconductor element 12 and the semiconductor element 301 is maintained by the solder bump 306. Thereby, even when the under-fill material 27 and the spacer resin 26 are dissolved and removed, the original spacing between the semiconductor element 12 and the semiconductor element 301 is maintained.

Figure 30:
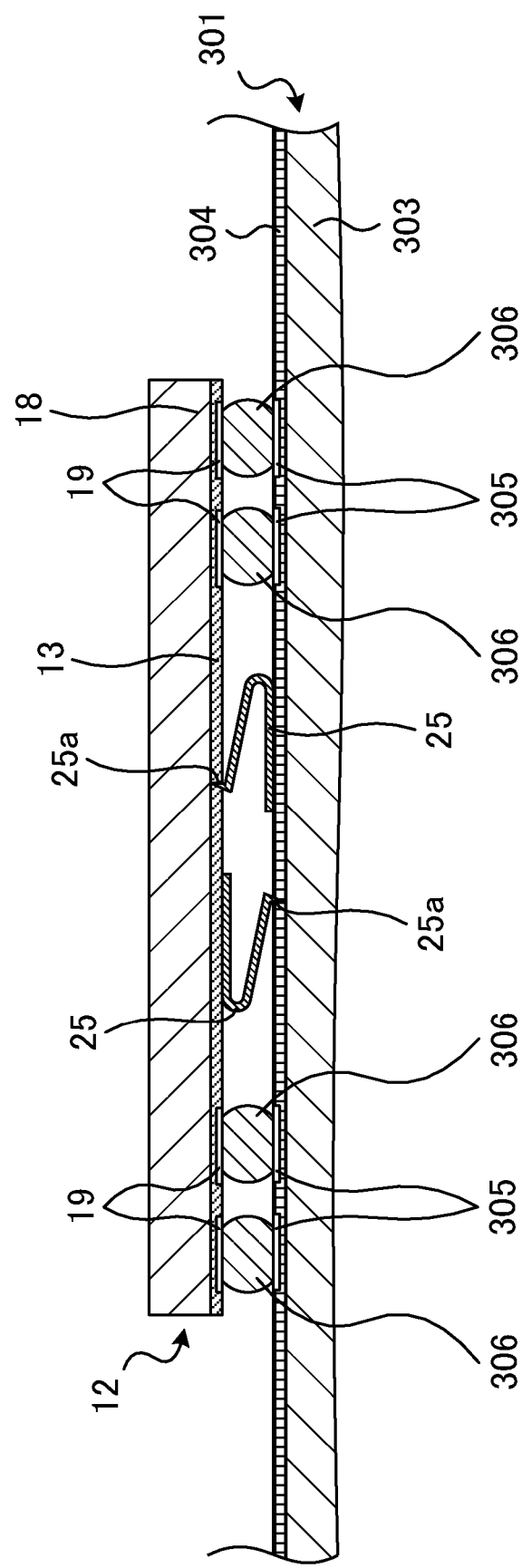
FIG. 30 is a partial sectional view to show the destruction of a circuit forming surface of the semiconductor element by the spring member in the semiconductor device shown in FIG. 28.

As a result of this, as shown in FIG. 30, each of the spring members 25 which have been compressed in the gap between the semiconductor element 12 and the semiconductor element 301 supported by the solder bump 306 recovers its elasticity, so that the electronic-circuit forming portion 13 of the semiconductor element 12 and the electronic-circuit forming portion 304 of the semiconductor element 301 will be destroyed by the protruding portion 25a of the spring member 25.

That is, in FIG. 30, the spring member 25 positioned on the left-hand side extends downwardly with its one end being supported by the semiconductor element 12, and the electronic-circuit forming portion 304 of the semiconductor element 301 will be destroyed by the protruding portion 25a thereof. Further, in the figure, the spring member 25 positioned on the right-hand side extends upwardly with its one end being supported by the semiconductor element 301 so that the electronic-circuit forming portion 13 of the semiconductor element 12 will be destroyed by the protruding portion 25a thereof.

In this way, the third embodiment can be applied to a so-called chip-lamination type semiconductor devices such as the semiconductor device 300. Therefore, it is possible to prevent a third party from taking out a semiconductor element with fraudulent means thereby analyzing the interior thereof. Furthermore, it is possible to deal with the size and thickness reduction of semiconductor devices and electronic equipment without needlessly increasing the thickness of the semiconductor device.

Fourth Embodiment

Figure 31:
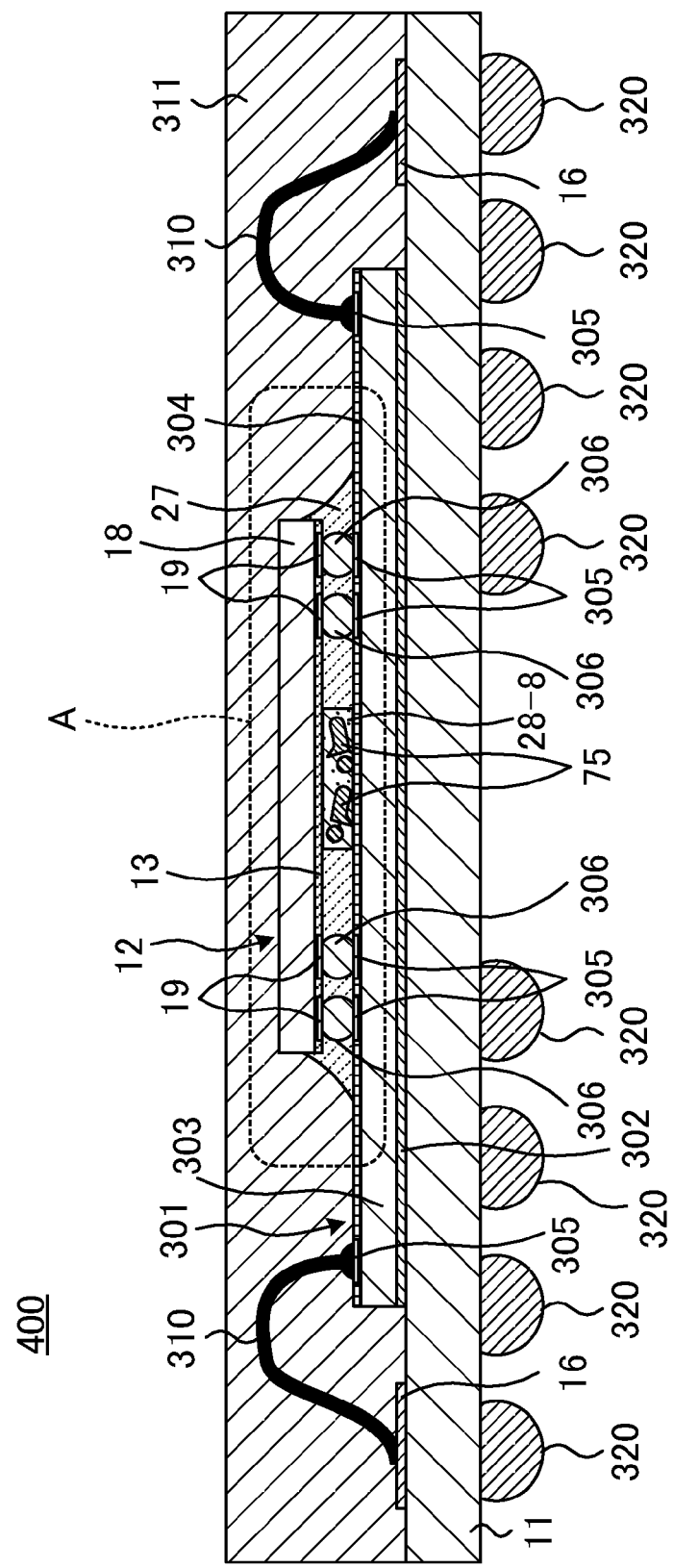
FIG. 31 is a partial sectional view of the semiconductor device relating to a fourth embodiment.
Figure 32:
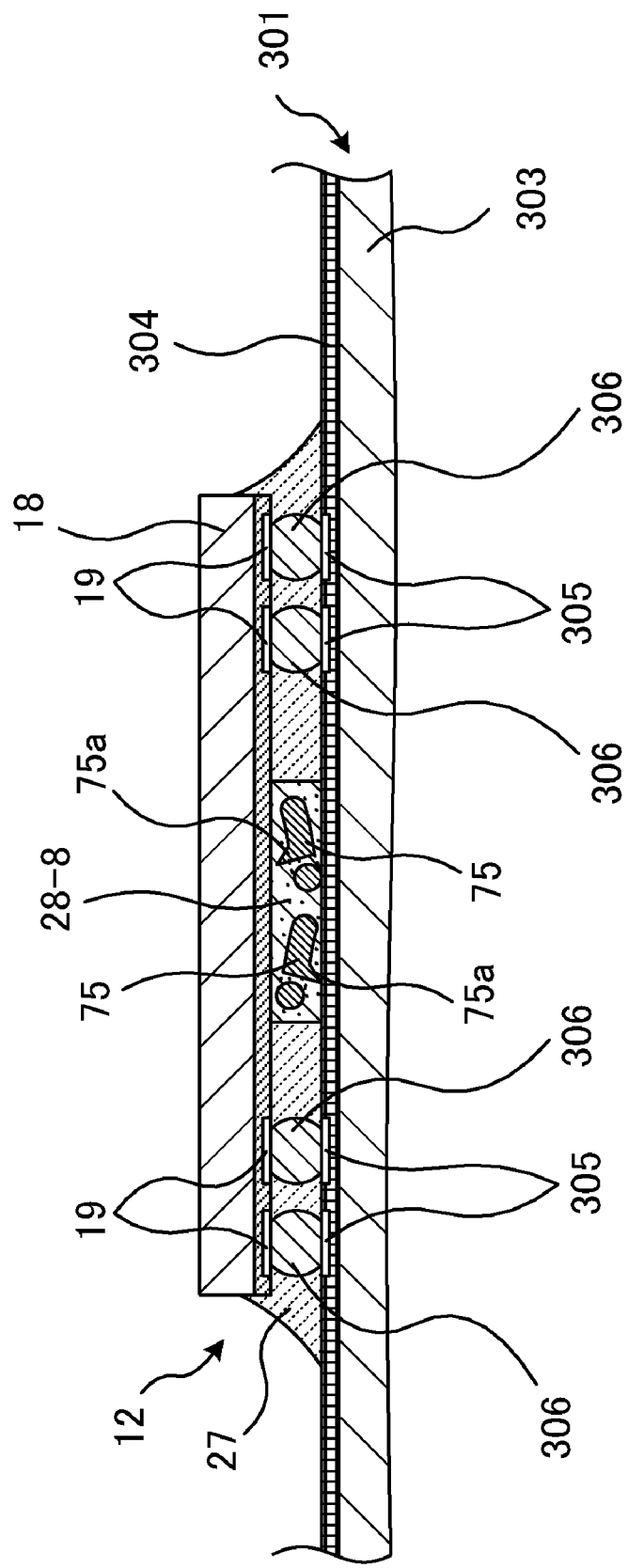
FIG. 32 is an enlarged view of the portion surrounded by the dash line A in FIG. 31.

A semiconductor device 400 relating to a fourth embodiment is shown in FIG. 31. It is noted that in the semiconductor device 400, parts corresponding to the parts in the above described embodiments are given like symbols thereby omitting the description thereof. Further, the part encircled by the dash line A in FIG. 31 is enlarged to be shown in FIG. 32. In FIG. 32, the illustration of sealing resin 311 is omitted.

In the fourth embodiment, a plate shaped spring-fixing resin piece 28-8 in which a plurality of spring members 75 are resin-sealed is arranged in the gap between the semiconductor element 301 and the semiconductor element 12. The plurality of spring members 75 contained in the spring-fixing resin piece 28-8 have different protruding directions of protruding portions 75a such that protruding portions 75a of certain spring members 75 point toward the semiconductor element 301, and protruding portions 75a of other spring members 75 point toward the semiconductor element 12. (see FIG. 18.)

When an under-fill material 27 etc. is dissolved and removed by a chemical solution to take out the semiconductor element 12 and the semiconductor element 301 from the semiconductor device 400 having such a structure, the spring-fixing resin piece 28-8 will be dissolved and removed at the same time or before the under-fill material 27 is fully dissolved since the spring-fixing resin piece 28-8 is made of a resin material which has a dissolution rate in chemical solution equal to or greater than that of the under-fill material 27. As a result of this, the spring member 75 which has been compressed in the gap between the semiconductor element 12 and the semiconductor element 301 recovers its elasticity.

At this moment, although the dissolution of the under-fill material 27 and the spring-fixing resin piece 28-8 gradually proceeds from the outer peripheral part of the semiconductor element 12, the distance between the semiconductor element 12 and the semiconductor element 301 is maintained by a solder bump 306. That is, even if the under-fill material 27 and the spacer resin 26 are dissolved and removed, the original spacing between the semiconductor element 12 and the semiconductor element 301 is maintained.

Figure 33:
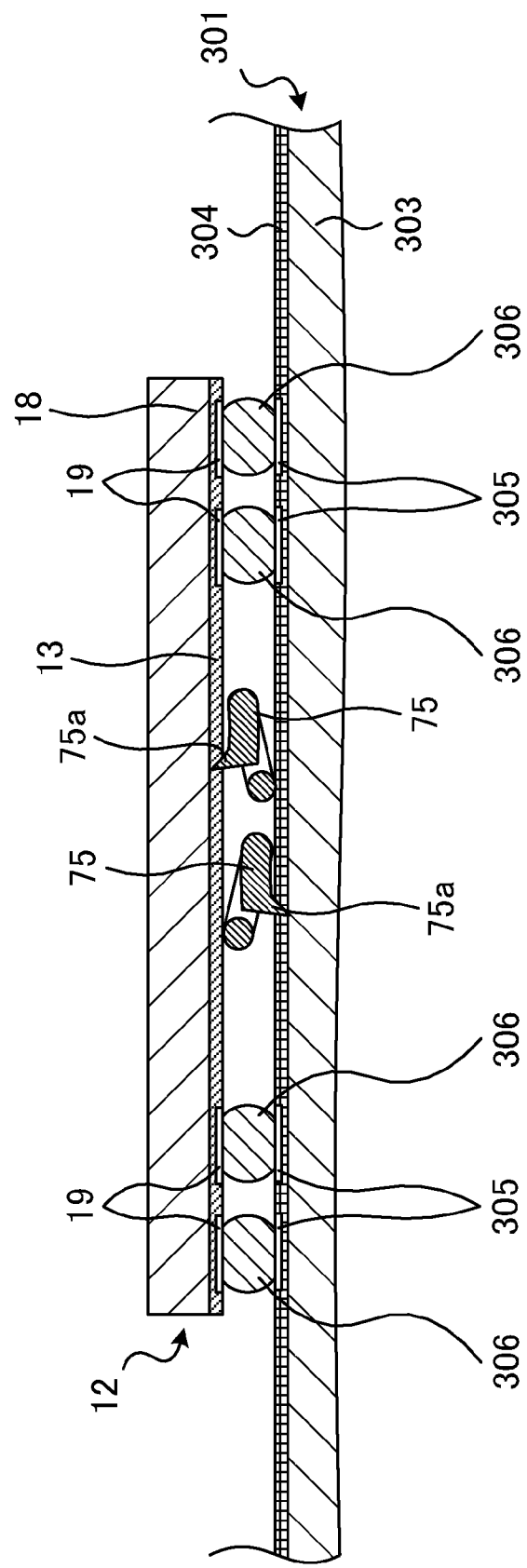
FIG. 33 is a partial sectional view to show the destruction of a circuit forming surface of the semiconductor element by the spring member in the semiconductor device shown in FIG. 31.

Therefore, the spring member 75 which is positioned on the left-hand side in FIG. 33 extends downwardly with its one end being supported by the semiconductor element 12 to destroy the electronic-circuit forming portion 304 of the semiconductor element 301 with the protruding portion 75a thereof. On the other hand, in the same figure, the spring member 75 which is positioned on the right-hand side extends upwardly with its one end being supported by the semiconductor element 301 to destroy the electronic-circuit forming portion 13 of the semiconductor element 12 with the protruding portion 75a thereof.

Fifth Embodiment

Figure 34:
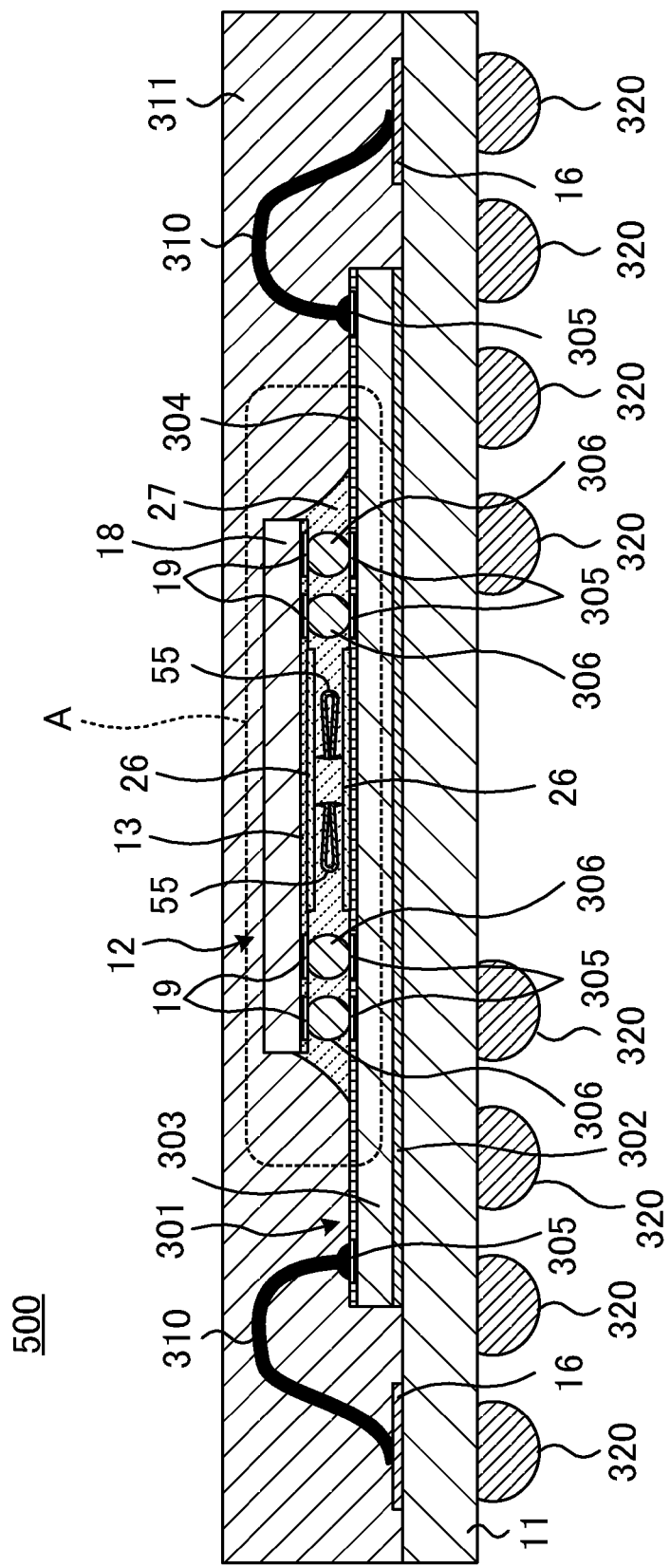
FIG. 34 is a partial sectional view of the semiconductor device relating to a fifth embodiment.
Figure 35:
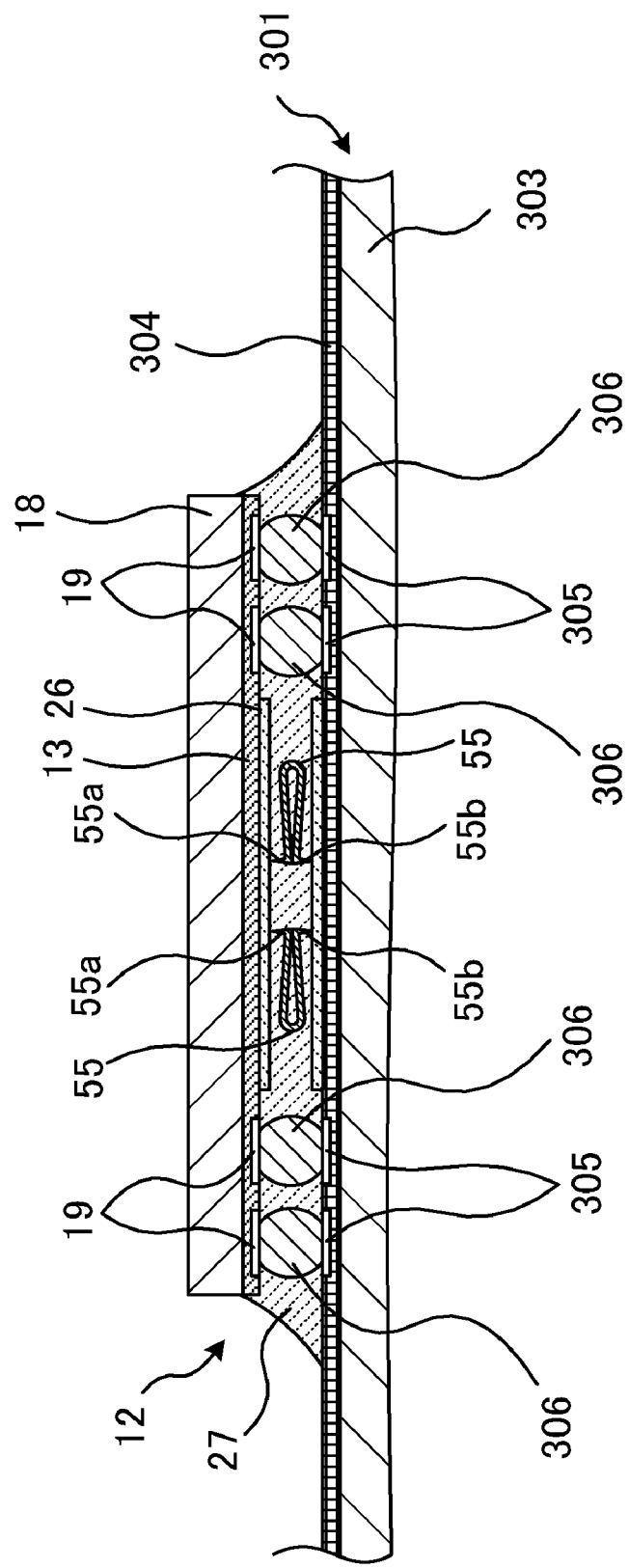
FIG. 35 is an enlarged view of the portion surrounded by the dash line A in FIG. 34.

A semiconductor device 500 relating to a fifth embodiment is shown in FIG. 34. It is noted that in the semiconductor device 500, parts corresponding to the parts in the above described embodiments are given like symbols thereby omitting the description thereof. Further, the part encircled by the dash line A in FIG. 34 is enlarged to be shown in FIG. 35. In FIG. 35, the illustration of sealing resin 311 is omitted.

In the fifth embodiment, a spring member 55 (see FIG. 5E) which is a compressed spring having a section of approximately "V" shape (a V shape of which bent point is of a circular arc shape) and which is formed of protruding portions 55a and 55b having an acute angle shape at both ends in its extension direction, is arranged in a plural number between the spacer resin 26 arranged on the surface of the semiconductor element 301 and the spacer resin provided on the surface of the semiconductor element 12.

In the semiconductor device 500 having such a structure, when the under-fill material 27 etc. is dissolved and removed by a chemical solution in order to take out the semiconductor element 12 and the semiconductor element 301, the spacer resin 26 will also be dissolved.

Figure 36:
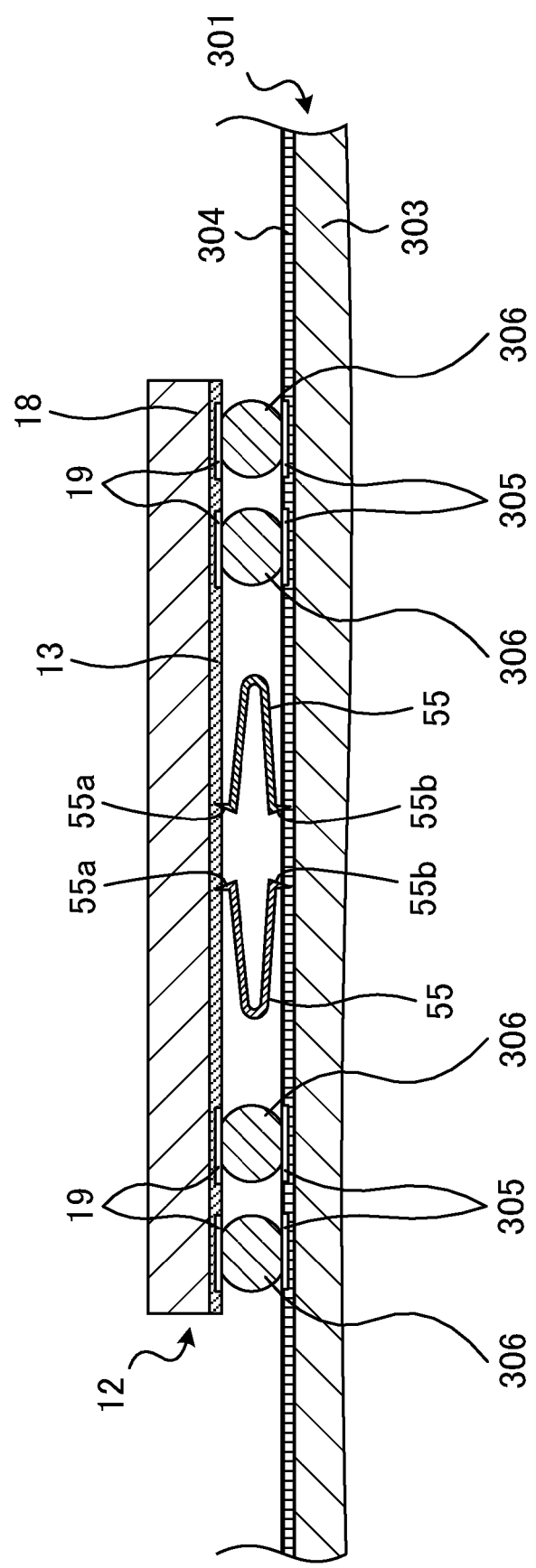
FIG. 36 is a partial sectional view to show the destruction of a circuit forming surface of the semiconductor element by the spring member in the semiconductor device of FIG. 34.

As a result of this, as shown in FIG. 36, the spring member 55, which has been compressed in the gap between the semiconductor element 12 and the semiconductor element 301 supported by the solder bump 306, recovers its elasticity so that the electronic-circuit forming portion 13 of the semiconductor element 12 will be destroyed by the protruding portion 55a, and the electronic-circuit forming portion 304 of the semiconductor element 301 will be destroyed by the protruding portion 55b.

Although the dissolution of the under-fill material 27 and the spacer resin 26 gradually proceeds from the outer peripheral part of the semiconductor element 12, the distance between the semiconductor element 12 and the semiconductor element 301 will be maintained by the solder bump 306. That is, even if the under-fill material 27 and the spacer resin 26 are dissolved and removed, the original spacing between the semiconductor element 12 and the semiconductor element 301 will be maintained.

Therefore, when spring member 55, which has been exposed by the dissolution of the under-fill material 27 and the spacer resin 26, extends due to elastic recovery, the electronic-circuit forming portion 13 of the semiconductor element 12 and the electronic-circuit forming portion 304 of the semiconductor element 301 are securely destroyed by the protruding portions 55a and 55b at the both ends of spring member 55.

Further, since, at this point, the protruding portions 55a and 55b are disposed at approximately the same position in the vertical direction, even when the areas to be destroyed are located at an overlapped position in the vertical direction, it is possible to destroy both with the spring member 55.

Therefore, even if the number of parts is decreased, it is possible to destroy the electronic-circuit forming portion 13 of the semiconductor element 12 and the electronic-circuit forming portion 304 of the semiconductor element 301.

Further, it is possible to dispose the spring members 55 in a number of two or more, or even more densely in the gap between the semiconductor element 301 and the semiconductor element 12. As a result of this, it is possible to increase the number of destruction points in the electronic-circuit forming portion 13 of the semiconductor element 12 and the electronic-circuit forming portion 304 of the semiconductor element 301 thereby performing the destruction more securely.

Sixth Embodiment

Figure 37:
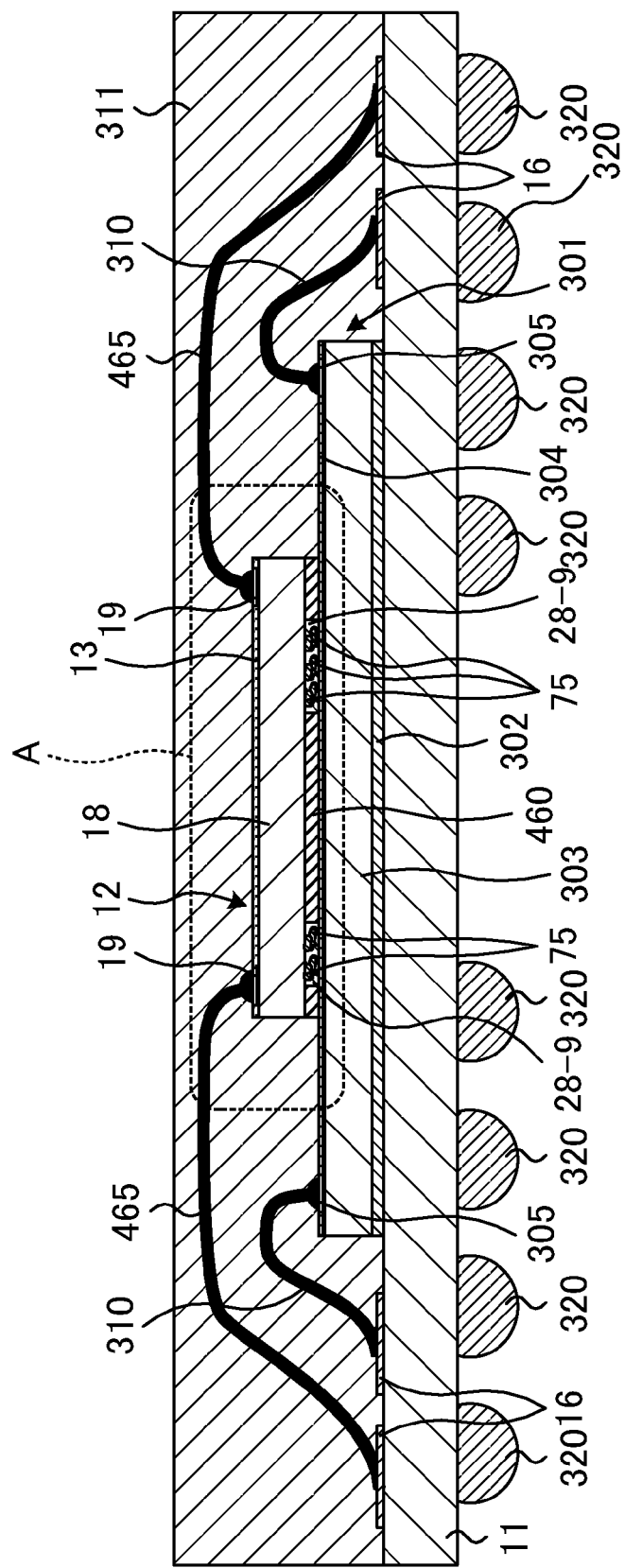
FIG. 37 is a partial sectional view of the semiconductor device relating to a sixth embodiment.
Figure 38:
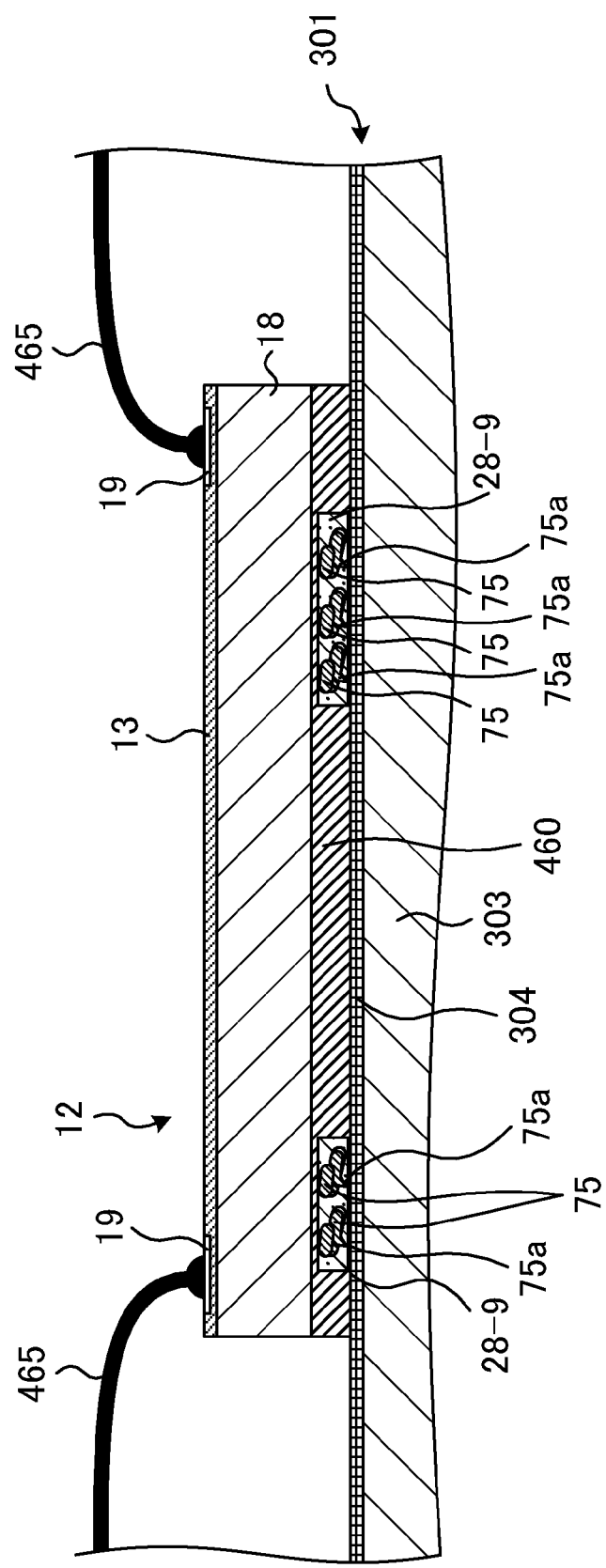
FIG. 38 is an enlarged view of the portion surrounded by the dash line A in FIG. 37.

A semiconductor device 600 relating to a sixth embodiment is shown in FIG. 37. It is noted that in the semiconductor device 600, parts corresponding to the parts in the above described embodiments are given like symbols thereby omitting the description thereof. Further, the part encircled by the dash line A in FIG. 37 is enlarged to be shown in FIG. 38. In FIG. 38, the illustration of sealing resin 311 is omitted.

In the sixth embodiment, an electronic circuit non-forming surface of the semiconductor element 12 is fastened onto the semiconductor element 301 via an adhesive agent 460, and a spring-fixing resin piece 28-9 (see FIG. 17), in which a plurality of spring members 75 are resin-sealed, is arranged in a plural number between the semiconductor element 301 and the semiconductor element 12, and in the vicinity of the outer peripheral part of the semiconductor element 12.

Any of the protruding portions 75a of the spring members 75, which are resin-sealed in the spring-fixing resin piece 28-9, are opposed to the electronic-circuit forming portion 304 in the surface of the semiconductor element 301.

It is noted that the external connection electrode pad 19 provided in the electronic-circuit forming portion 13 of the semiconductor element 12 fastened onto the semiconductor element 301, and the bonding terminal 16 provided in the vicinity of the outer peripheral part of the wiring board 11 are connected by a bonding wire 465 such as a gold (Au) wire etc., and further the surface of the wiring board 11, the semiconductor element 301, and the semiconductor element 12 are resin-sealed with sealing resin 311 such as epoxy resin etc.

Figure 39:
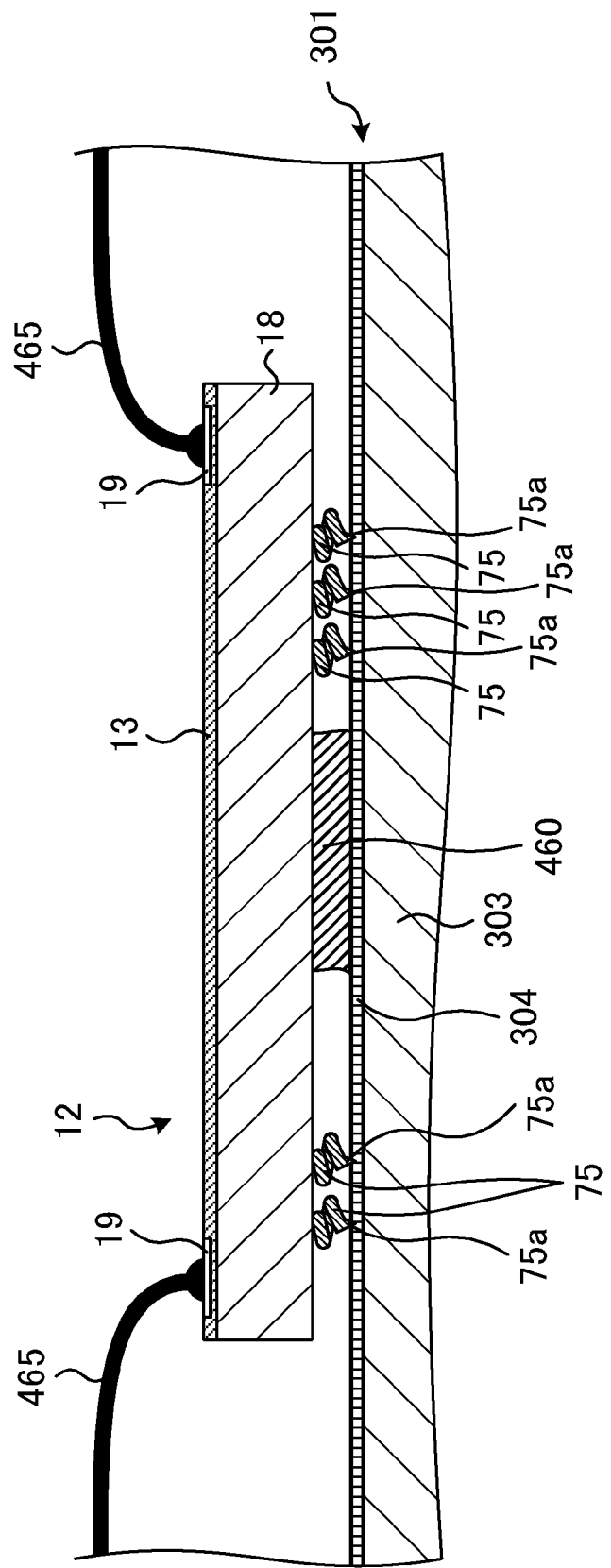
FIG. 39 is a partial sectional view to show the destruction of a circuit forming surface of the semiconductor element by the spring member in the semiconductor device of FIG. 37.

When the adhesive agent 460 and spring-fixing resin piece 28-9 etc. are dissolved and removed by a chemical solution to take out the semiconductor element 301 from the semiconductor device 600 having such a structure, the spring-fixing resin piece 28-9 will be dissolved as well. As a result, as shown in FIG. 39, the spring member 75 which has been compressed recovers its elasticity, and the electronic-circuit forming portion 304 of the semiconductor element 301 will be destroyed by the protruding portion 75a of the spring member 75 of which one end is supported by the semiconductor element 12.

At this moment, the dissolution of the adhesive agent 460 and the spring-fixing resin piece 28-9 gradually proceeds from the outer peripheral part of the semiconductor element 12. Therefore, in the case of the adhesive agent 460, it takes a long time since its peripheral part is dissolved and removed till its portion located at the middle parts of the semiconductor element 301 and the semiconductor element 12 is dissolved. That is, the original spacing between the semiconductor element 301 and the semiconductor element 12 is maintained by the remaining adhesive agent 460.

For this reason, when the spring member 75, which becomes to be exposed due to the dissolution of the spring-fixing resin piece 28-9, extends due to elastic recovery, one end of the spring member 75 is supported by the semiconductor element 520 so that the electronic-circuit forming portion 304 in the semiconductor element 301 will be securely destroyed by the protrusion portion 75a of the spring member 75.

Seventh Embodiment

Figure 40:
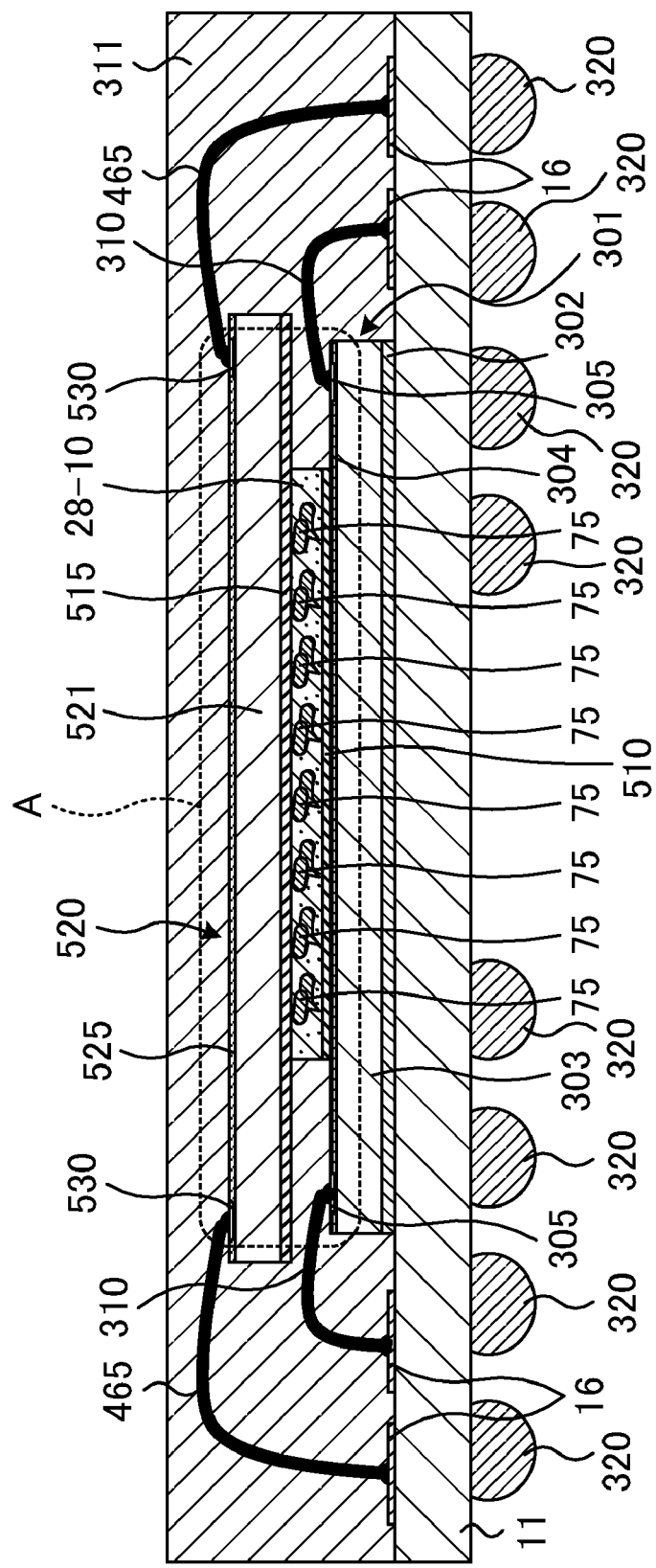
FIG. 40 is a partial sectional view of the semiconductor device relating to a seventh embodiment.
Figure 41:
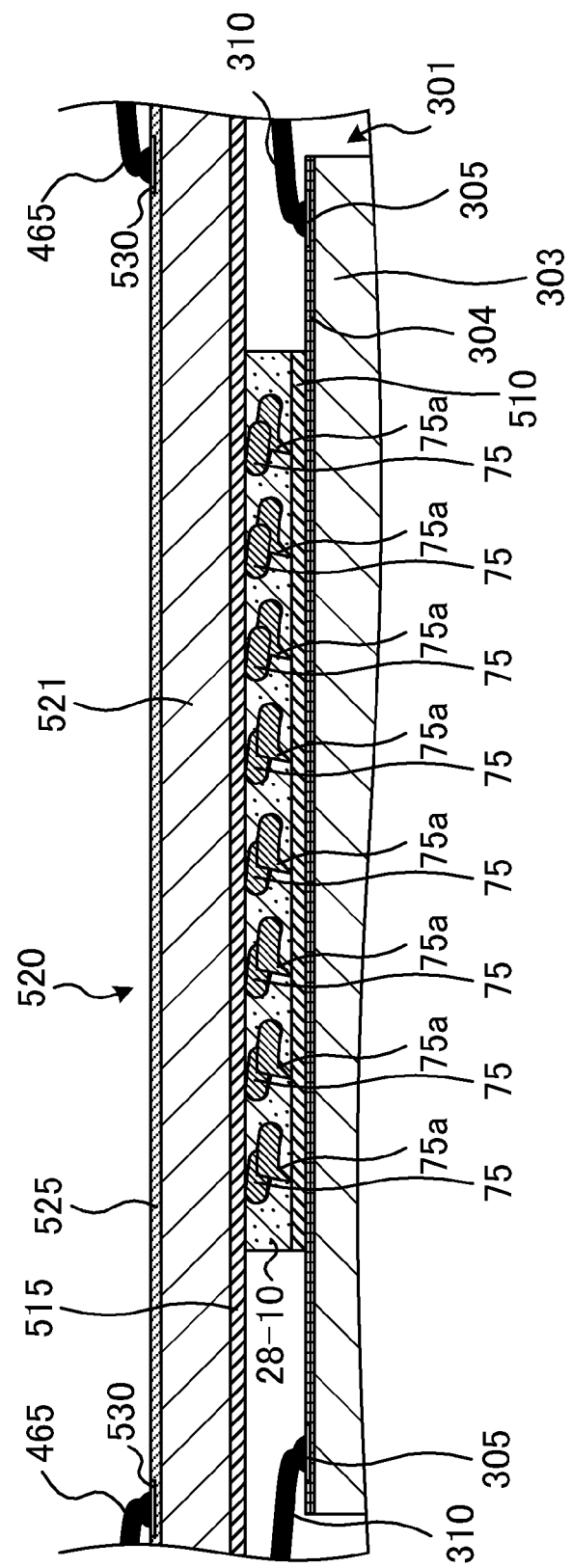
FIG. 41 is an enlarged view of the portion surrounded by the dash line A in FIG. 40.

A semiconductor device 700 relating to a seventh embodiment is shown in FIG. 40. It is noted that in the semiconductor device 700, parts corresponding to the parts in the above described embodiments are given like symbols thereby omitting the description thereof. Moreover, the part encircled by the dash line A in FIG. 40 is enlarged to be shown in FIG. 41. Further, in FIG. 41, the illustration of the sealing resin 311 is omitted.

In the seventh embodiment, a plate shaped spring-fixing resin piece 28-10 (see FIG. 17) in which a plurality of spring members 75 are resin-sealed is fastened onto the semiconductor element 301, which is fastened to the wiring board 11 via an adhesive agent 302, via an adhesive agent 510.

Further, a semiconductor element 520, which has a size slightly larger than that of the semiconductor element 301, is mounted onto the spring-fixing resin piece 28-10 via an adhesive agent 515. Any of the protruding portions 75a of the spring members 75, which are resin-sealed in the spring-fixing resin piece 28-10, is opposed to the electronic-circuit forming portion 304 in the surface of the semiconductor element 301.

The semiconductor element 520 is, as with the semiconductor element 301, subjected to a known semiconductor manufacturing process so that an electronic-circuit forming portion 525 made up of a multilayer wiring structure is formed on one principal surface of the semiconductor substrate 521 made of a semiconductor material such as silicon (Si) etc. Then, a plurality of external connection electrode pads 530 connected to the wiring are arranged in the upper most layer of the multilayer wiring of the electronic-circuit forming portion 525.

Then, the external connection electrode pad 530 of the semiconductor element 520 and the bonding terminal 16 provided in the wiring board 11 are connected by a bonding wire 465 such as a gold (Au) wire etc., and further the surface of the wiring board 11, the semiconductor element 301 and the semiconductor element 520 are resin-sealed by a sealing resin 311 such as epoxy resin etc.

When the adhesive agents 302 and 515 and the adhesive agent 510 are dissolved and removed by a chemical solution to take out the semiconductor element 301 from the semiconductor device 700 having such a structure, the spring-fixing resin piece 28-10 will be dissolved as well.

Figure 42:
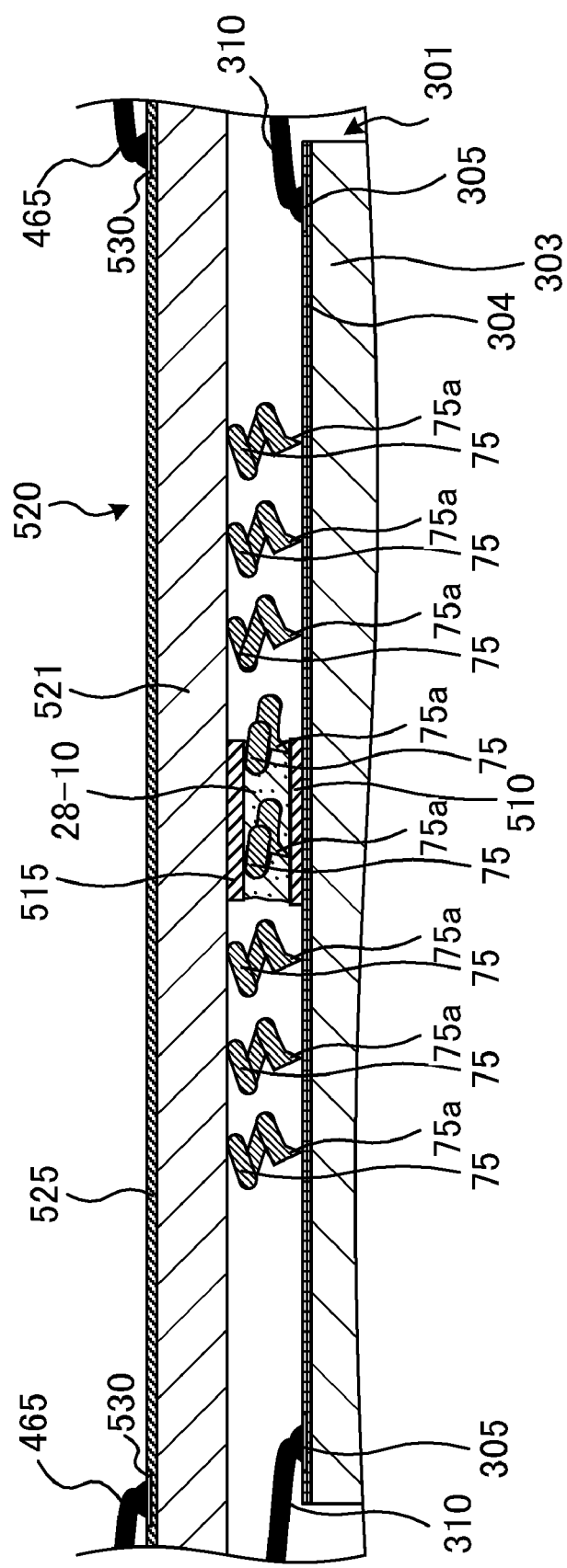
FIG. 42 is a partial sectional view to show the destruction of a circuit forming surface of the semiconductor element by the spring member in the semiconductor device of FIG. 40.

As a result, as shown in FIG. 42, the spring member 75 which has been compressed recovers its elasticity, and the electronic-circuit forming portion 304 of the semiconductor element 301 will be destroyed by the protruding portion 75a of the spring member 75 of which one end is supported by the semiconductor element 520.

At this moment, the dissolution of the adhesive agents 302 and 515, and the adhesive agent 510 and the dissolution of the spring-fixing resin piece 28-10 gradually proceed from the outer peripheral parts of the semiconductor element 301 and the semiconductor element 520. Therefore, it takes a long time until the portions in which these adhesive agents and spring-fixing resin piece 28-10 located at the middle of the portions opposite to the semiconductor element 301 and the semiconductor element 520 are dissolved, even if their peripheral parts are dissolved and removed.

That is, the original spacing will be maintained between the semiconductor element 301 and the semiconductor element 520 by the remaining adhesive agent and the spring-fixing resin piece 28-10. As a result of this, when the spring member 75 which is exposed due to the dissolution of the spring-fixing resin piece 28-10 recovers its elasticity, one end of the spring member 75 is supported by the semiconductor element 520 so that the electronic-circuit forming portion 304 in the semiconductor element 301 will be securely destroyed.

In the seventh embodiment, the spring-fixing resin piece 28-10 is used also as a spacer, and it is possible to laminate and arrange a semiconductor element having a size larger or equal to that of the semiconductor element 301 above the semiconductor element 301 which is connected by bonding wire 310. Therefore, it is possible to increase the freedom of combination of semiconductor elements in chip-lamination type semiconductor devices.

Eighth Embodiment

Figure 43:
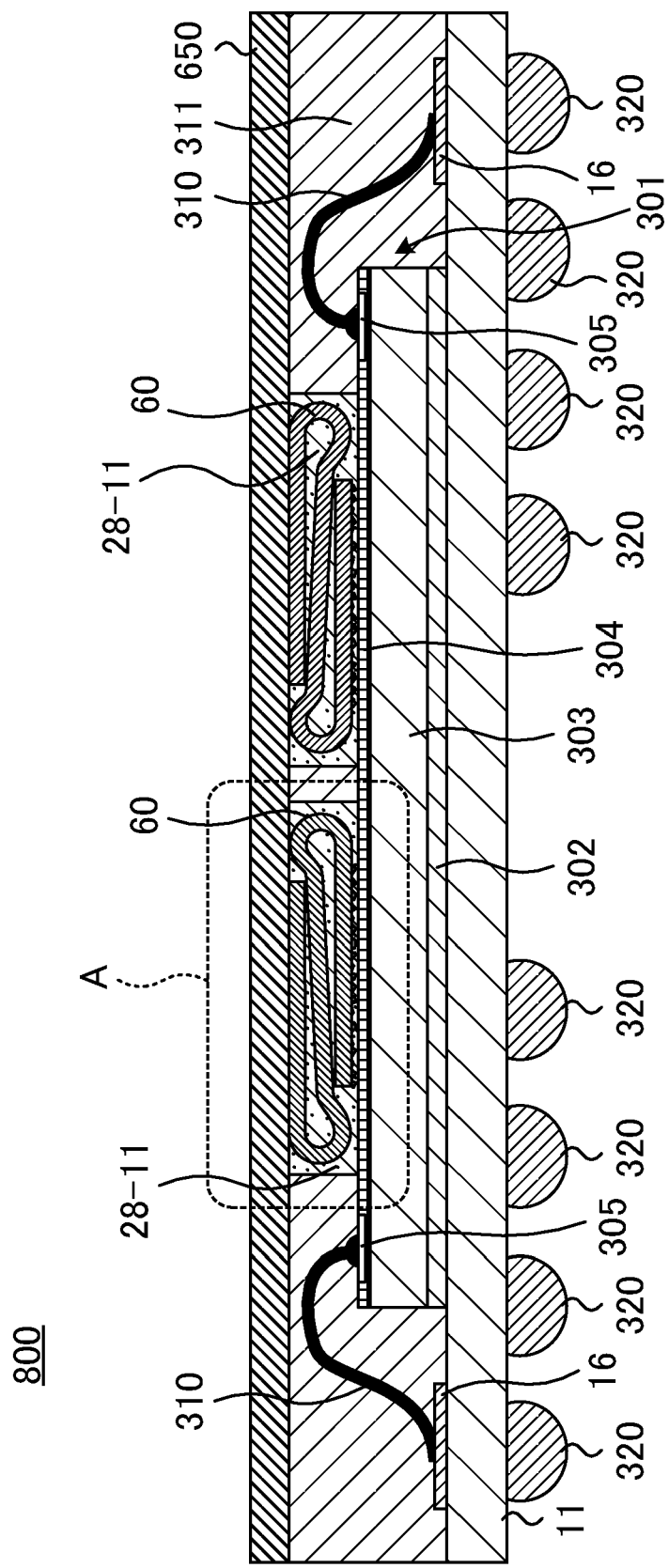
FIG. 43 is a partial sectional view of the semiconductor device relating to an eighth embodiment.
Figure 44:
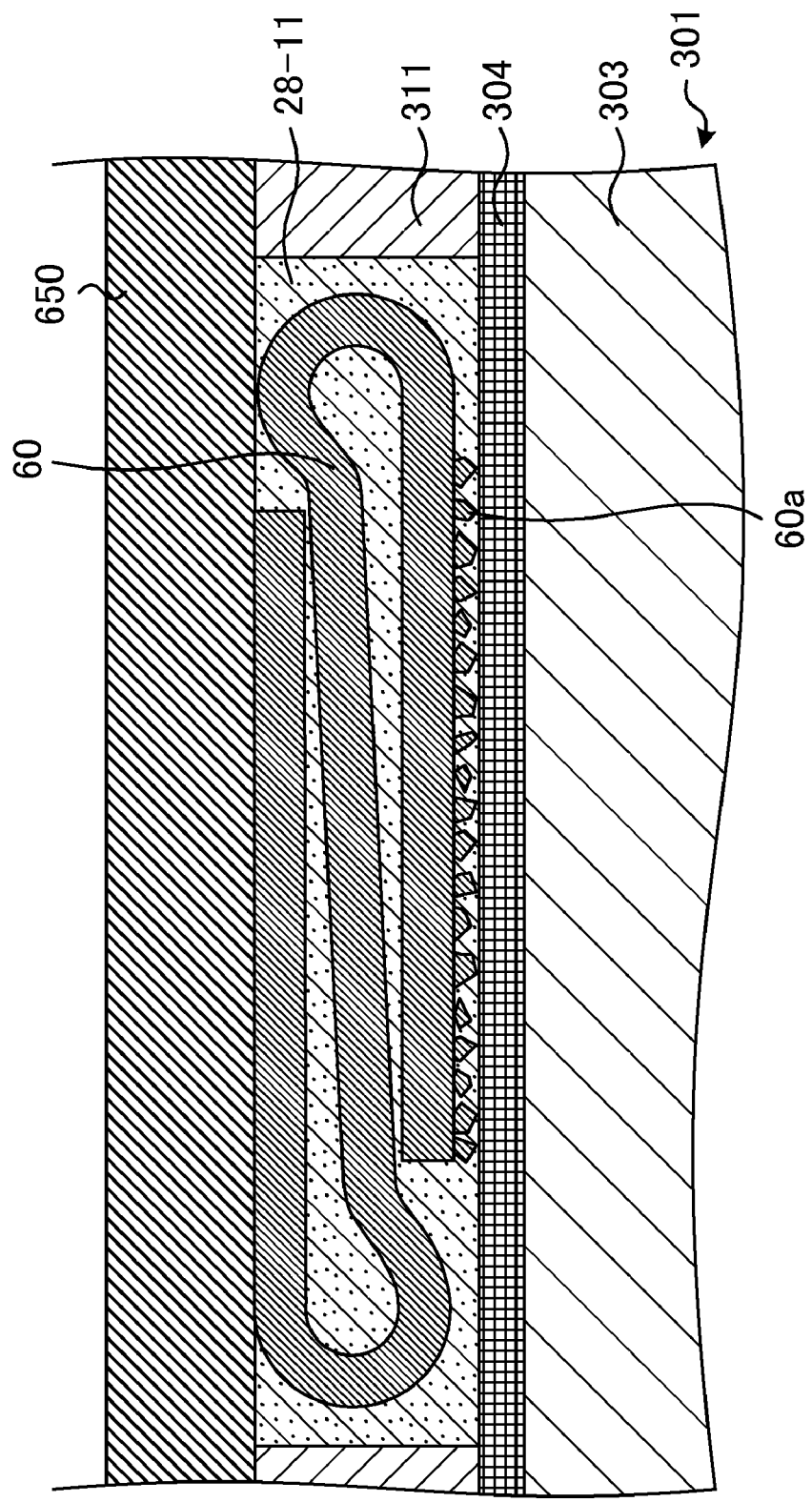
FIG. 44 is an enlarged view of the portion surrounded by the dash line A in FIG. 43.

A semiconductor device 800 relating to an eighth embodiment is shown in FIG. 43. In the semiconductor device 800 as well, parts corresponding to the parts in the above described embodiments are given like symbols thereby omitting the description thereof. Further, the part encircled by the dash line A in FIG. 43 is enlarged to be shown in FIG. 44.

In the eighth embodiment, a plate shaped spring-fixing resin pieces 28-11 in which a spring member 60 is sealed is arranged in a plural number on the semiconductor element 301 which is fastened onto the wiring board 11 via an adhesive agent 302.

Then, sealing resin 311 such as epoxy resin etc. is arranged on the semiconductor element 301 except the surface of the wiring board 11 and the spring-fixing resin pieces 28-11, and a plate shaped heat spreader 650 is arranged in contact with the top surface of the sealing resin 311 and the top surface of the spring-fixing resin piece 28-11. The heat spreader 650 is formed of metal such as copper (Cu), tungsten (W), aluminum (Al) or nickel (Ni), or an alloy thereof, or ceramics such as alumina, aluminum nitride (AlN), or mullite etc.

Further, the spring member 60 sealed in the spring-fixing resin piece 28-11 has a section of approximately "Z" shape, and hard particles are dispersedly fixed on the outer side surface of the extension part to form a protruding portion 60a. (See FIGS. 6A and 16A.)

Figure 45:
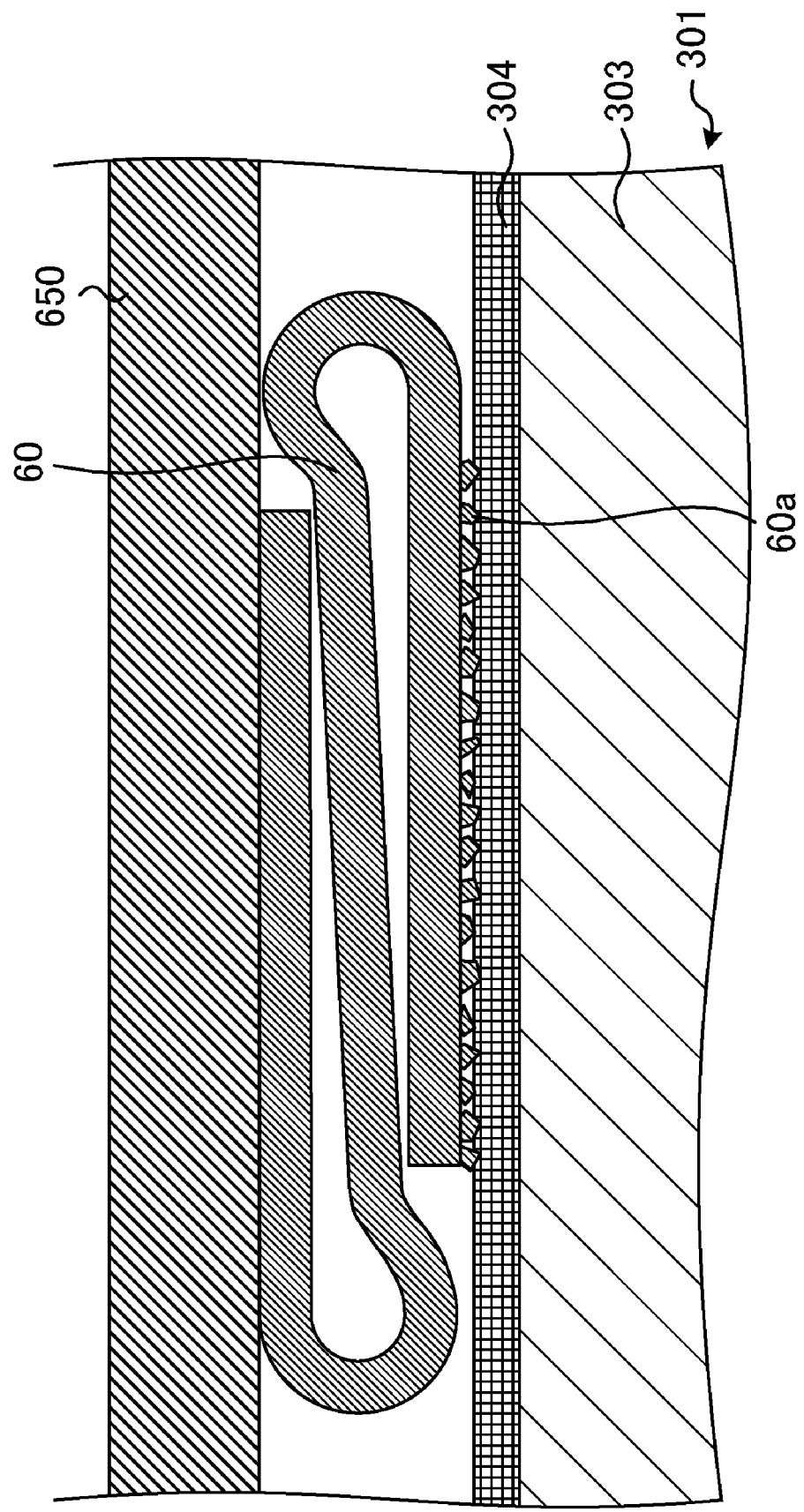
FIG. 45 is a partial sectional view to show the destruction of a circuit forming surface of the semiconductor element by the spring member in the semiconductor device of FIG. 43.

When the adhesive agent 302 and the spring-fixing resin piece 28-11 etc. are dissolved by a chemical solution to take out the semiconductor element 301 from the semiconductor device 800 having such a structure, the spring-fixing resin piece 28-11 will also be dissolved. As a result of this, as shown in FIG. 45, the spring member 60 which has been compressed recovers its elasticity, and the electronic-circuit forming portion 304 of the semiconductor element 301 will be destroyed by the protruding portion 60a of the spring member 60 of which one end is supported by a heat spreading plate 650.

In such an eighth embodiment, the spring member 60 made of metal also acts as a conduction path, and the heat generated while the semiconductor element 301 operates is conducted to the heat spreader 650 via the spring member 60. Therefore, the heat generated while the semiconductor device 800 operates is effectively dissipated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:
1. A semiconductor device, comprising:
    a semiconductor element;
    a plate member disposed opposite to an electronic-circuit forming portion of said semiconductor element; and
    an elastic body arranged in a compressed state between said semiconductor element and said plate member, wherein
    said elastic body includes at least one first protruding portion having an acute angle shape at one end in an extension direction of said elastic body, said first protruding portion being formed opposite to said electronic-circuit forming portion of said semiconductor element, and
    said semiconductor element and said plate member are fastened by an adhesive agent.
2. The semiconductor device according to claim 1; comprising
    a soluble member disposed between said semiconductor element and said plate member.
3. The semiconductor device according to claim 2, wherein said soluble member is a resin part disposed between said elastic body and said semiconductor element.
4. The semiconductor device according to claim 1, wherein an electrode terminal formed on said plate member, and an external connection terminal formed in said electronic-circuit forming portion of said semiconductor element are joined via a bump.
5. The semiconductor device according to claim 3, wherein a thickness of said resin part is smaller than a length of an extension of said elastic body when released from said compressed state.
6. The semiconductor device according to claim 2, wherein said soluble member is a resin part which seals at least said first protruding portion of said elastic body.
7. The semiconductor device according to claim 6, wherein said resin part is disposed between said semiconductor element and said plate member except for a portion in a central area beneath said semiconductor element.
8. The semiconductor device according to claim 7, wherein an external connection terminal formed in said electronic-circuit forming portion of said semiconductor element, and an electrode terminal formed on said plate member are joined by a remeltable conductive member or by pressure bonding.

9. The semiconductor device according to claim 6, wherein
a concave part which reaches said elastic body is formed in a top surface of said resin part, and
said first protruding portion of said elastic body is positioned lower than the top surface of said resin part.

10. The semiconductor device according to claim 9, wherein
said concave part extends in a width direction of said resin part in the top surface of said resin part to reach a side surface of said resin part.

11. The semiconductor device according to claim 1, wherein
an electronic-circuit forming portion is formed in a surface of said plate member, said surface being opposed to said semiconductor element, and
said elastic body includes at least one second protruding portion formed at another end in said extension direction, said second protruding portion being formed opposite to said electronic-circuit forming portion of said plate member.

12. The semiconductor device according to claim 11, wherein
said elastic body is provided in a plural number, and
the second protruding portion of at least one elastic body is opposed to the electronic-circuit forming portion of said plate member.

13. The semiconductor device according to claim 12, wherein
a resin part is provided between said elastic body and said plate member.

14. The semiconductor device according to claim 3, wherein
a dissolving rate of said resin part by a chemical solution made of a material selected from the group consisting of nitric acid, sulfuric acid, and mixed acid thereof is not less than a dissolving rate of said adhesive agent by said chemical solution.

15. The semiconductor device according to claim 6, wherein
a dissolving rate of said resin part by a chemical solution made of a material selected from the group consisting of nitric acid, sulfuric acid, and mixed acid thereof is not less than a dissolving rate of said adhesive agent by said chemical solution.

* * * * *